1

(12) United States Patent
Du et al.

(10) Patent No.: US 10,296,777 B2
(45) Date of Patent: May 21, 2019

(54) DISPLAY PANEL AND DISPLAY APPARATUS

(71) Applicant: Shanghai Tianma Micro-Electronics Co., Ltd., Shanghai (CN)

(72) Inventors: Lingxiao Du, Shanghai (CN); Yang Zeng, Shanghai (CN); Kang Yang, Shanghai (CN); Lihua Wang, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 67 days.

(21) Appl. No.: 15/708,653

(22) Filed: Sep. 19, 2017

(65) Prior Publication Data
US 2018/0005007 A1   Jan. 4, 2018

(30) Foreign Application Priority Data

Jun. 6, 2017  (CN) .......................... 2017 1 0418673

(51) Int. Cl.
*G06K 9/00* (2006.01)
*G09G 3/3225* (2016.01)
(Continued)

(52) U.S. Cl.
CPC ......... *G06K 9/0004* (2013.01); *G06K 9/2027* (2013.01); *G06K 9/2036* (2013.01); *G09G 3/3225* (2013.01); *H01L 27/3244* (2013.01); *H01L 27/3262* (2013.01); *H01L 27/3265* (2013.01); *H01L 51/448* (2013.01); *H01L 27/3225* (2013.01); *Y02E 10/549* (2013.01)

(58) Field of Classification Search
CPC .... G06K 9/004; G06K 9/2027; G06K 9/2036; H01L 51/448; H01L 27/3244; G09G 3/3225
See application file for complete search history.

(56) References Cited

U.S. PATENT DOCUMENTS 4,541,113 A * 9/1985 Seufert .................... G06K 9/58
250/237 G
10,121,832 B1 * 11/2018 Wu ....................... H01L 27/323
(Continued)

FOREIGN PATENT DOCUMENTS

CN    102169886 A    8/2011

*Primary Examiner* — Bobbak Safaipour
(74) *Attorney, Agent, or Firm* — Anova Law Group, PLLC

(57) ABSTRACT

A display panel is provided. The display panel comprises an array substrate including a substrate and a plurality of pixel units disposed on the substrate, wherein each pixel unit includes a light emitting structure and a pixel driver circuit, the light emitting structure includes a reflective electrode, the driver circuit is disposed on a side of the light emitting structure adjacent to the substrate, the pixel driver circuit includes at least two thin-film-transistors and at least one capacitor, and orthogonal projections of at least two thin-film-transistors and at least one capacitor on a plane where the reflective electrode is located fall within the reflective electrode; a fingerprint recognition module including at least one fingerprint recognition unit, wherein an orthogonal projection of the fingerprint recognition unit on the array substrate at least partially overlaps with a transparent region on the array substrate; and a fingerprint recognition light source.

20 Claims, 45 Drawing Sheets

(51) Int. Cl.
    *G06K 9/20*         (2006.01)
    *H01L 51/44*       (2006.01)
    *H01L 27/32*       (2006.01)

(56) References Cited

U.S. PATENT DOCUMENTS

| | | | |
|---|---|---|---|
| 2006/0012901 A1* | 1/2006 | Shigemura | H01L 51/5262 359/883 |
| 2008/0012850 A1* | 1/2008 | Keating, III | H04N 13/254 345/419 |
| 2008/0117155 A1* | 5/2008 | Li | G09G 3/3677 345/91 |
| 2010/0187975 A1* | 7/2010 | Tsukahara | G02B 6/0038 313/503 |
| 2016/0064460 A1 | 3/2016 | Kim et al. | |
| 2016/0181279 A1* | 6/2016 | Choung | H01L 27/124 257/72 |
| 2016/0372049 A1* | 12/2016 | Wang | G09G 3/3225 |
| 2017/0371213 A1* | 12/2017 | Wang | G02F 1/133 |
| 2017/0372113 A1* | 12/2017 | Zhang | G02B 5/3025 |
| 2018/0005006 A1* | 1/2018 | Chai | G06K 9/0004 |
| 2018/0076268 A1* | 3/2018 | Wang | G06K 9/0004 |
| 2018/0129852 A1* | 5/2018 | Zeng | G06K 9/00013 |
| 2018/0150669 A1* | 5/2018 | Luo | G06K 9/0004 |
| 2018/0151641 A1* | 5/2018 | Choo | H04M 1/0266 |
| 2018/0165498 A1* | 6/2018 | Xie | G06K 9/0004 |
| 2018/0307887 A1* | 10/2018 | Han | G06K 9/0004 |
| 2018/0336331 A1* | 11/2018 | Liau | G06F 1/1626 |

* cited by examiner

DISPLAY PANEL AND DISPLAY APPARATUS

CROSS-REFERENCES TO RELATED APPLICATIONS

This application claims the priority of Chinese Patent Application No. CN201710418673.2, filed on Jun. 6, 2017, the entire contents of which are incorporated herein by reference.

FIELD OF THE DISCLOSURE

The present disclosure generally relates to the display technology and, more particularly, relates to a display panel and a display apparatus.

BACKGROUND

Fingerprints, as a form of human biometrics, inherently identify a person. As the technology advances, the market is full of display apparatus with fingerprint recognition function, such as smart phone, tablet computer, and smart wearable device, etc. When a user operates a display apparatus with fingerprint recognition function, the user may only need to use finger to touch fingerprint recognition sensor of the display apparatus to authenticate the identity. Thus, the identity authentication process is simplified.

Existing display panels include fingerprint recognition sensors in display region of the display panels. Because thin-film-transistors of pixel circuits in the display region of display panels are often made of metallic materials, the pixel circuits may block light emitted from fingerprint recognition light source or light reflected by finger, and may affect precision of fingerprint recognition by the fingerprint recognition sensors.

The disclosed display panel and display apparatus are directed to solve one or more problems set forth above and other problems.

BRIEF SUMMARY OF THE DISCLOSURE

One aspect of the present disclosure provides a display panel, comprising an array substrate including a substrate and a plurality of pixel units disposed on the substrate, wherein each pixel unit includes a light emitting structure and a pixel driver circuit, the light emitting structure includes a reflective electrode, the driver circuit is disposed on a side of the light emitting structure adjacent to the substrate, the pixel driver circuit includes at least two thin-film-transistors and at least one capacitor, and orthogonal projections of at least two thin-film-transistors and at least one capacitor on a plane where the reflective electrode is located fall within the reflective electrode; a fingerprint recognition module including at least one fingerprint recognition unit, wherein an orthogonal projection of the fingerprint recognition unit on the array substrate at least partially overlaps with a transparent region on the array substrate, and the transparent region is a region between adjacent reflective electrodes of the light emitting structures; and a fingerprint recognition light source, wherein light emitted from the fingerprint recognition light source is reflected by a touch object to the fingerprint recognition unit for fingerprint recognition. At least one of the fingerprint recognition module and the fingerprint recognition light source is located on a side of the substrate facing away from the pixel units.

Another aspect of the present disclosure provides a display apparatus, comprising a disclosed display panel.

Another aspect of the present disclosure provides a fingerprint recognition method for a display panel having an array substrate including a substrate and a plurality of pixel units disposed on the substrate, wherein each pixel unit includes a light emitting structure and a pixel driver circuit, the light emitting structure includes a reflective electrode, the driver circuit is disposed on a side of the light emitting structure adjacent to the substrate, the pixel driver circuit includes at least two thin-film-transistors and at least one capacitor, and orthogonal projections of at least two thin-film-transistors and at least one capacitor on a plane where the reflective electrode is located fall within the reflective electrode; a fingerprint recognition module including at least one fingerprint recognition unit, wherein an orthogonal projection of the fingerprint recognition unit on the array substrate at least partially overlaps with a transparent region on the array substrate, and the transparent region is a region between adjacent reflective electrodes of the light emitting structures; and a fingerprint recognition light source, wherein light emitted from the fingerprint recognition light source is reflected by a touch object to the fingerprint recognition unit for fingerprint recognition, wherein at least one of the fingerprint recognition module and the fingerprint recognition light source is located on a side of the substrate facing away from the pixel units, the method comprising: in a fingerprint recognition phase, controlling organic light emitting units in the organic light emitting layer to emit light in a shifting mode according to a first light emitting dot array; and recognizing a fingerprint by a fingerprint recognition layer based on light reflected by a touch object on a first side of a cover to the fingerprint recognition units.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. Other embodiments obtained by those skilled in the art without making creative work are within the scope of the present invention.

Figure 1:
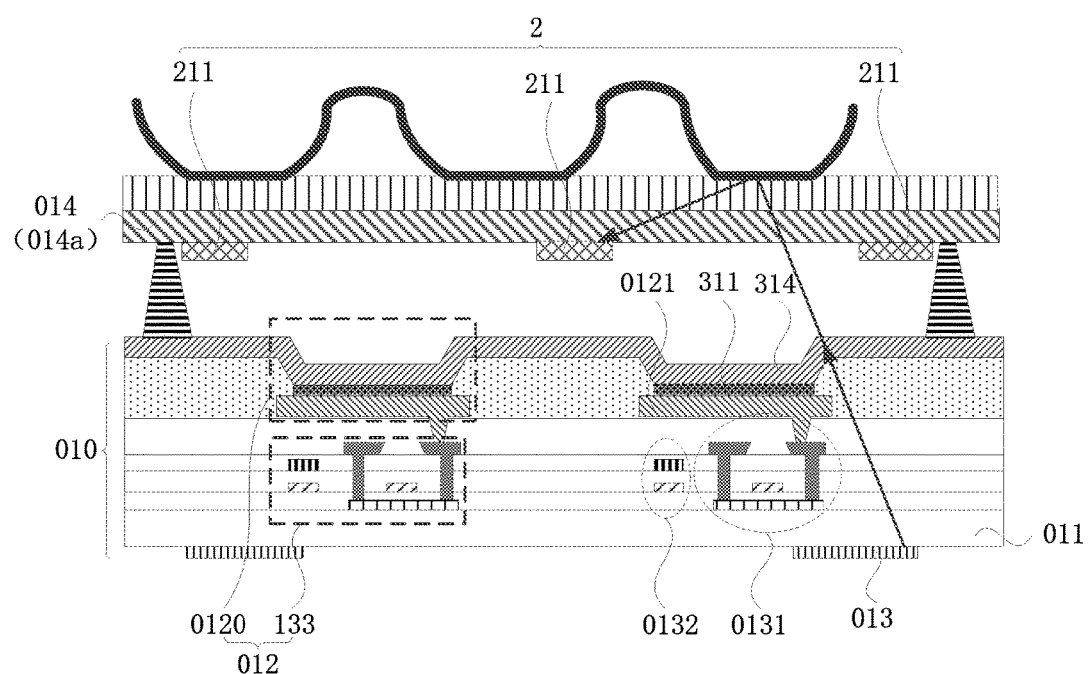
FIG. 1 illustrates a cross-sectional view of an exemplary display panel according to the disclosed embodiments.

The present disclosure provides a display panel. FIG. 1 illustrates a cross-sectional view of an exemplary display panel according to the present disclosure. Referring to FIG. 1, the display panel may include an array substrate 010, a fingerprint recognition module 2, and a plurality of fingerprint recognition light sources 013.

The arrays substrate 010 may include a substrate 011 and a plurality of pixel units 012 disposed on the substrate 011. Each pixel unit 012 may include a light emitting structure 0120 and a pixel driver circuit 133. The light emitting structure 0120 may include a reflective electrode 121. The pixel driver circuit 133 may be located on a side of the light emitting structure 0120 adjacent to the substrate 011. Each pixel driver circuit 133 may include at least two thin-film-transistors 0131 and at least one capacitor 0132. The orthogonal projection of at least two thin-film-transistors and at least one capacitor 0132 on a plane where the reflective electrode 0121 is located may fall within the reflective electrode 0121.

The fingerprint recognition module 2 may include at least one fingerprint recognition unit 211. The orthogonal projection of the fingerprint recognition unit 211 on the array substrate 010 may overlap with at least part of a transparent region on the array substrate 010. The transparent region may be a region between the reflective electrodes 0121 of adjacent light emitting structures 0120.

Light emitted from fingerprint recognition light sources 013 may be reflected by a touch object to the fingerprint recognition 211 for fingerprint recognition.

The fingerprint recognition module 2 and at least one fingerprint recognition light source 013 may be located on a side of the substrate 011 facing away from the pixel units 012.

Specifically, when the fingerprint recognition module 2 is located on the side of the substrate 011 facing away from the pixel units 012, the fingerprint recognition light sources 013 may be external light sources or organic light emitting structures 0120. That is, the organic light emitting structures 0120 may be multiplexed as the fingerprint recognition light sources 013. When fingerprint recognition module 2 is located on the side of the substrate 011 adjacent to the pixel units 012, the fingerprint recognition light sources 013 may be external light sources located on a side of the substrate 011 facing away from the pixel units 012.

Figure 2:
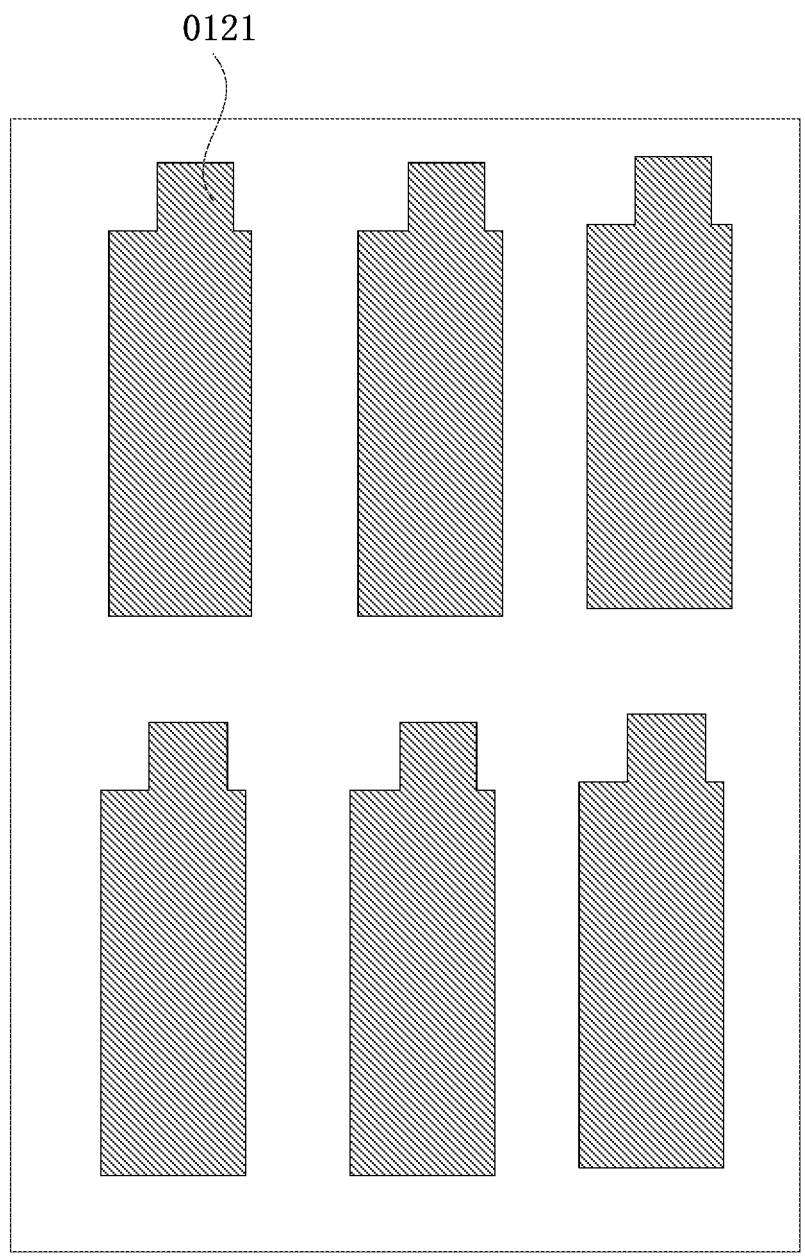
FIG. 2 illustrates a top-down view of an exemplary display panel according to the disclosed embodiments.

FIG. 2 illustrates a top-down view of an exemplary display panel according to the present disclosure. Referring to FIG. 1 and FIG. 2, a region corresponding to a reflective electrode may be a non-transparent region on the array substrate 010. The transparent region may be a region located between reflective electrodes 0121 of adjacent light emitting structures 0120 on the array substrate 010.

In one embodiment, because the fingerprint recognition module 2 and at least one fingerprint recognition light source 013 may be located on the side of the substrate 011 facing away from the pixel units 012, when the fingerprint recognition light source 013 is located on the side of the substrate 011 facing away from the pixel units 012, and the fingerprint recognition unit 211 is located on the side of the substrate 011 adjacent to the pixel units 012 (referring to FIG. 1), the light emitted from the fingerprint recognition light source 013 may need to pass through the transparent region on the substrate 011 to irradiate on the finger (the touch object), and the light reflected by the finger may reach the fingerprint recognition unit 211 for fingerprint recognition.

When the fingerprint recognition light source 013 is located on the side of the substrate 011 adjacent to the pixel units 012, and the fingerprint recognition unit 211 is located on the side of the substrate 011 facing away from the pixel units 012, the light reflected by the finger may need to pass through the transparent region on the substrate 011 to reach the fingerprint recognition unit 211 for fingerprint recognition. When the fingerprint recognition unit 211 and the fingerprint recognition light source 013 are located on the side of the substrate 011 facing away from the pixel units 012, the light emitted from the fingerprint recognition light source 013 finger may need to pass through the transparent region on the substrate 011 to reach the fingerprint recognition unit 211 for fingerprint recognition. Thus, the transmittance in the transparent region may directly affect the intensity of the light that finally reaches the fingerprint recognition unit 211, and may affect the precision of fingerprint recognition.

In one embodiment, the configuration that the orthogonal projections of at least two thin-film-transistors 0131 and at least one capacitor 0132 of the pixel driver circuit 133 on the plane where the reflective electrode 0121 is located fall within the reflective electrode 0121 may minimize light blockage in the transparent region by the pixel driver circuit 133, increase the light transmittance in the transparent region of the array substrate 010, increase the intensity of the light from the fingerprint recognition light source 013 that irradiates on the finger, and increase the intensity of the fingerprint reflected light that reaches the fingerprint recognition unit 211. Thus, the precision of fingerprint recognition may be improved.

For illustrative purposes, only one capacitor and one thin-film-transistor of the pixel driver circuit are shown in FIG. 1. No limitation is imposed on the present disclosure.

In one embodiment, referring to FIG. 1, the light emitting structure 0120 may also include a first electrode 314 and a light emitting function layer 311. The light emitting function layer 311 may be configured between the first electrode 314 and the reflective electrode 0121. The reflective electrode 0121 may be configured on a side of the light emitting layer 311 adjacent to the substrate 011.

Specifically, the reflective electrode 0121 may be an anode. The first electrode 314 may be a cathode. The light emitting function layer 311 may be a red light emitting layer, a green light emitting layer, or a blue light emitting layer.

In one embodiment, referring to FIG. 1, the display panel may also include an encapsulation layer 014. The encapsulation layer 014 may be located on a side of the pixel units 012 facing away from the substrate 011. The fingerprint recognition module 2 may configured on the encapsulation layer 014. The orthogonal projection of the fingerprint recognition unit 211 on the array substrate 010 may be located in a non-transparent region of the array substrate 010. The non-transparent region may be a region between the light emitting function layers 311 of adjacent light emitting structures 0120.

Figure 3:
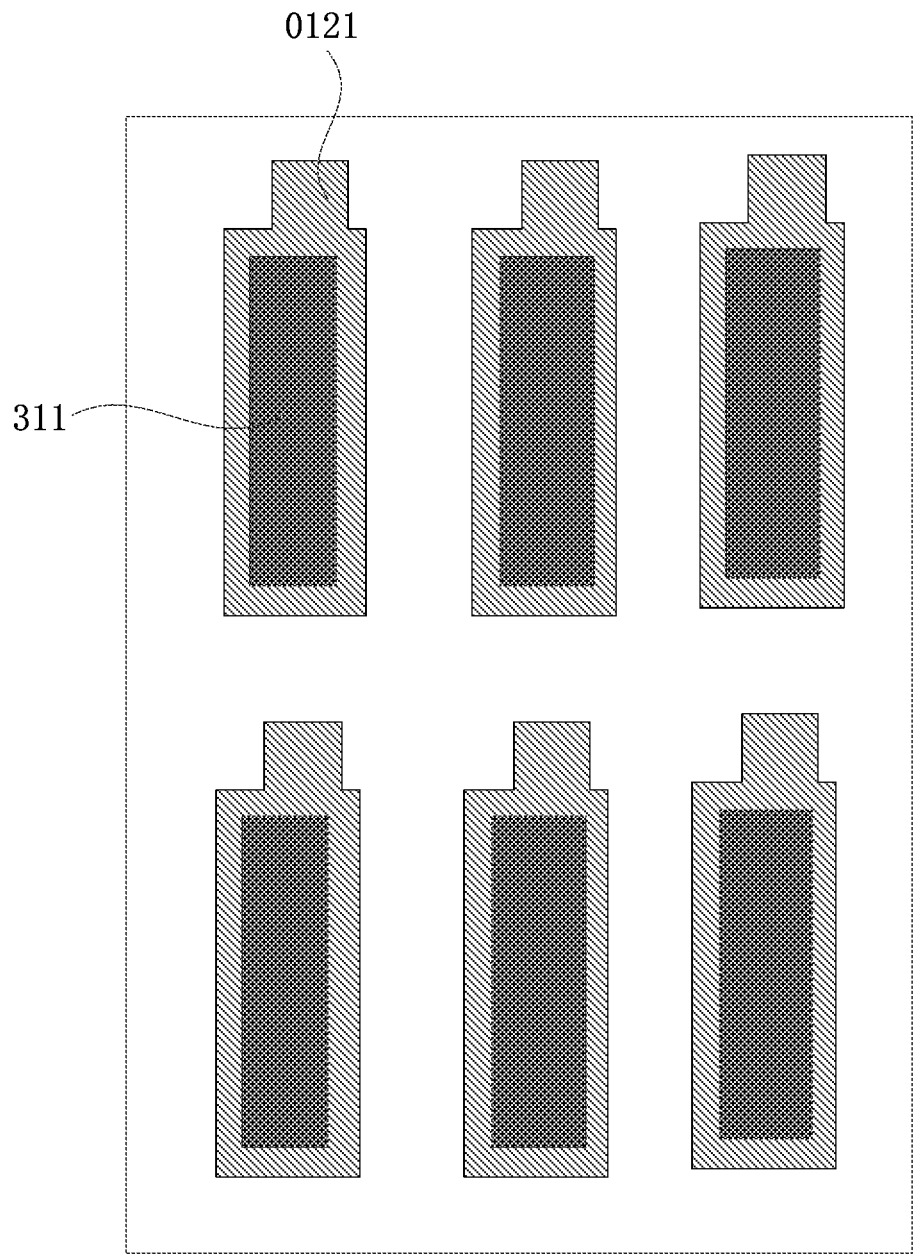
FIG. 3 illustrates a top-down view of another exemplary display panel according to the disclosed embodiments.

FIG. 3 illustrates a top-down view of another exemplary display panel according to the present disclosure. Referring to FIG. 1 and FIG. 3, a region corresponding to the light emitting function layer 311 of the light emitting structure 0120 may be the light emitting region on the array substrate 010. A region between the light emitting function layers 311 of adjacent light emitting structures 0120 may be the non-light emitting region on the array substrate 010.

Specifically, by configuring the fingerprint recognition module 2 on the encapsulation layer 014, the fingerprint recognition module 2 may be closer to the touch object, the optical path of the light reflected by the touch object from the touch object to the fingerprint recognition unit 211 may be shorter, and the light attenuation may be less. More light may enter the fingerprint recognition unit 211 to increase the precision of fingerprint recognition. In addition, because the encapsulation layer 014 is located on the light emitting side of the display panel, by configuring the orthogonal projection of the fingerprint recognition unit 211 on the array substrate 010 in the non-light emitting region of the array substrate 010, the fingerprint recognition unit 211 may not block the light emitted from the organic light emitting structure 0210, and may reduce the effect on the viewing angle of the display panel.

In one embodiment, referring to FIG. 1, the fingerprint recognition light source 013 may be located on the side of the substrate 011 facing away from the pixel units 012. Specifically, the light emitted from the fingerprint recognition light source 013 may pass through the transparent region on the substrate 011 to irradiate on the finger (the touch object). The light reflected by the finger may enter the fingerprint recognition unit 211 for fingerprint recognition. The orthogonal projections of at least two thin-film-transistors 0131 and at least one capacitor 0132 of the pixel driver circuit 133 on the plane where the reflective electrode 0121 is located may fall within the reflective electrode 0121. The configuration may reduce the blockage of light by the pixel driver circuit 133, increase the transmittance in the transparent region on the array substrate 010, and maximize the intensity of the light that the fingerprint recognition light source 013 irradiates on the finger. Thus, the intensity of the fingerprint reflected light that enters the fingerprint recognition unit 211 may be increased, and the precision of fingerprint recognition may be improved.

In one embodiment, referring to FIG. 1, the encapsulation layer 014 may be a transparent rigid cover 014a. The fingerprint recognition module 2 may be configured on a side of the transparent rigid cover 014a adjacent to the array substrate 010.

Specifically, because the transparent rigid cover 014a is aligned and bonded to the array substrate 010 after being formed, the fingerprint recognition module 2 may be directly formed on the surface of the transparent rigid cover 014a. The gap between the transparent rigid cover 014a and the array substrate 010 may be filled with air or nitrogen. The fingerprint recognition module 2 may be configured on a side of the transparent rigid cover 014a adjacent to the array substrate 010. Thus, the fingerprint recognition module 2 may not increase the thickness of the display panel, which is in line with the trend of the thinner display panels.

Figure 4:
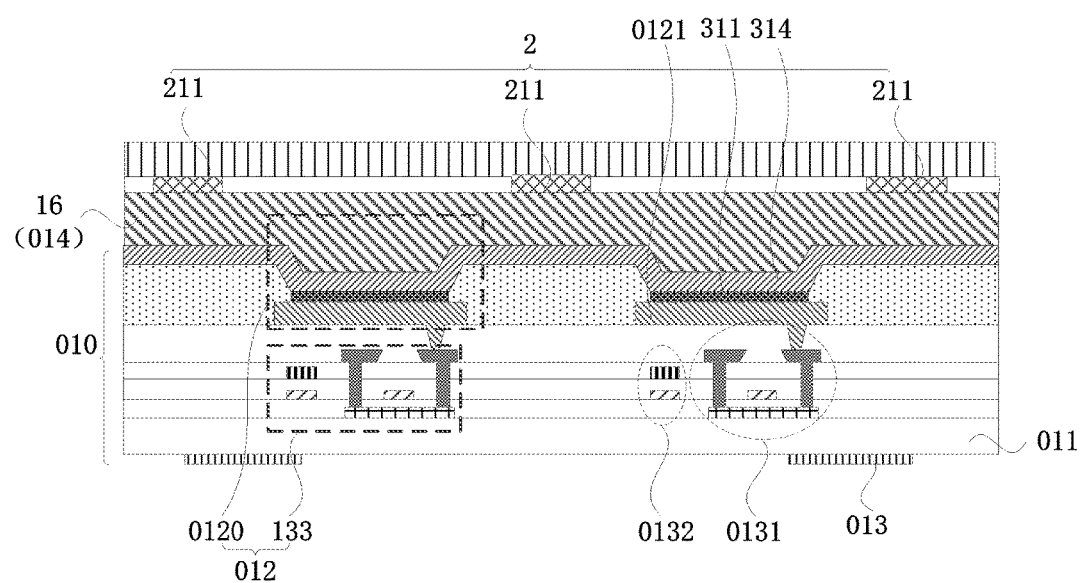
FIG. 4 illustrates a cross-sectional view of another exemplary display panel according to the disclosed embodiments.

FIG. 4 illustrates a cross-sectional view of another exemplary display panel according to the present disclosure. In one embodiment, referring to FIG. 4, the encapsulation layer 014 may be a thin film encapsulation layer 16. The fingerprint recognition module 2 may be configured on a side of the thin film encapsulation layer 16 facing away from the arrays substrate 010.

Specifically, the thin film encapsulation layer 16 may include a plurality of organic layers and a plurality of inorganic layers that are stacked alternately. The side of the thin film encapsulation layer 16 adjacent to the array substrate 010 and the side far away from the array substrate 010 may be inorganic layers to more effectively block moisture or oxygen. In addition, when the fingerprint recognition unit 211 is formed in a low temperature process, the fabrication process may not affect other layers in the display panel. The fingerprint recognition unit 211 may be directly formed on the surface of the thin film encapsulation layer 16. When the fingerprint recognition unit 211 is formed in a high temperature process, the fabrication process may probably affect the light emitting structure 0120. Thus, the fingerprint recognition unit 211 may be formed on a separate substrate, and then may be bonded to the thin film encapsulation layer 16.

Figure 5:
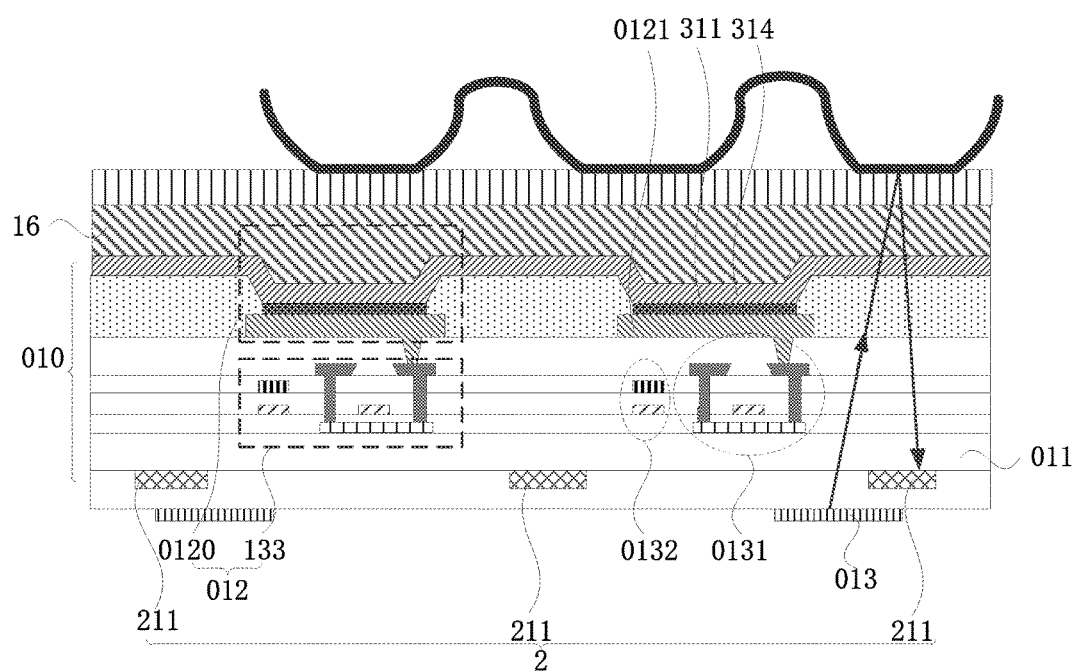
FIG. 5 illustrates a cross-sectional view of another exemplary display panel according to the disclosed embodiments.

FIG. 5 illustrates a cross-sectional view of another exemplary display panel according to the present disclosure. In one embodiment, referring to FIG. 5, the fingerprint recognition unit 211 may be configured on a side of the substrate 011 facing away from the pixel units 012. The orthogonal projection of the fingerprint recognition unit 211 on the array substrate 010 may partially overlap with the transparent region on the array substrate 010.

Specifically, the fingerprint recognition module 2 may be configured on a side of the substrate 011 facing away from the pixel units 012. The configuration may ensure that fingerprint recognition module 2 may not block the light emitted from the organic light emitting structure 0120. That is, the fingerprint recognition module 2 may not affect the viewing angle of the display panel. In addition, the orthogonal projection of the fingerprint recognition unit 211 on the array substrate 010 may at least partially overlap with the transparent region on the array substrate 010. The configuration may ensure that the fingerprint recognition unit 211 may receive the fingerprint reflected light for fingerprint recognition. In one embodiment, the orthogonal projection of the fingerprint recognition unit 211 on the array substrate 010 may be configured to be located in the transparent region on the array substrate 010. Thus, the area that the fingerprint recognition unit 211 receives light may be increased to improve the precision of fingerprint recognition.

In one embodiment, the fingerprint recognition light source 013 may be located on a side of the fingerprint recognition module 2 facing away from the pixel units 012.

Specifically, referring to FIG. 5, the light emitted from the fingerprint recognition light source 013 may pass through the transparent region on the substrate 011 to irradiate on the finger (the touch object). The light reflected by the finger may pass through the transparent region on the substrate 011 to enter the fingerprint recognition unit 211 for fingerprint recognition. The orthogonal projections of at least two thin-film-transistors and at least one capacitor of the pixel driver circuit 133 on the plane where the reflective electrode 0121 is located may fall within the reflective electrode 0121. The configuration may reduce the blockage of light by the pixel driver circuit 133, increase the transmittance in the transparent region on the array substrate 010, increase the intensity of the light that is emitted from the fingerprint recognition light source 013 and irradiates on the finger, and increase the intensity of the light that enters the fingerprint recognition unit 211. Thus, the precision of fingerprint recognition may be improved.

In one embodiment, the fingerprint recognition light source 013 may be a collimated light source. Compared to a surface light source, the collimated light source may reduce the fingerprint scattered light that causes crosstalk between different fingerprint recognition units 211, and may improve the precision of fingerprint recognition. However, because collimated light sources are often thicker surface light sources, the use of the collimated light source may increase the thickness of the display panel.

Figure 6:
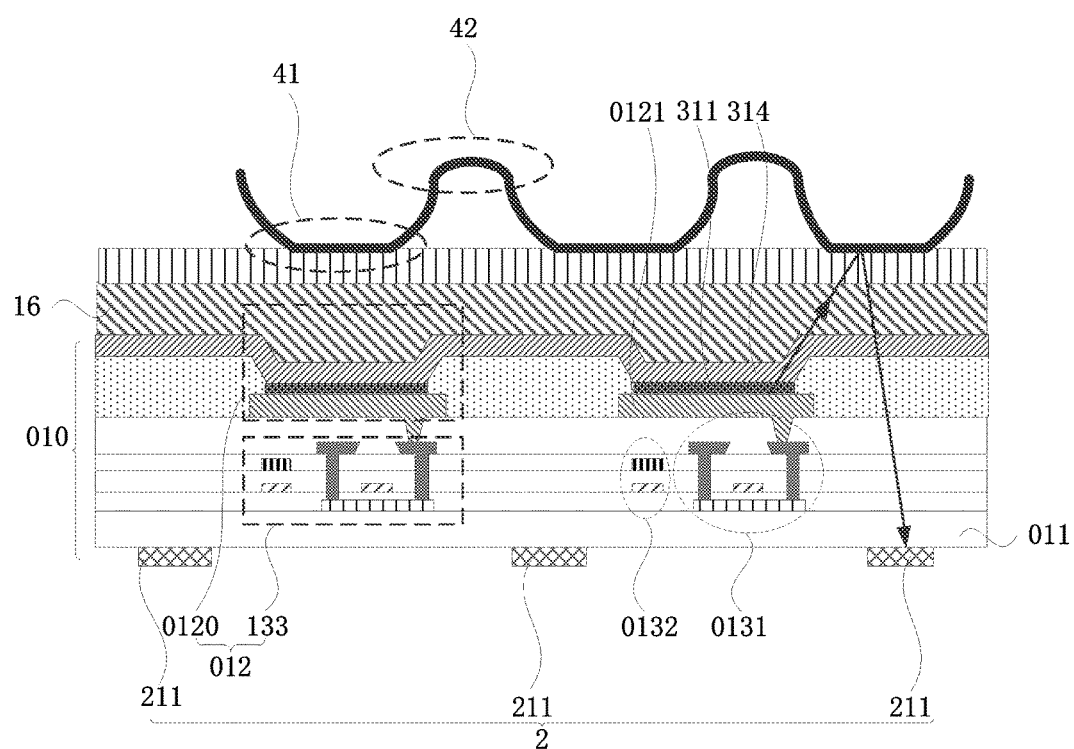
FIG. 6 illustrates a cross-sectional view of another exemplary display panel according to the disclosed embodiments.

FIG. 6 illustrates a cross-sectional view of another exemplary display panel according to the present disclosure. In one embodiment, referring to FIG. 6, the light emitting structure 0120 may be multiplexed as the fingerprint recognition light source 013.

Specifically, the light emitting structure 0120 may be the light source for the fingerprint recognition unit 211. No additional light source may be needed for the fingerprint recognition unit 211. Thus, the thickness of the display panel may be reduced and the fabrication process of the display panel may be simplified.

Further, referring to FIG. 6, the organic light emitting structure 0120 may emit light to irradiate on the finger (the touch object). The finger reflected light may pass through the transparent region on the substrate 011 to enter the fingerprint recognition unit 211 for fingerprint recognition. The orthogonal projections of at least two thin-film-transistors and at least one capacitor of the pixel driver circuit 133 on the plane where the reflective electrode 0121 is located may fall within the reflective electrode 0121. The configuration may reduce the blockage of light by the pixel driver circuit 133, increase the transmittance in the transparent region on the array substrate 010, and increase the intensity of the fingerprint reflected light that enters the fingerprint recognition unit 211. Thus, the precision of fingerprint recognition may be improved.

Figure 7:
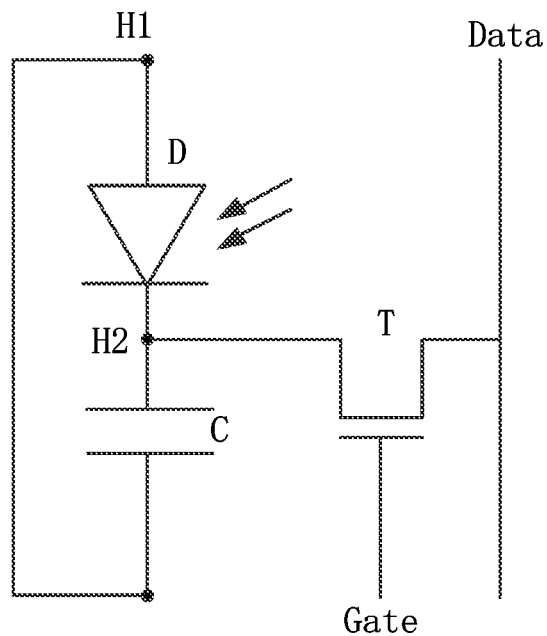
FIG. 7 illustrates a circuit diagram of an exemplary fingerprint recognition unit according to the disclosed embodiments.
Figure 8:
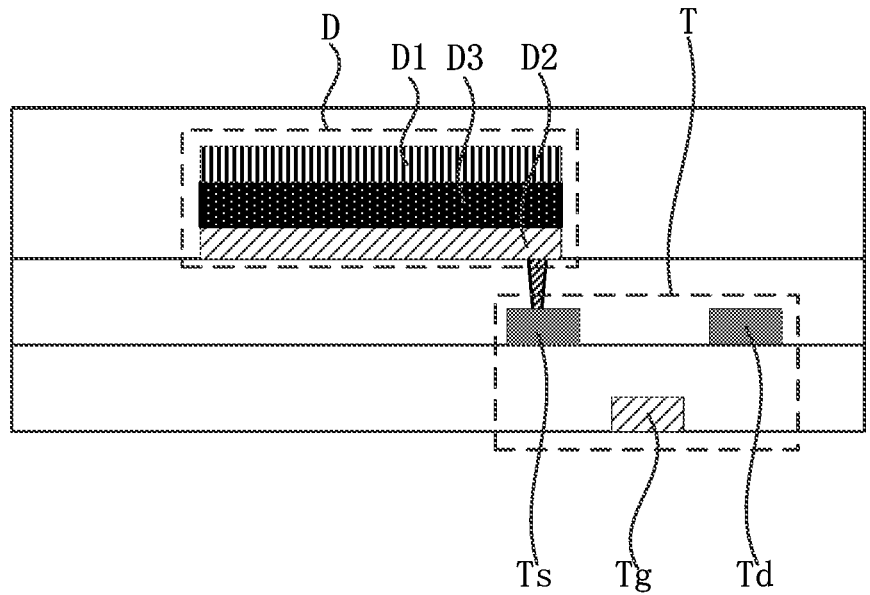
FIG. 8 illustrates a cross-sectional layer view of an exemplary fingerprint recognition unit according to the disclosed embodiments.

FIG. 7 illustrates a circuit diagram of an exemplary fingerprint recognition unit according to the present disclosure. FIG. 8 illustrates a cross-sectional layer view of an exemplary fingerprint recognition unit according to the present disclosure. In one embodiment, referring to FIG. 7 and FIG. 8, the fingerprint recognition unit 211 may include a photodiode D, a storage capacitor C, and a thin-film-transistor T.

A positive electrode D1 of the photo diode D may be electrically connected to a first electrode of the storage capacitor C. A negative electrode D2 of the photo diode D may be electrically connected to a second electrode of the storage capacitor C and a source electrode Ts of the thin-film-transistor T. A gate electrode Tg of the think-film-transistor T may be electrically connected to a switching control line Gate. And a drain electrode Td of the think-film-transistor T may be electrically connected to a signal detection line Data. The photo diode D may be used to convert the touch object reflected light into a current signal.

In one embodiment, the photo diode D may include a PIN junction D3 between the positive electrode D1 and the negative electrode D2. The orthogonal projection of the PIN junction D3 on the array substrate 010 may be located in the transparent region on the array substrate 010. The PIN junction D3 may include a P-type semiconductor, a N-type semiconductor, and an intrinsic semiconductor (I-type layer) disposed between the P-type semiconductor and the N-type semiconductor. The PIN junction D3 may be the photosensitive portion of the photo diode D. The orthogonal projection of the PIN junction D3 on the array substrate 010 may be located in the transparent region on the array substrate 010. The configuration may allow the photo diode D to have a largest area to receive the fingerprint reflected light, and may improve the precision of fingerprint recognition.

Specifically, the negative electrode D2 may be made of non-transparent metallic material. A boundary of the PIN junction D3 may not exceed a boundary of the negative electrode D2. The positive electrode D1 of the photo diode D may be located on a side of the PIN junction D3 facing away from the array substrate 010. The PIN junction D3 may be photosensitive, and may have a unidirectional conductivity. When no light irradiates on the PIN junction D3, the PIN junction D3 may have a substantially small saturation reverse leakage current, i.e., a dark current. At this point, the photo diode D may be turned off. When light irradiates on the PIN junction D3, the PIN junction D3 may have a substantially large saturation reverse leakage current, i.e., a photo current. The photo current may be proportional to the intensity of the incident light.

For illustrative purposes, the operation principle of fingerprint recognition may be described in detail with reference to FIG. 6, FIG. 7, and FIG. 8. In a fingerprint recognition phase, a low voltage signal (e.g., a constant voltage signal at −5V) may be applied to the node H1 in FIG. 7, and a high voltage signal (e.g., a constant voltage signal at 1.5V) may be applied to the signal line Data. The entire fingerprint recognition phase may include a preparation sub-phase, a fingerprint signal acquisition sub-phase, and a fingerprint signal detection sub-phase.

In the preparation sub-phase, the driver chip (not shown in FIG. 6, FIG. 7, or FIG. 8) that is electrically connected to the fingerprint recognition unit 211 may turn on the thin-film-transistor T of the fingerprint recognition unit 211 through the switching control line Gate, and may charge the storage capacitor C until the storage capacitor C is completely charged. In the fingerprint signal acquisition sub-phase, the driver chip may turn off the thin-film-transistor T of the fingerprint recognition unit 211 through the switching control line Gate. When the finger of the user is pressed on the display panel, the light emitted from the light emitting structure 0120 may irradiate on the finger, and may form a light reflected by the surface of the fingerprint of the finger. The light reflected by the fingerprint of the finger may enter the fingerprint recognition unit 211, be received by the photo diode D of the fingerprint recognition unit 211, and form a photo current. The photo current may flow from the node H2 to the node H1, and change the voltage at the node H2. In the fingerprint signal detection sub-phase, the photo current may be determined by directly measuring the voltage change at the node H2.

In one embodiment, in the fingerprint signal detection sub-phase, the thin-film-transistor T of the fingerprint recognition unit 211 may be turned on through the switching control line Gate. At this point, a voltage difference may exist between the two electrodes of the storage capacitor C. The storage capacitor C may be in c a charging state. The photocurrent may be determined by measuring an amount of electric charge to be charged into the storage capacitor C.

Referring to FIG. 6, because ridges 41 of the fingerprint of the finger pressed on the display panel contact a surface of the display panel, and valleys 42 of the fingerprint of the finger pressed on the display panel do not contact a surface of the display panel, the light that irradiates on the ridges 41 and valleys of the fingerprint may have different reflectance, the light reflected at the ridges 41 and valleys may have different intensities when received by the fingerprint recognition unit 211, and the photo currents converted from the light reflected at the ridges 41 and valleys 42 may be different. Thus, fingerprint recognition may be based on the photo current.

Figure 9:
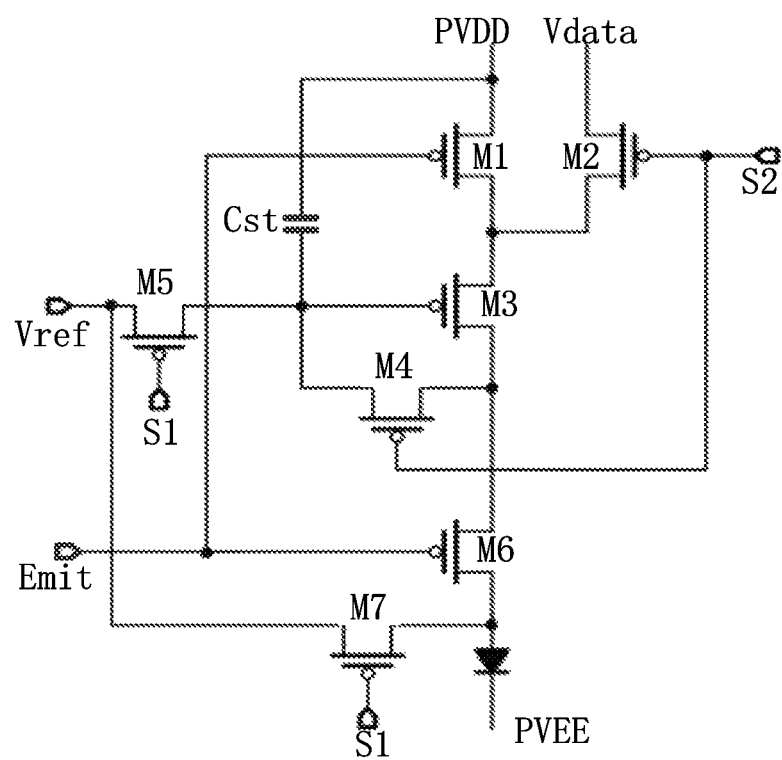
FIG. 9 illustrates a circuit diagram of an exemplary pixel driver circuit according to the disclosed embodiments.

FIG. 9 illustrates a circuit diagram of an exemplary pixel driver circuit according to the present disclosure. In one embodiment, referring to FIG. 9, the pixel driver circuit may include a first thin-film-transistor M1, a second thin-film-transistor M2, a third thin-film-transistor M3, a fourth thin-film-transistor M4, a fifth thin-film-transistor M5, a sixth thin-film-transistor M6, a seventh thin-film-transistor M7, and a first capacitor Cst. A first signal input terminal S1, a second signal input terminal S2, and a third signal input terminal Emit may be configured to provide square wave input signals to the pixel driver circuit. A first power supply terminal PVDD and a second power supply terminal PVEE may supply power to the pixel driver circuit. A reference signal terminal Vref may supply a reference voltage to the pixel driver circuit. A data input terminal Vdata may be configured to input pixel data signal. For illustrative purposes, the pixel driver circuit according to the present disclosure may include seven thin-film-transistors and one capacitor. No limitation is imposed by the present disclosure in terms of the number of thin-film-transistors, the number of capacitors, and other suitable components.

Figure 10:
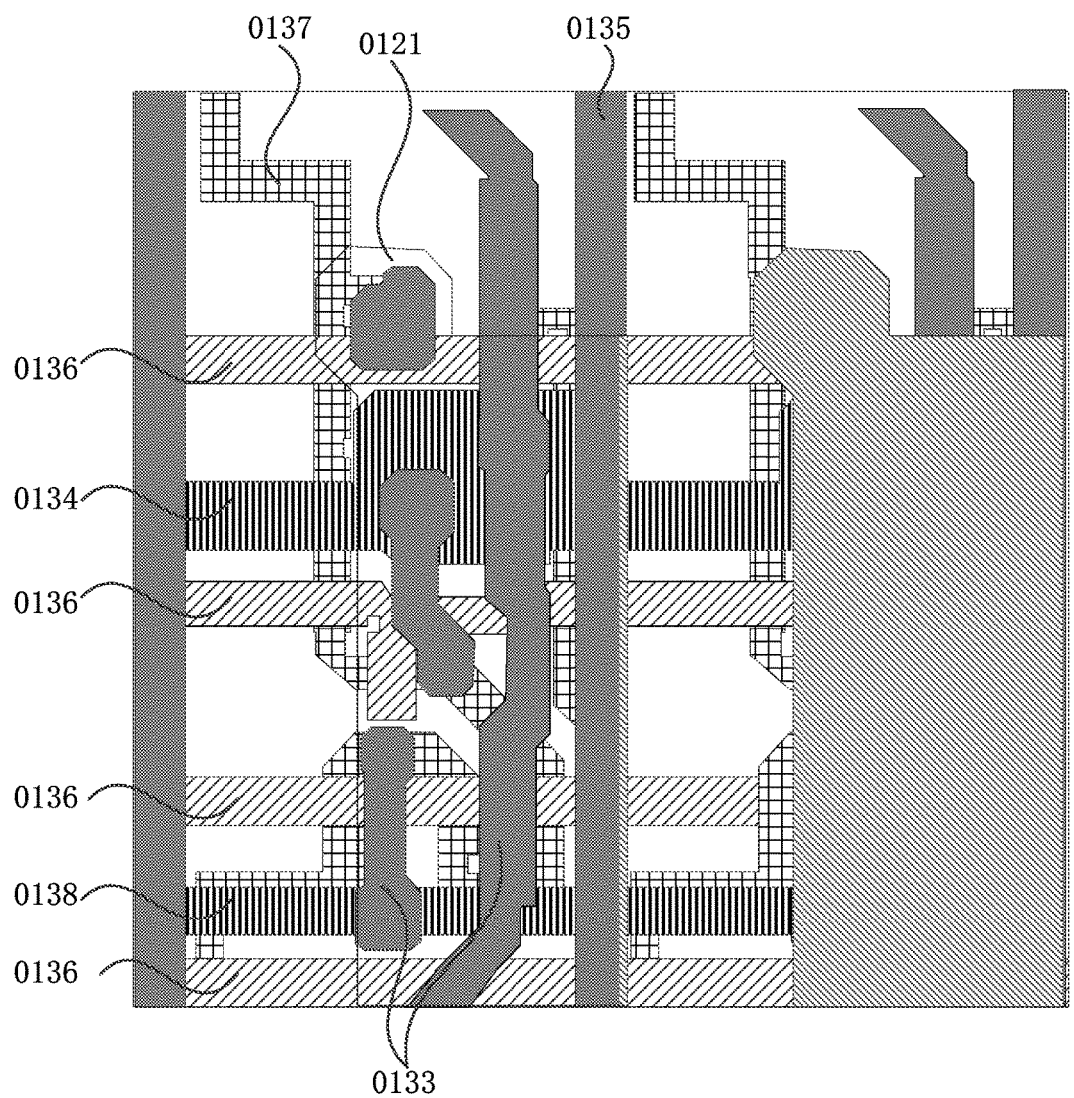
FIG. 10 illustrates a top-down layer view of the exemplary pixel driver circuit in FIG. 9.

FIG. 10 illustrates a top-down layer view of the exemplary pixel driver circuit in FIG. 9. In one embodiment, referring to FIG. 10, the pixel driver circuit may also include connection lines 0133 between at least two thin-film-transistors and at least one capacitor. Orthogonal projections of the connection lines 0133 on the plane where the reflective electrodes 0121 are located may fall within the reflective electrodes 0121.

Specifically, the connection lines 0133 may include the connection lines between the thin-film-transistors, between the thin-film-transistors and the capacitors, and between the capacitors. The configuration that the orthogonal projections of the connection lines 0133 on the plane where the reflective electrodes 0121 are located fall within the reflective electrodes 0121 may reduce metal lines in the transparent region, and may further increase the transmittance in the transparent region. Thus, the precision of fingerprint recognition may be improved.

In one embodiment, referring to FIG. 10, the pixel driver circuit may also include power supply lines 134, data lines 0135, and scanning lines 0136. The power supply lines 0134, the data lines 0135, and the scanning lines 0136 may have a line width narrower than or equal to about 2.5 µm.

Specifically, the power supply lines 0134 may be electrically connected to the first power supply terminal PVDD or the second power supply terminal PVEE in FIG. 9. The data lines 0135 may be electrically connected to the data input terminal Vdata in FIG. 9. The scanning lines 0136 may be electrically connected to the first signal input terminal S1, the second signal input terminal S2, or the third signal input terminal Emit in FIG. 9. Because the power supply lines 0134, the data lines 0135, and the scanning lines 0136 are required to be laid in the transparent region, configuring the line width of the power supply lines 0134, the data lines 0135, and the scanning lines 0136 to be narrower than or equal to 2.5 µm may reduce the blockage of light by the metal lines, further increase the transmittance in the transparent region, and improve the precision of fingerprint recognition. In addition, the line width of the power supply lines 0134, the data lines 0135, and the scanning lines 0136 may be configured to be narrower than or equal to about 2 µm, or 1.5 µm, etc. based on the resolution of the display panel, which is not limited by the present disclosure.

In addition, in one embodiment, referring to FIG. 10, the line width of the active layer 0137 configured with thin-film-transistors may be narrower than or equal to about 2 µm. The line width of the reference signal line 0138 that is electrically connected to the reference signal terminal Vref of the pixel driver circuit may be may be narrower than or equal to about 2.5 µm. Thus, the light transmittance in the transparent region may be further increased, and the precision of fingerprint recognition may be improved.

In one embodiment, referring to FIG. 10, an orthogonal projection of the data lines 0135 on the plane where the reflective electrodes 0121 are located may pass through the reflective electrodes 0121. In this case, to a large extent, the data lines 0135 may cross under the reflective electrode 0121 in an extension direction. That it, the data lines 0135 may pass through non-transparent regions on the array substrate as much as possible. The configuration may reduce length of the data lines 0135 in the transparent region, increase the light transmittance in the transparent region, and further improve the precision of fingerprint recognition.

The present disclosure also provides a display panel. The display panel may include a display module, a fingerprint recognition module, and a light source. The display module may include a first substrate and a first polarizer layer disposed on the first substrate. The display module may have a light emitting side located on a side of the first polarizer layer facing away from the first substrate. The fingerprint recognition module may be located on a side of the first substrate facing away from the first polarizer layer, and may include a fingerprint recognition layer and a second polarizer layer located on a side of the fingerprint recognition layer adjacent to the display module. The light source may be located on a side of the first polarizer layer facing away from the light emitting side of the display module. The fingerprint recognition layer may be used to recognize fingerprints based on fingerprint signal light that is formed when the light emitted from the light source is reflected by a touch object to the fingerprint recognition layer.

The first polarizer layer and the second polarizer layer may be coordinated to let the fingerprint signal light pass through the first polarizer layer and the second polarizer layer with minimal light attenuation. The second polarizer may be used to attenuate fingerprint noise light. The fingerprint noise light may be a light that is other than the fingerprint signal light.

In the present disclosure, a first polarizer layer may be configured on a side of a first substrate in the display module adjacent to a light emitting side of the display module. The fingerprint recognition module may be configured on a side of the first substrate facing away from the first polarizer layer. The fingerprint recognition module may include a fingerprint recognition layer and a second polarizer layer disposed on a side of the fingerprint recognition layer adjacent to the display module. In the fingerprint recognition phase, the light emitted from the light source located on a side of the first polarizer layer facing away from the light emitting side of the display module may be reflected by a touch object (a finger) touching the display screen to form a fingerprint signal light.

At this point, the first polarizer layer and the second polarizer layer may be coordinated to let the fingerprint signal light pass through the first polarizer layer and the second polarizer layer with little attenuation. At the same time, before the light (fingerprint noise light) that is not reflected by the touch object reaches the fingerprint recognition layer, the second polarizer layer may at least attenuate the intensity of the fingerprint noise light. Thus, crosstalk of the fingerprint noise light may be minimized, signal-to-noise ratio may be increased, and the precision of fingerprint recognition by the fingerprint module may be improved.

In one embodiment, the light source may be existing light emitting structures in the display module to avoid increasing the thickness of the display panel and to reduce fabrication cost. In other embodiments, an external light source may be configured on a side of the fingerprint recognition module facing away from the display module for the convenience of positioning the light source (e.g., using collimated light source to minimize crosstalk between fingerprint signal light). The location of the light source is not limited by the present disclosure, as long as the light source is located on a side of the first polarizer layer facing away from the light emitting side of the display module, and the fingerprint recognition module may be able to detect the normal fingerprint signal light.

In one embodiment, the fingerprint noise light may include at least one of a portion of light leaked from the light emitting structures in the display module toward the side of the fingerprint recognition module and a portion of light that is formed when the light emitted from the external light source is reflected by the metals (e.g., gate electrodes, source electrodes, and drain electrodes of thin-film-transistors, and metal wirings) in the display module.

With respect to the portion of light leaked from the light emitting structures in the display module toward to the side of the fingerprint recognition module, the second polarizer layer may be configured to be a linear polarizer layer or a circular polarizer layer to reduce the intensity of the portion of the fingerprint noise light by half. With respect to the light reflected by the metals in the display module, the second polarizer layer may be configured to be a circular polarizer layer to completely eliminate the portion of the fingerprint noise light.

In one embodiment, when the second polarizer layer is a linear polarizer layer, in order to let the fingerprint signal light pass through the first polarizer layer and the second polarizer layer with little attenuation, the first polarizer layer may be configured to be a linear polarizer layer having a polarization direction same as the polarization of the second polarizer layer. When the second polarizer layer is a circular polarizer layer, in order to let the fingerprint signal light pass through the first polarizer layer and the second polarizer layer with little attenuation, the first polarizer layer may be configured to be a circular polarizer layer matching the second polarizer layer.

Figure 11:
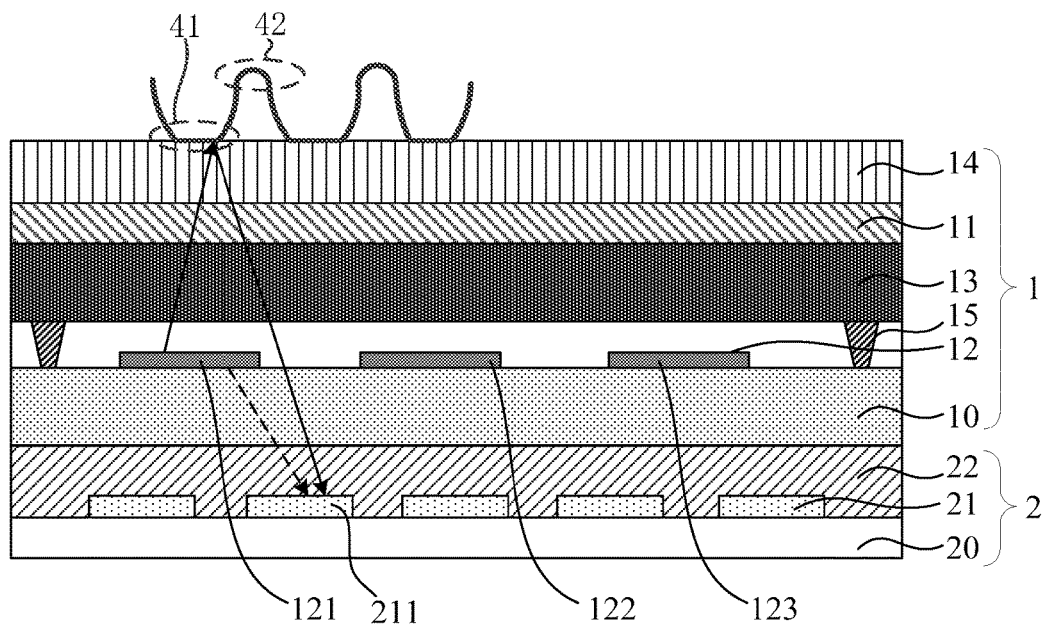
FIG. 11 illustrates a cross-sectional view of another exemplary display panel according to the disclosed embodiments.

FIG. 11 illustrates a cross-sectional view of another exemplary display panel according to the present disclosure. As shown in FIG. 11, the display panel according to the present disclosure may include a display module 1 and a fingerprint recognition module 2. The display module 1 may include a first substrate 10, and a first polarizer layer 11 disposed on the first substrate 10. A light emitting side of the display module 1 may be configured on a side of the first polarizer layer 11 facing away from the first substrate 10. The fingerprint recognition module 2 may be located on a side of the first substrate 10 facing away from the first polarizer layer 11, and may include a fingerprint recognition layer 21 and a second polarizer layer 22 disposed on a side of the fingerprint recognition layer 21 adjacent to the display module 1. The fingerprint recognition layer 21 may be used to recognize fingerprints based on a fingerprint signal light that is formed when the light emitted from the light source is reflected by a touch object to the fingerprint recognition layer 21. The display module 1 may also include an organic light emitting layer 12 disposed between the first substrate 10 and the first polarizer layer 11 to provide light for image display.

In one embodiment, the organic light emitting layer 12 may include a plurality of organic light emitting units. For example, as shown in FIG. 11, the organic light emitting layer 12 may include red organic light emitting units 121, green light emitting units 122, and blue light emitting units 123. The fingerprint recognition layer 21 may include a plurality of fingerprint recognition units 211.

In one embodiment, the organic light emitting layer 12 may be multiplexed as the light source for fingerprint recognition. For illustrative purposes, the plurality of organic light emitting units and the plurality of fingerprint recognition units 211 may be arranged in arrays. The fingerprint recognition units 211 may be configured in coordination with the organic light emitting units. As a light source, one organic light emitting unit may generate a plurality of fingerprint signal light, which may be received by one or more fingerprint recognition units 211 that correspond to the organic light emitting unit. In another embodiment, the display panel may include a display region. The organic light emitting units and the fingerprint recognition units 211 may be located in the display region. Thus, fingerprint recognition may be performed in the display region of the display panel.

Referring to FIG. 11, the light emitted from the organic light emitting layer 12 may irradiate on the touch object. The touch object may often be a finger. The fingerprint may include a plurality of ridges 41 and valleys 42 on a surface of the finger tip. Because the fingerprint recognition units receive light reflected by the ridges 41 and valleys 42 with different intensities, the light reflected at the ridge 41 positions and the valley positions 42 may be converted to different photo currents. Thus, fingerprint recognition may be performed based on the photo currents. In other embodiments, the touch object may be a palm. In this case, the fingerprint recognition units 211 may achieve the detection and recognition function based on palmprints.

The organic light emitting layer 12 may be multiplexed as the light for image display and as the light source for fingerprint recognition. In either the display phase or the fingerprint recognition phase, the organic light emitting layer 12 may emit light. In other words, in the display phase, all the organic light emitting units in the organic light emitting layer 12 may be supplied with a light emitting driver signal. In the fingerprint recognition phase, only a portion of the organic light emitting units may be supplied with the light emitting driver signal. Thus, in this case, the display module 1 according to the present disclosure may also include a first display driver circuit (not shown) configured to output a driver signal to drive at least a portion of the organic light emitting units to emit light, acting like the light source for the fingerprint recognition module 2.

For illustrative purposes, because the light emitted from the blue organic light emitting units 123 has a shorter wavelength, and the layers (e.g., organic insulation layer, inorganic insulation layer, and polarizer layer, etc.) in the display panel may attenuate light with a short wavelength more, the light emitted from the blue organic light emitting units 123 may have a lower light transmittance, and may be more likely to be absorbed by the display panel. Moreover, the material of the light emitting function layer of the blue organic light emitting units 123 may have a shorter lifespan than the materials of the light emitting function layers of the red organic light emitting units 121 and the green organic light emitting units 122. Thus, in the fingerprint recognition phase, the first display driver circuit may output a driver signal to drive the red organic light emitting units or the green organic light emitting units or both to emit light.

In one embodiment, the display panel according to the present disclosure may also include a touch-control function layer. No limitation on the structure and position of the touch-control function layer is imposed by the present disclosure, as long as touch positions may be detected. After the touch position by the finger is detected, in the fingerprint recognition phase, the first display driver circuit may output a driver signal to drive the organic light emitting units located in the region corresponding to the touch position to emit light.

In one embodiment, the first polarizer layer may be a first linear polarizer layer, and the second polarizer layer may be a second linear polarizer layer. The first linear polarizer layer and the second linear polarizer layer may have a same polarization direction.

Referring to FIG. 11, the solid line arrows may represent the light emitted from the organic light emitting layer 12 toward the light emitting side and the fingerprint signal light reflected by the touch object. The dashed line arrow may represent the light leaked from the organic light emitting layer 12 toward the fingerprint recognition module 2. The light emitted from the organic light emitting layer 12, or specifically the red organic light emitting unit 121 as shown in FIG. 11, may pass through the first polarizer layer 11 to be changed into a linearly polarized light. After being reflected by the touch object, the linearly polarized light may remain as a linearly polarized light (now fingerprint signal light) without changing the polarization direction. The linearly polarized light may pass through the first polarizer layer 11 again with little attenuation. After the fingerprint signal light passes through the second polarizer layer 22, because the second polarizer layer 22 has a same polarization direction as the first polarizer layer 11, the fingerprint signal light may pass through the second polarizer layer 22 with little attenuation, and may enter into the fingerprint recognition unit 211.

On the other hand, the light leaked from the red organic light emitting unit 121 may be a uniformly polarized light. After passing through the second polarizer layer 22, the uniformly polarized light may be changed into a linearly polarized light and the intensity may be reduced to half. Thus, when reaching the fingerprint recognition unit 211, the intensity of the light leaked from the organic light emitting unit may be substantially reduced. When the intensity of the fingerprint signal light remains unchanged, the intensity of the fingerprint noise light may be relatively weakened. Thus, the signal-to-noise ratio of the fingerprint recognition module 2 may be increased, and the precision of fingerprint recognition by the fingerprint recognition module 2 may be improved.

In one embodiment, the display panel according to the present disclosure may be a rigid display panel. Specifically, as shown in FIG. 11, the first substrate 10 may be a first glass substrate. The display module 1 may also include a second glass substrate 13. The organic light emitting layer 12 may be disposed between the first glass substrate 10 and the second glass substrate 13. The first glass substrate 10 and the second glass substrate 13 may be supported by spacers 15. Air gap may exist between the first glass substrate 10 and the second glass substrate 13. In one embodiment, the air gap may have a thickness approximately of 4 μm. The display panel may also include a cover 14. The cover 14 may be bonded to a surface of the first polarizer layer 11 facing away from the organic light emitting layer 12 by a liquid optical adhesive. In one embodiment, the display module 1 may have a thickness approximately of 1410 μm.

In one embodiment, the fingerprint recognition module 2 may also include a second substrate 20. The fingerprint recognition layer 21 may be configured on a surface of the second substrate 20 adjacent to the display module 1. Thus, the fingerprint recognition layer 21 may be directly formed on the second substrate 20. The configuration may not only be for the convenience of forming the fingerprint recognition layer 21, but also serve as a protection mechanism to the fingerprint recognition layer 21 by the second substrate 20. In addition, the second polarizer layer 22 may be bonded to the first substrate 10 by an optical adhesive (not shown) to combine the display module 1 and the fingerprint recognition module 2 together to form the display panel.

In addition, the first polarizer layer according to the present disclosure may include a first quarter wave plate and a third linear polarizer layer tacked together. The first quarter wave plate may be disposed on a side of the third linear polarizer layer adjacent to the organic light emitting layer. The second polarizer layer may include a second quarter wave plate and a fourth linear polarizer layer stacked together. The second quarter wave plate may be disposed on a side of the fourth linear polarizer layer adjacent the organic light emitting layer. The first quarter wave plate and the second quarter wave plate may be made of a same material and may have a same thickness.

Facing toward a transmission direction of the fingerprint signal light and assuming the counterclockwise direction is a positive direction, the optical axis direction of the first quarter wave plate and the polarization direction of the third linear polarizer may form an angle of about 45°, and the optical axis direction of the second quarter wave plate and the polarization direction of the fourth linear polarizer may form an angle of about −45°. Alternatively, the optical axis direction of the first quarter wave plate and the polarization direction of the third linear polarizer may form an angle of about −45°, and the optical axis direction of the second quarter wave plate and the polarization direction of the fourth linear polarizer may form an angle of about 45°. Thus, both the first polarizer layer and the second polarizer layer may be a circular polarizer layer.

For illustrative purposes, facing toward a transmission direction of the fingerprint signal light and assuming the counterclockwise direction is a positive direction, the optical axis direction of the first quarter wave plate and the polarization direction of the third linear polarizer may form an angle of about 45°, and the optical axis direction of the second quarter wave plate and the polarization direction of the fourth linear polarizer may form an angle of about −45°. The first quarter wave plate and the second quarter wave plate may be made of calcite. The e axis of the first quarter wave plate and the second quarter wave plate may be the optical axis.

Figure 12A:
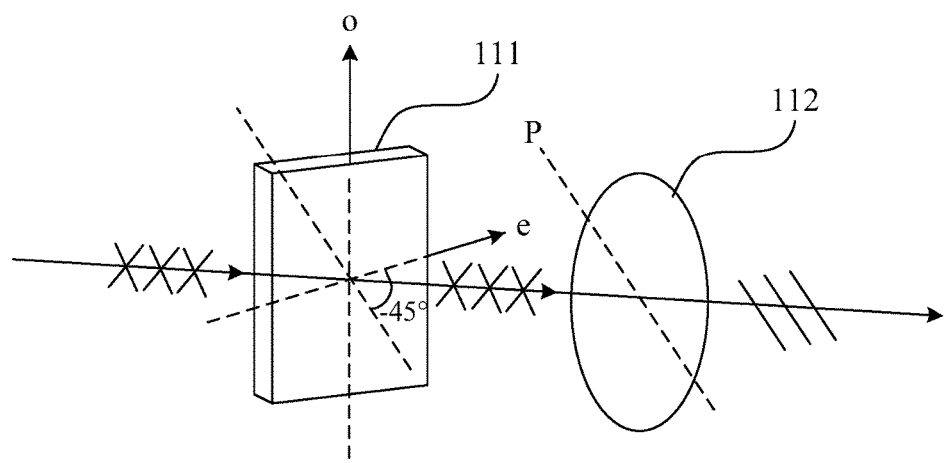
FIG. 12A illustrates an optical path diagram of light emitted from an exemplary organic light emitting layer before being reflected by a touch object according to the disclosed embodiments.

FIG. 12A illustrates an optical path diagram of light emitted from an exemplary organic light emitting layer before being reflected by a touch object according to the present disclosure. In the fingerprint recognition phase, as shown in FIG. 12A, before the light emitted from the organic light emitting layer 12 is reflected by the touch object, facing toward the transmission direction of the light and assuming the counterclockwise direction is the positive direction, the angle between the e axis direction of the first quarter wave plate 111 and the polarization direction P of the third linear polarizer layer 112 may be about −45°. After passing through the first quarter wave plate 111, the natural light emitted from the organic light emitting layer 12 may be still a natural light. After passing through the third linear polarizer layer 112, the natural light may be changed into a linearly polarized light that has a polarization direction in the second and fourth quadrants same as the polarization direction P of the third linear polarizer layer 112.

Figure 12B:
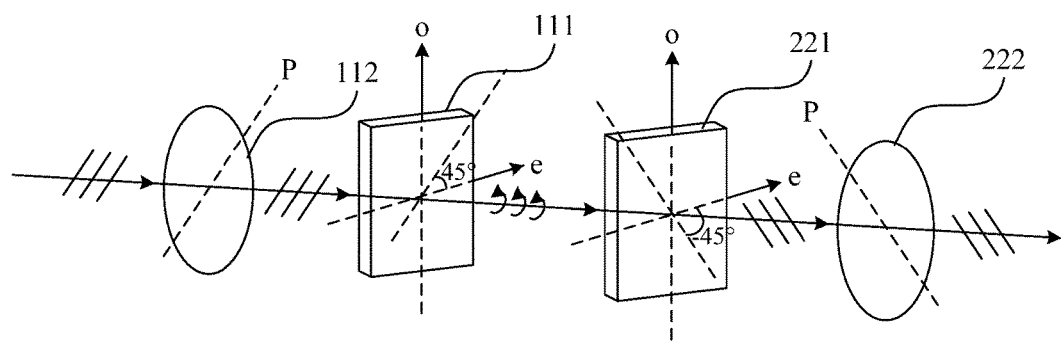
FIG. 12B illustrates an optical path diagram of light emitted from an exemplary organic light emitting layer after being reflected by a touch object according to the disclosed embodiments.

FIG. 12B illustrates an optical path diagram of light emitted from an exemplary organic light emitting layer after being reflected by a touch object according to the present disclosure. Referring to FIG. 12B, after being reflected by the touch object, the linearly polarized light may become a fingerprint signal light, and the polarization direction may remain unchanged. However, facing toward the transmission direction of the fingerprint signal light and assuming the counterclockwise direction is the positive direction, the angle between the e axis direction of the first quarter wave plate 111 and the polarization direction P of the third linear polarizer layer 112 may be about 45°. The fingerprint signal light may be a linearly polarized light having a polarization direction in the first and third quadrants. After passing through the third linear polarizer layer 112 again, the polarization state and the intensity of the fingerprint signal light may remain unchanged. After passing through the first quarter wave plate 111, the fingerprint signal light may be changed into a left circularly polarized light with the intensity unchanged. After passing through the second quarter wave plate 221, the left circularly polarized light may be changed into a linearly polarized light having a polarization direction in the second and fourth quadrants. Finally, after passing through the fourth linear polarizer layer 222 that has a polarization direction parallel with the polarization direction of the linearly polarized light, the intensity of the linearly polarized light may remain unchanged.

Figure 13:
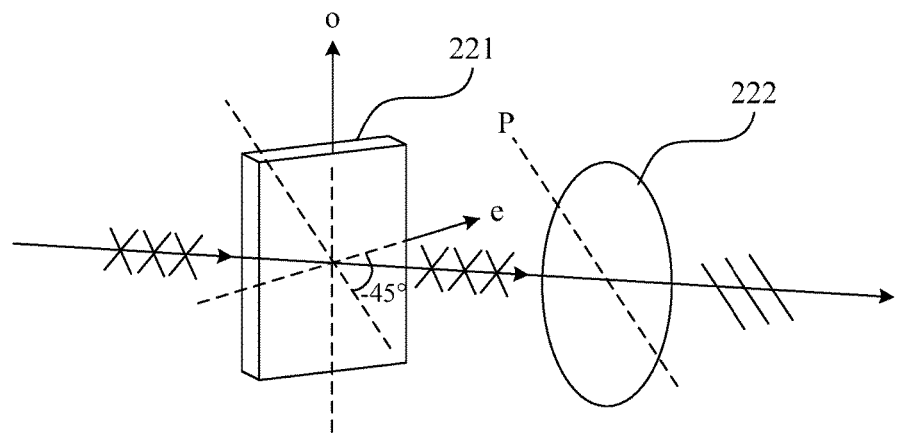
FIG. 13 illustrates an optical path diagram of fingerprint noise light emitted from an exemplary organic light emitting layer according to the disclosed embodiments.

FIG. 13 illustrates an optical path diagram of fingerprint noise light emitted from an exemplary organic light emitting layer according to the present disclosure. Referring to FIG. 13, the fingerprint noise light emitted from the organic light emitting layer may directly pass through the second polarizer layer. Facing toward the transmission direction of the fingerprint noise light and assuming the counterclockwise direction is the positive direction, the angle between the e axis direction of the second quarter wave plate and the polarization direction P of the fourth linear polarizer layer 222 may be about −45°. After passing through the second quarter wave plate 221, the fingerprint noise light may still be a natural light. After passing through the fourth linear polarizer layer 222, the natural light may be changed into a linearly polarized light having a polarization direction in the second and fourth quadrants, same as the polarization direction P of the fourth linear polarizer layer 222. However, the intensity may be attenuated by half. Thus, the second polarizer may attenuate the intensity of fingerprint noise light to increase the signal-to-noise ratio.

Figure 14:
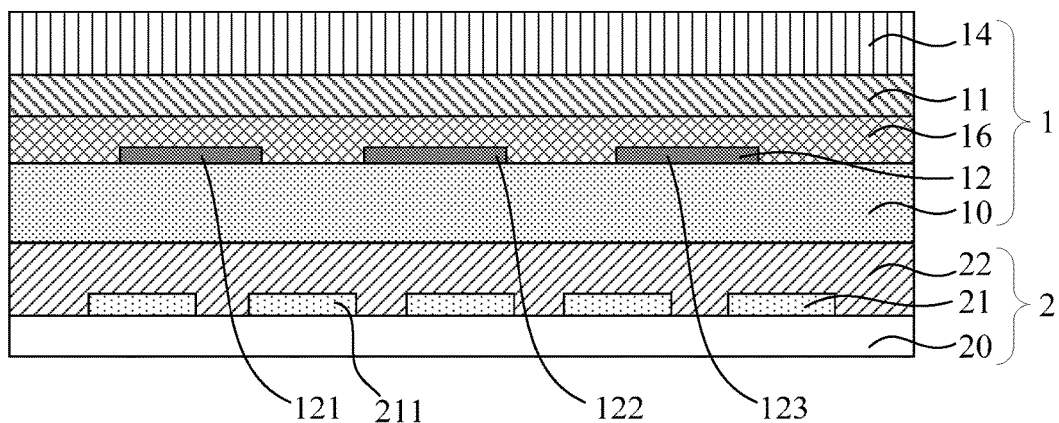
FIG. 14 illustrates a cross-sectional view of another exemplary display panel according to the disclosed embodiments.

FIG. 14 illustrates a cross-sectional view of another exemplary display panel according to the present disclosure. As compared to the display panel in FIG. 11, the display panel may be a flexible display panel. Specifically, as shown in FIG. 14, the first substrate 10 may be a flexible substrate. The display module 1 may also include a thin film encapsulation layer 16 instead of the second glass substrate, as shown in FIG. 11. The thin film encapsulation layer 16 may cover the organic light emitting layer 12.

Figure 15:
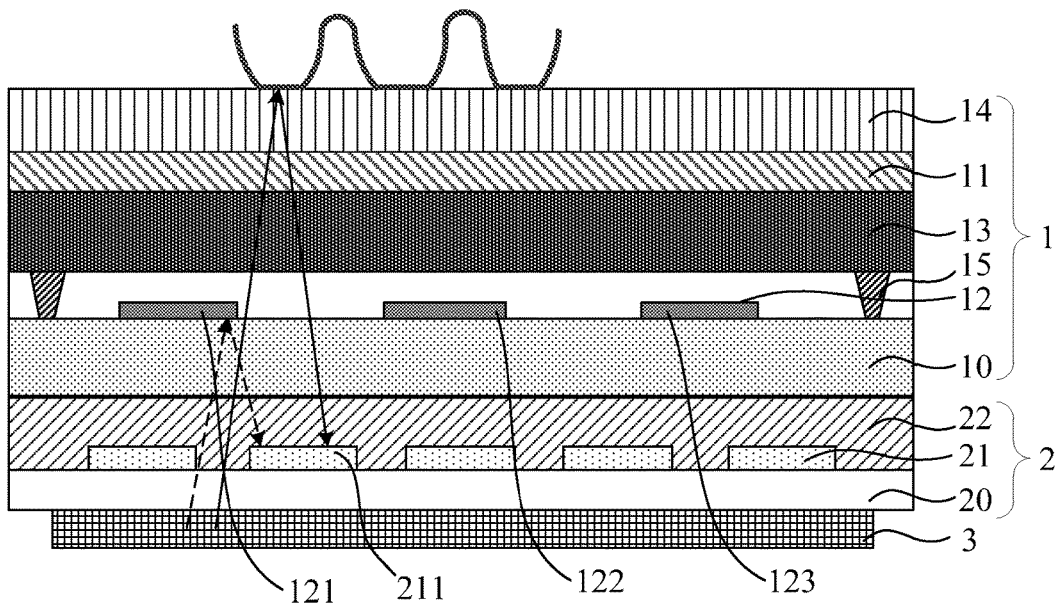
FIG. 15 illustrates a cross-sectional view of another exemplary display panel according to the disclosed embodiments.

FIG. 15 illustrates a cross-sectional view of another exemplary display panel according to the present disclosure. As shown in FIG. 15, the display panel according to the present disclosure may include a display module 1, a fingerprint recognition module 2, an organic light emitting layer 12, and a backlight source 3. The display module 1 may include a first substrate 10, and a first polarizer layer 11 disposed on the first substrate 10. A light emitting side of the display module 1 may be located on a side of the first polarizer layer 11 facing away from the first substrate 10. The organic light emitting layer 12 may be disposed between the first substrate 10 and the first polarizer layer 11 to emit light for image display.

The fingerprint recognition module 2 may be disposed on a side of the first substrate 10 facing away from the first polarizer layer 11, and may include a fingerprint recognition layer 21 and a second polarizer layer 22 disposed on a side of the fingerprint recognition layer 21 adjacent to the display module 1. The fingerprint recognition layer 21 may be configured to recognize fingerprints based on the fingerprint signal light that is formed when the light emitted from the light source is reflected by the touch object to the fingerprint recognition layer 21. The backlight source 3 may be disposed on a side of the fingerprint recognition module 2 facing away from the display module 1. The backlight source 3 may be the light source for the fingerprint recognition module 2.

In one embodiment, the organic light emitting layer 12 may include a plurality of organic light emitting units. For example, as shown in FIG. 15, the organic light emitting layer 12 may include a red organic light emitting unit 121, a green light emitting unit 122, and a blue light emitting unit 123. The fingerprint recognition layer 21 may include a plurality of fingerprint recognition units 211. In one embodiment, the display panel may include a display region. The organic light emitting units and the fingerprint recognition units 211 may be located in the display region. Thus, fingerprint recognition may be performed in the display region of the display panel.

The organic light emitting layer 12 may be used to emit light for image display. The backlight source 3 may be the light source for the fingerprint recognition module 2. In the display phase, the backlight source 3 may not emit light to avoid affecting the effect of the display. In the fingerprint recognition phase, the organic light emitting layer 12 may not emit light to avoid crosstalk to fingerprint recognition from the light leaked from the organic light emitting layer 12 and the light reflected by the touch object to irradiate on the fingerprint recognition unit 121. Thus, the display module 1 according to the present disclosure may also include a second display driver circuit (not shown) not to output a display driver signal to drive the organic light emitting layer 12 to emit light in the fingerprint recognition phase, and not to output a detection driver signal to drive the backlight source 3 to emit light in the display phase.

In one embodiment, the first polarizer layer 11 according to the present disclosure may include a first quarter wave plate and a third linear polarizer layer stacked together. The first quarter wave plate may be disposed on a side of the third linear polarizer layer adjacent to the organic light emitting layer. The second polarizer layer may include a second quarter wave plate and a fourth linear polarizer layer stacked together. The second quarter wave plate may be disposed on a side of the fourth linear polarizer layer adjacent to the organic light emitting layer. The first quarter wave plate and the second quarter wave plate may be made of a same material and may have a same thickness.

Facing toward the transmission direction of the fingerprint signal light and assuming the counterclockwise direction is the positive direction, the optical axis of the first quarter wave plate and the polarization direction of the third linear polarizer layer may form an angle of about 45°, and the optical axis of the second quarter wave plate and the polarization direction of the fourth linear polarizer layer may form an angle of about −45°. Alternatively, the optical axis of the first quarter wave plate and the polarization direction of the third linear polarizer layer may form an angle of about −45°, and the optical axis of the second quarter wave plate and the polarization direction of the fourth linear polarizer layer may form an angle of about 45°.

For illustrative purposes, facing toward the transmission direction of the fingerprint signal light and assuming the counterclockwise direction is the positive direction, the optical axis of the first quarter wave plate and the polarization direction of the third linear polarizer layer may form an angle of about 45°, and the optical axis of the second quarter wave plate and the polarization direction of the fourth linear polarizer layer may form an angle of about −45°. The first quarter wave plate and the second quarter wave plate may be made of calcite. The 'e' axis of the first quarter wave plate and the second quarter wave plate may be the optical axis.

Referring to FIG. 15, the solid line arrows may represent the light emitted from the backlight source 3 toward the light emitting side and the fingerprint signal light reflected by the touch object. The dashed line arrow may represent the light that is formed when the light emitted from the backlight source 3 is reflected by the metals in the display module 1.

Figure 16A:
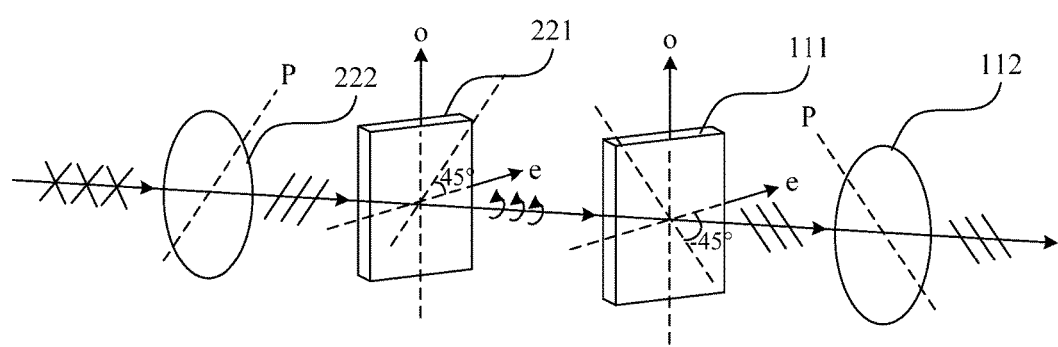
FIG. 16A illustrates an optical path diagram of light emitted from an exemplary backlight source before being reflected by a touch object according to the disclosed embodiments.

FIG. 16A illustrates an optical path diagram of light emitted from an exemplary backlight source before being reflected by a touch object according to the present disclosure. In the fingerprint recognition phase, as shown in FIG. 16A, before the light emitted from the backlight source 3 is reflected by the touch object, facing toward the transmission direction of the light and assuming the counterclockwise direction is the positive direction, the angle between the e axis direction of the first quarter wave plate 111 and the polarization direction P of the third linear polarizer layer 112 may be about −45°, and the angle between the e axis direction of the second quarter wave plate 221 and the polarization direction of the fourth linear polarizer layer 222 may be about 45°. After passing through the fourth linear polarizer layer 222, the natural light emitted from the backlight source 3 may be changed into a linearly polarized light having a polarization direction in the first and third quadrants. After passing through the second quarter wave plate 221, the linearly polarized light may be changed into a left circularly polarized light. After passing through the first quarter wave plate 111, the left circularly polarized light may be changed into a linearly polarized light having a polarization direction in the second and fourth quadrants, and parallel with the polarization direction of the third linear polarizer layer 112. Thus, after passing through the third linear polarizer layer 112, the polarization state of the linearly polarized light may remain unchanged.

Figure 16B:
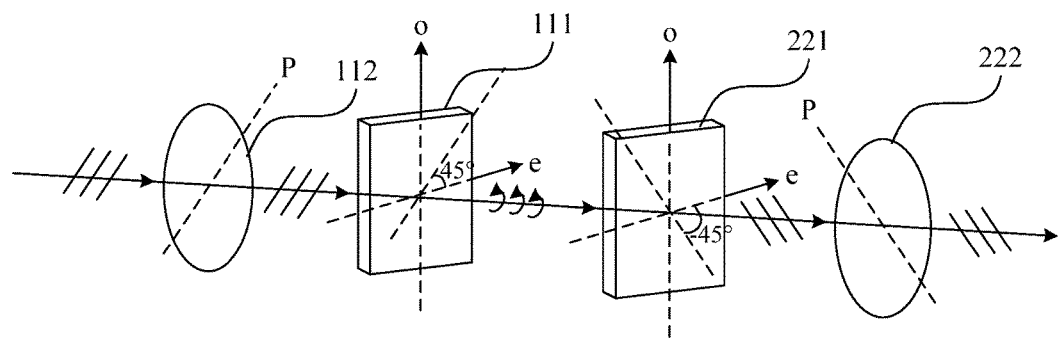
FIG. 16B illustrates an optical path diagram of light emitted from an exemplary backlight source after being reflected by a touch object according to the disclosed embodiments.

FIG. 16B illustrates an optical path diagram of light emitted from an exemplary backlight source after being reflected by a touch object according to the present disclosure. Referring to FIG. 16B, after being reflected by the touch object, the linearly polarized light may become a fingerprint signal light, and the polarization direction may remain unchanged. However, facing toward the transmission direction of the fingerprint signal light and assuming the counterclockwise direction is the positive direction, the fingerprint signal light may be a linearly polarized light having a polarization direction in the first and third quadrants. After passing through the third linear polarizer layer 112 again, the polarization state and the intensity of the fingerprint signal light may remain unchanged. After passing through the first quarter wave plate 111, the fingerprint signal light may be changed into a left circularly polarized light with the intensity unchanged. After passing through the second quarter wave plate 221, the left circularly polarized light may be changed into a linearly polarized light having a polarization direction in the second and fourth quadrants, and the intensity may remain unchanged. Finally, after passing through the fourth linear polarizer layer 222 that has a polarization direction parallel with the polarization direction of the linearly polarized light, the intensity of the linearly polarized light may remain unchanged.

Figure 17A:
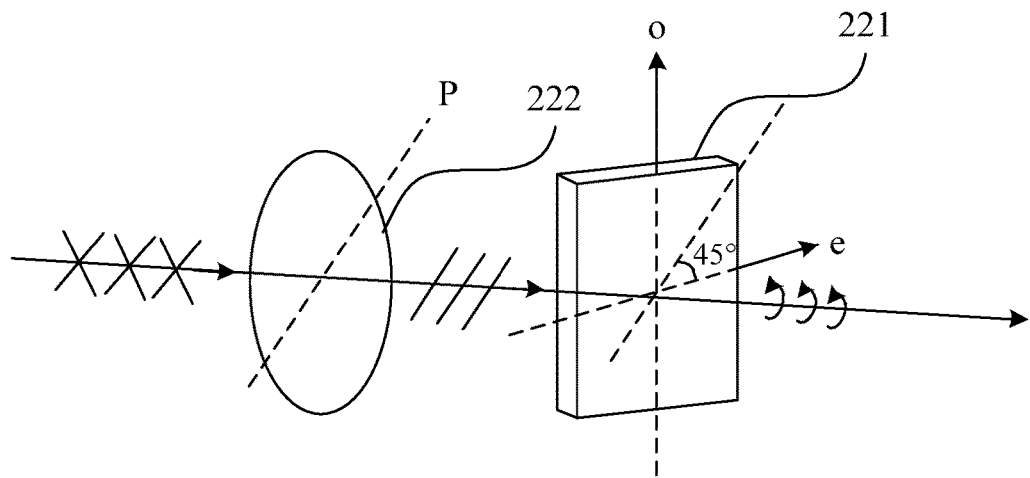
FIG. 17A illustrates an optical path diagram of light emitted from an exemplary backlight source before being reflected by metals according to the disclosed embodiments.

With respect to the fingerprint noise light that is formed when the light emitted from the backlight source is reflected by the metals, FIG. 17A illustrates an optical path diagram of light emitted from an exemplary backlight source before being reflected by metals according to the present disclosure. Referring to FIG. 17A, after passing through the fourth linear polarizer layer 222, the natural light emitted from the backlight source 3 may be changed into a linearly polarized light having a polarization direction in the first and third quadrants. After passing through the second quarter wave plate 221, the linearly polarized light may be changed into a left circularly polarized light. After being reflected by the metals, the left circularly polarized light may be changed into a right circularly polarized light.

Figure 17B:
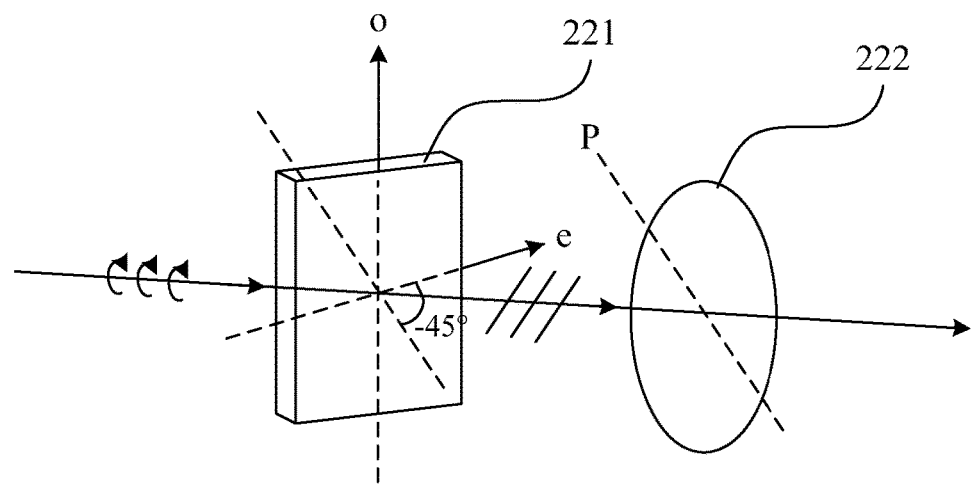
FIG. 17B illustrates an optical path diagram of light emitted from an exemplary backlight source after being reflected by metals according to the disclosed embodiments.

FIG. 17B illustrates an optical path diagram of light emitted from an exemplary backlight source after being reflected by metals according to the present disclosure. Referring to FIG. 17B, after passing through the second quarter wave plate 221, the right circularly polarized light may be changed into a linearly polarized light having a polarization direction in the first and third quadrants, and perpendicular to the polarization direction of the fourth linear polarizer layer 222. As a result, the fingerprint noise light may not pass through the fourth linear polarizer layer 222 to reach the fingerprint recognition unit. Thus, the second polarizer layer may completely eliminate the fingerprint noise light reflected by the metals in the display module to increase the signal-to-noise ratio.

In one embodiment, the display panel according to the present disclosure may be a flexible display panel. Specifically, as shown in FIG. 15, the first substrate 10 may be a glass substrate. The display module 1 may also include a second glass substrate 13. The organic light emitting layer 12 may be disposed between the first glass substrate 10 and the second glass substrate 13. The first glass substrate 10 and the second glass substrate 13 may be supported by spacers 15. An air gap may exist between the first glass substrate 10 and the second glass substrate 13. In one embodiment, the air gap may have a thickness of about 4 μm. The display panel may also include a cover 14. The cover 14 may be bonded to a surface of the first polarizer layer 11 facing away from the organic light emitting layer by a liquid optical adhesive. In one embodiment, the display module may have a thickness of about 1410 μm.

In one embodiment, the fingerprint recognition module 2 may also include a second substrate 20. The fingerprint recognition layer 21 may be configured on a surface of the second substrate 20 adjacent to the display module 1. The backlight source 3 may be configured on a surface of the second substrate 20 facing away from the display module 1. Thus, the fingerprint recognition layer 21 may be directly formed on the second substrate 20. The configuration may not only be convenient for forming the fingerprint recognition layer 21, but also serve as a protection mechanism to the fingerprint recognition layer 21 by the second substrate 20. In addition, the second polarizer layer 22 may be bonded to the first substrate by an optical adhesive (not shown) to combine the display module 1 and the fingerprint recognition module 2 together to form the display panel.

Figure 18:
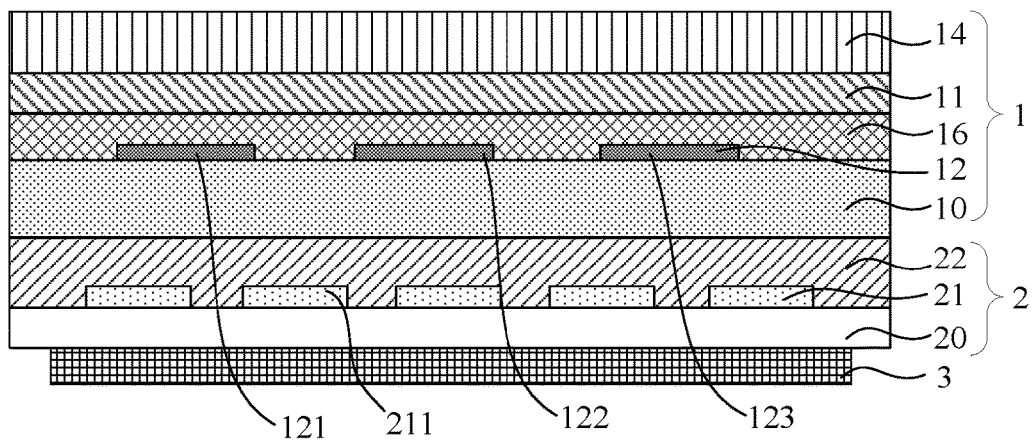
FIG. 18 illustrates a cross-sectional view of another exemplary display panel according to the disclosed embodiments.

FIG. 18 illustrates a cross-sectional view of another exemplary display panel according to the present disclosure. As compared to the display panel in FIG. 15, the display panel according to the present disclosure may be flexible display panel. Specifically, as shown in FIG. 18, the first substrate 10 may be a flexible substrate. The display module 1 may include a thin film encapsulation layer 16 instead of the second glass substrate as shown in FIG. 15. The thin film encapsulation layer 16 may cover the organic light emitting layer 12.

The optical axis directions of the quarter wave plates and the polarization directions of the linear polarizer layers as shown in FIG. 12A, FIG. 16A, and FIG. 16B may be intended for illustrative purposes. No particular relationship between the optical axis direction of the first quarter wave plate and the optical axis direction of the second quarter wave plate and no particular relationship between the polarization direction of the third linear polarizer layer and the polarization direction of the fourth linear polarizer layer may exist as long as the conditions described in the embodiments of the present disclosure are met for the angle between the optical axis direction of the first quarter wave plate and the polarization direction of the third linear polarizer layer and the angle between the optical axis direction of the second quarter wave plate and the polarization direction of the fourth linear polarizer layer.

In the embodiments of the present disclosure, the fingerprint recognition unit may include a fingerprint sensor. In addition, in order to improve the precision of fingerprint recognition, the present disclosure may also provide a plurality of display panel structures. For illustrative purposes, with respect to multiplexing the organic light emitting layer as the light source for fingerprint recognition, the present disclosure also provides a display panel structure.

Figure 19A:
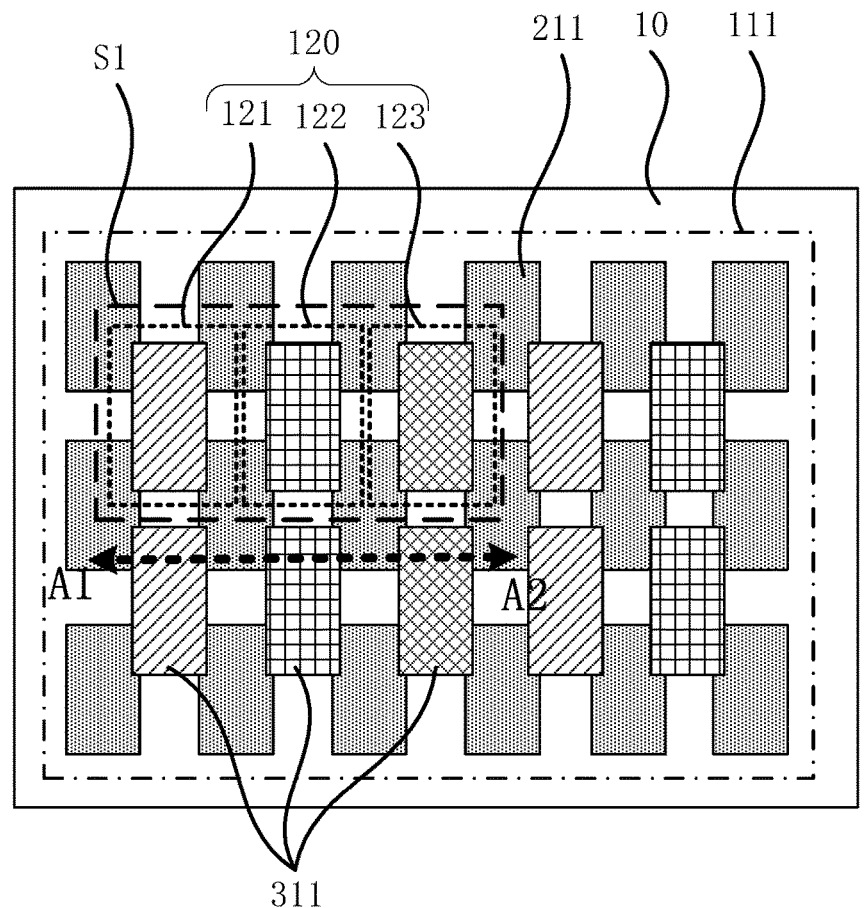
FIG. 19A illustrates a top-down view of another exemplary display panel according to the disclosed embodiments.
Figure 19B:
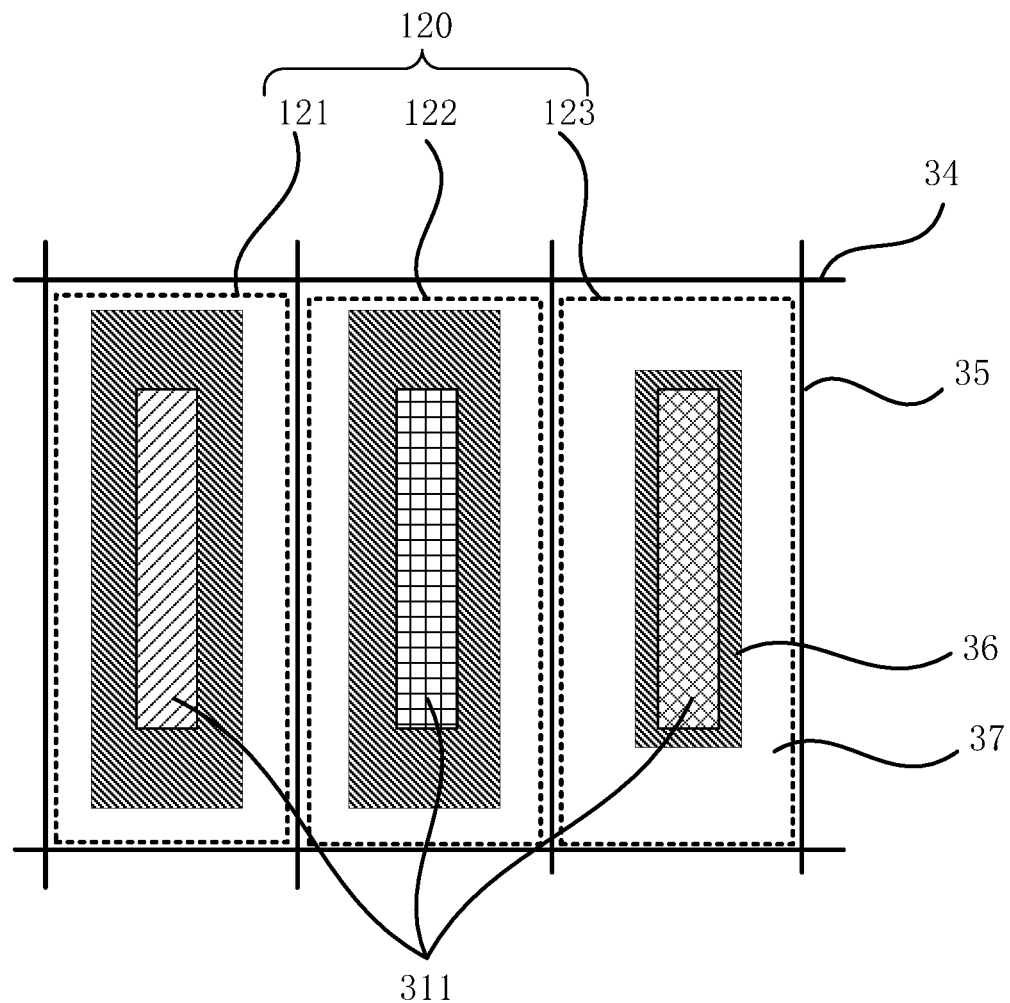
FIG. 19B illustrates an enlarged view of S1 area in FIG. 19A.
Figure 19C:
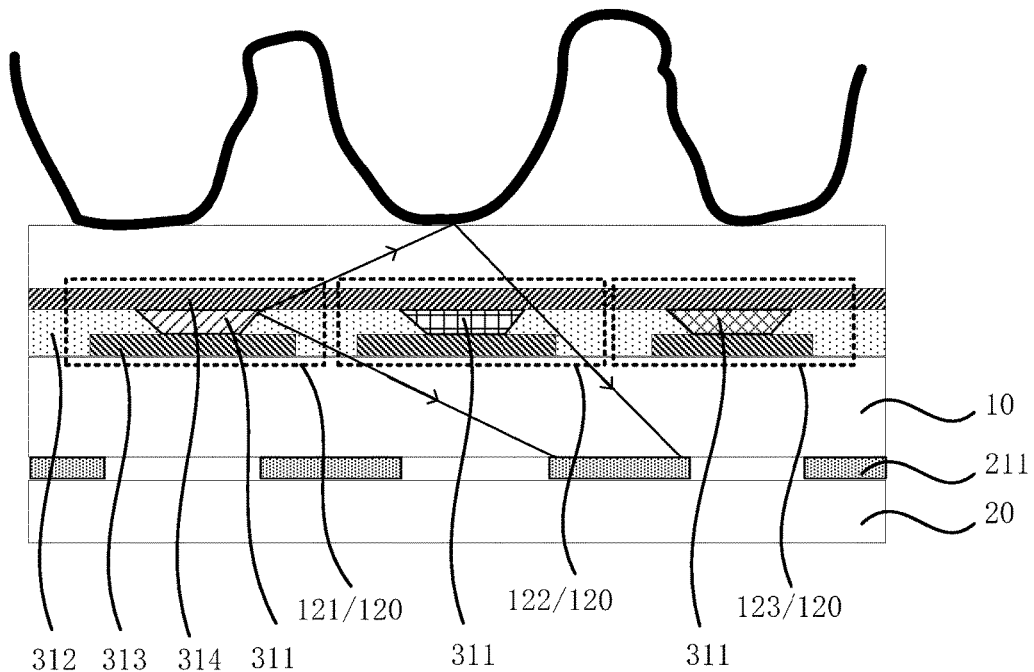
FIG. 19C illustrates a cross-sectional view along the A1-A2 direction in FIG. 19A.

FIG. 19A illustrates a top-down view of another exemplary display panel according to the present disclosure. FIG. 19B illustrates an enlarged view of S1 area in FIG. 19A. FIG. 19C illustrates a cross-sectional view along the A1-A2 direction in FIG. 19A. In one embodiment, referring to FIG. 19A, FIG. 19B, and FIG. 19C, the display panel according to the present disclosure may include a first substrate 10, a plurality of organic light emitting units 120, and at least one fingerprint recognition unit 211. The plurality of the organic light emitting units 120 may be disposed on the first substrate 10. The fingerprint recognition unit 211 may be located in a display region A on a side of the organic light emitting units 120 adjacent to the first substrate 10. The fingerprint recognition unit 211 may be used to recognize fingerprints based on the light that is reflected by the touch object (e.g., the finger) to the fingerprint recognition unit 211.

The organic light emitting units 120 may include a red organic light emitting unit 121, a green light emitting unit 122, and a blue light emitting unit 123. In the fingerprint recognition phase, the red organic light emitting unit 121 or the green light emitting unit 122 or both may emit light as the light source for the fingerprint recognition unit 211. As the light source for the fingerprint recognition unit 211, the red organic light emitting unit 121, the green organic light emitting unit 122, or both may have a light transmittance area of the light emitting side facing away from the display panel smaller than a light transmittance area of the light emitting side of the blue organic light emitting unit 123. No limitation on the number of the organic light emitting units, or the arrangement of the red organic light emitting units, the green organic light emitting units, and the blue organic light emitting units in the organic light emitting units is imposed by the present disclosure. In one embodiment, the first substrate 10 may be an array substrate.

For illustrative purposes, referring to FIG. 19B, and FIG. 19C, each organic light emitting unit 120 may include a second electrode 313, a light emitting function layer 311, and a first electrode 314 sequentially configured in a direction of the organic light emitting unit 120 facing away from the first substrate 10. The organic light emitting unit 120 may include a red organic light emitting unit 121, a green organic light emitting unit 122, and a blue organic light emitting unit 123. The organic light emitting unit 120 may include a light emitting function layer 311. A transparent region 37 and a non-transparent region 36 may be configured on a direction of the light emitting function layer 311 facing away from the light emitting side of the display panel. For the top-emitting type of display panel, the light emitting side of the display panel may be in a direction of the organic light emitting unit 120 facing away from the first substrate 10.

The light emitting function layer 311 may include a first auxiliary function layer, a light emitting material layer, and a second auxiliary function layer. The first auxiliary function layer may be a hole-type auxiliary function layer, and may have a multilayer structure, for example, including one or more of a hole injection layer, a hole transport layer, and a electron barrier layer. The second auxiliary function layer may be an electron-type auxiliary function layer, and may have a multilayer structure, including one or more of an electron transport layer, an electron injection layer, and a hole barrier layer.

Under an external electric field, electrons and holes may be injected into the light emitting material layer of the light emitting function layer 311 from the first electrode 314 and the second electrode 313, respectively, and may be recombined to generate excitons. The excitons may migrate under the external electric field. The energy may be transferred to light emitting molecules in the light emitting material layer, and may excite electrons from a ground state to an excited state. The excited state energy may be released through a radiation transition to emit light. In one embodiment, the second electrode 313 may be an anode, and the first electrode 314 may be a cathode. In other embodiments, the second electrode may be a cathode, and the first electrode may be an anode. No limitation is imposed by the present disclosure.

The display panel according to the present disclosure may include a plurality of organic light emitting units and at least one fingerprint recognition unit disposed on the first substrate. Each organic light emitting unit may include a red organic light emitting unit, a green organic light emitting unit, and a blue organic light emitting unit. In the display phase, the red organic light emitting unit, the green organic light emitting unit, and the blue organic light emitting unit may be pre-configured to emit light. In the fingerprint recognition phase, because the wavelength of the light emitted from the blue organic light emitting unit is short, and the layers (organic insulation layer, inorganic insulation layer, and polarizer layer, etc.) in the display panel may absorb light with a shorter wavelength more, the light emitted from the blue organic light emitting unit may have a low transmittance.

Thus, the red organic light emitting unit, the green organic light emitting unit, or both may emit light to serve as the light source for the fingerprint recognition unit. As the light source for the fingerprint recognition unit, the red organic light emitting unit, the green organic light emitting unit, or both may be configured to have a light transmittance area facing away from the light emitting side of the display panel smaller than a light transmittance area of the blue organic light emitting unit facing away from the light emitting side of the display panel.

Because the organic light emitting unit as the light source has a small light transmittance area, stray light that is not reflected by the touch object (e.g., the finger) and directly irradiates on the fingerprint recognition unit may be reduced. Because only light reflected by the touch object carries fingerprint information, and the light (stray light) that is not reflected by the touch object and directly irradiates on the fingerprint recognition unit does not carry fingerprint information, the embodiments in the present disclosure may reduce the fingerprint detection noise by reducing the stray light, and may improve the precision of fingerprint recognition.

In one embodiment, referring to FIG. 19C, the display panel may also include a second substrate 20. The second substrate 20 may be disposed on a side of the first substrate 10 facing away from the organic light emitting unit 120. The fingerprint recognition unit 211 may be disposed between the first substrate 10 and the second substrate 20. The fingerprint recognition unit 211 and the second substrate 20 may be part of the fingerprint recognition module. The fingerprint recognition module may also include some metal connection lines and IC driver circuit (not shown).

In one embodiment, referring to FIG. 19B and FIG. 19C, each organic light emitting unit 120 may include a second electrode 313, a light emitting function layer 311, and a first electrode 314 sequentially configured in a direction of the organic light emitting unit 120 facing away from the first substrate 10. The second electrode 313 may be a reflective electrode. For example, the reflective electrode may include an indium tin oxide conductive layer, a reflective electrode layer (Ag), and an indium tin oxide conductive layer, which are formed in this order. The indium tin oxide conductive film may be made of high work function material suitable for hole injection. The light emitting function layer 311 of the red organic light emitting unit 121, the light emitting function layer 311 of the green organic light emitting unit 122, and the light emitting function layer 311 of the blue organic light emitting unit 123 may be separated by a pixel-defining layer 312 in between.

In one embodiment, as shown in FIG. 19B and FIG. 19C, the red organic light emitting unit 121 and the green organic light emitting unit 122 may both serve as the light source for fingerprint recognition. The area of each second electrode 313 of the red organic light emitting unit 121 and the green organic light emitting unit 122 may be greater than the area of the second electrode 313 of the blue organic light emitting unit 123. Because the light emitted from the light emitting function layer 311 in the organic light emitting unit 120 toward the side of the first substrate 10 can be blocked by the second electrode 313 disposed between the light emitting function layer 311 and the fingerprint recognition unit 211, and the reflective electrodes of the red organic light emitting unit 121 and the green organic light emitting unit 122 serving as the light source for the fingerprint recognition unit 211 extend beyond the boundary often seen in the existing technology, stray light that would irradiate on the fingerprint recognition unit 211 may be blocked, and the precision of fingerprint recognition may be improved. In other words, the area of the reflective electrode of the blue organic light emitting unit 123 may remain unchanged while the area of each reflective electrode of the red organic light unit 121 and the green organic light emitting unit 123 may be extended beyond the boundary often seen in the existing technology to block stray light.

In addition, the reflective electrode may often be adjacent to or in contact with the light emitting function layer. The light emitted from the light emitting function layer toward the first substrate side may be close to the boundary of the reflective electrode. Thus, extending the boundary of the reflective electrode to a certain degree may block the light emitted from the light emitting function layer from directly irradiating on the fingerprint recognition unit. When the boundary of the reflective electrode is extended to a certain degree, stray light that would irradiate on the fingerprint recognition unit may be completely blocked. Thus, the precision of fingerprint recognition may be substantially improved.

In one embodiment, referring to FIG. 19B and FIG. 19C, a ratio of the area of the second electrode 313 in the organic light emitting unit 120 serving as the light source for the fingerprint recognition unit over the area of the light emitting function layer 311 may be in a range approximately of 1.2~6. A ratio of the area of the second electrode 313 in the organic light emitting unit 120 not serving as the light source for the fingerprint recognition unit over the area of the light emitting function layer 311 may be in a range approximately of 1~1.2.

For illustrative purposes, referring to FIG. 19B and FIG. 19C, the red organic light emitting unit 121 and the green organic light emitting unit 122 may serve as the light source for the fingerprint recognition unit. The non-transparent region 36 in FIG. 19B may be the same as an orthogonal projection of the second electrode 313 in the organic light emitting unit 120 on the first substrate 10. A ratio of the area of each non-transparent region 36 (the area of the second electrode) in the red organic light emitting unit 121 and the green organic light emitting unit 122 over the area of the light emitting function layer 311 may be relatively greater than a ratio of the area of the non-transparent area 36 in the blue organic light emitting unit 123 over the area of the area of the light emitting function layer 311. When the ratio of the area of the second electrode in the organic light emitting unit over the area of the light emitting function layer is in a range approximately of 1.2~6, the second electrode may effectively block the light emitted from the light emitting function layer from directly irradiating on the fingerprint recognition unit. That is, stray light may be effectively blocked, fingerprint detection noise may be reduced, and the precision of fingerprint recognition may be improved.

The greater the ratio of the area of the second electrode in the organic light emitting unit serving as the light source for the fingerprint recognition unit over the area of the light emitting function layer is, the more effectively the second electrode may block stray light. When the ratio of the area of the second electrode in the organic light emitting unit serving as the light source for the fingerprint recognition unit over the area of the light emitting function layer is about 6, the second electrode may completely block stray light, and may substantially improve the precision of fingerprint recognition.

Figure 19D:
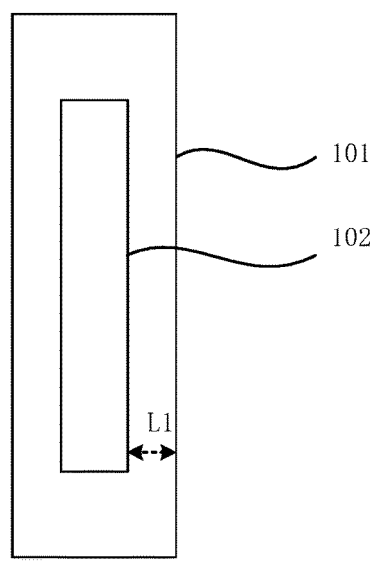
FIG. 19D illustrates a schematic view of distance range between an exemplary first closed loop and an exemplary second closed loop according to the disclosed embodiments.

In one embodiment, referring to FIG. 19C and FIG. 19D, an orthogonal projection of the boundary of the second electrode 313 in the organic light emitting unit 120 serving as the light source for the fingerprint recognition unit 211 on the first substrate 10 may form a first closed loop 101. An orthogonal projection of the boundary of the light emitting function layer 311 on the first substrate 10 may forma second closed loop 102. FIG. 19D illustrates a schematic view of distance range between an exemplary first closed loop and an exemplary second closed loop according to the present disclosure. Referring to FIG. 19D, the first closed loop 101 may surround the second closed loop 102. Any point on the first close loop 101 may correspond to a point on the second close loop 102 to make a distance between the two points a shortest distance L1. The distance range between the first closed loop 101 and the second closed loop 102 may be a set of the shortest distances L1 corresponding to all points on the first closed loop 101. The distance range between the first close loop 101 and the second closed loop 102 may be approximately 3 μm~30 μm. The distance range between the first closed loop 101 and the second closed loop 102 may represent the degree of extension the second electrode extends in any direction in the plane where the second electrode is located. When the distance range between the first close loop 101 and the second closed loop 102 is approximately 3 μm~30 μm, the second electrode may effectively block stray light, and may improve the precision of fingerprint recognition.

Figure 19E:
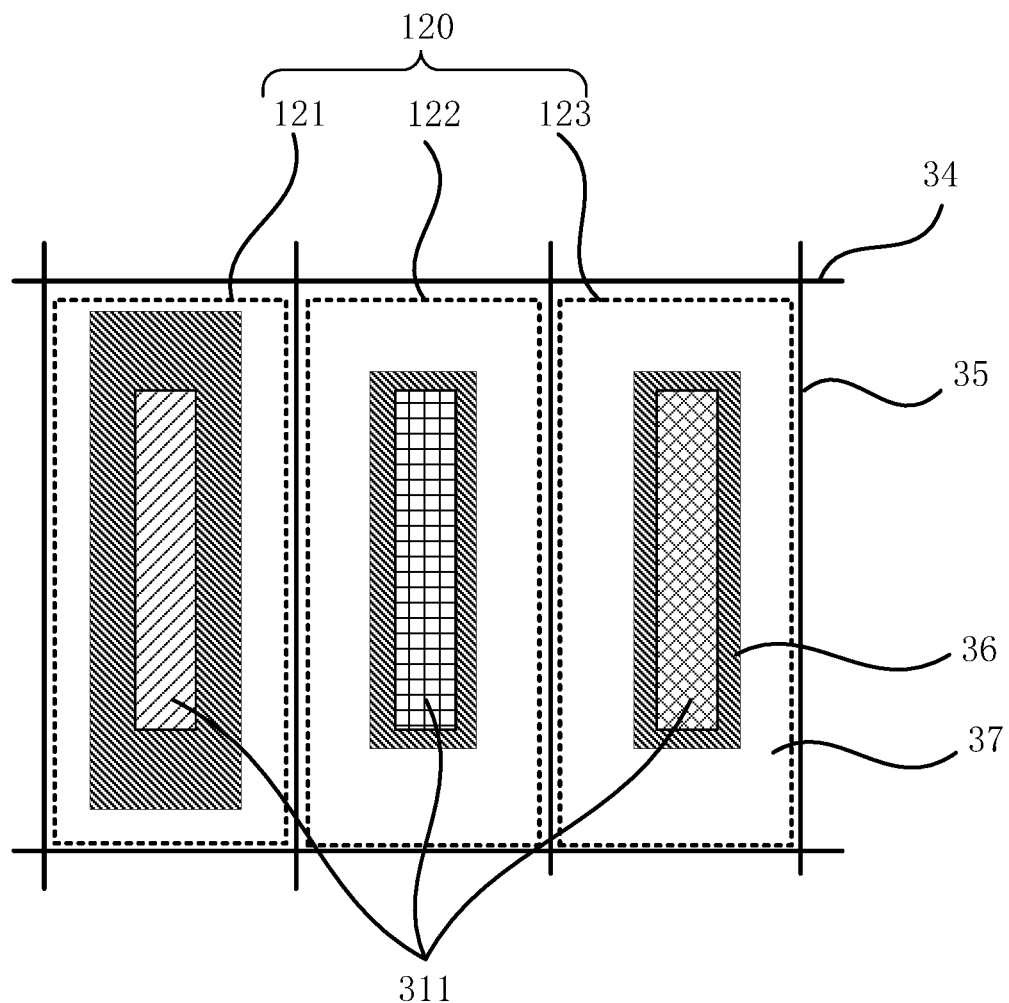
FIG. 19E illustrates another enlarged view of S1 area in FIG. 19A.

FIG. 19E illustrates another enlarged view of S1 area in FIG. 19A. Referring to FIG. 19E, the light transmittance area of the red organic light emitting unit 121 serving as the light source for the fingerprint recognition unit facing away from the light emitting side of the display panel may be smaller than the light transmittance area of the blue organic light emitting unit 123 facing away from the light emitting side of the display panel. The light transmittance area of the red organic light emitting unit 121 serving as the light source for the fingerprint recognition unit facing away from the light emitting side of the display panel may be smaller than the light transmittance area of the green organic light emitting unit 122 facing away from the light emitting side of the display panel.

Because only the red organic light emitting unit 121 serves as the light source for the fingerprint recognition unit, only the light emitted from the light emitting function layer 311 in the red organic light emitting unit 121 toward a direction facing away from the light emitting side of the display panel may need to be blocked. For example, only the second electrode in the red organic light emitting unit 121 may need to be extended. The green organic light emitting unit 122 and the blue organic light emitting unit 123 may not need any additional design modification. The light transmittance area of the green organic light emitting unit 122 and the blue organic light emitting unit 123 may be larger than the light transmittance area of the red organic light emitting unit 121. Thus, the configuration may not only ensure the precision of fingerprint recognition, but also ensure the light transmittance area is sufficient to let the fingerprint signal light reflected by the touch object (e.g., the finger) pass through in order to increase the intensity of the fingerprint signal light detected by the fingerprint recognition unit.

In addition, in one embodiment, the operating voltage of the red organic light emitting unit 121 may be increased properly to increase the intensity of the light emitted from the light source and subsequently to increase the intensity of the fingerprint signal light detected by the fingerprint recognition unit. In another embodiment, the green organic light emitting unit 122 may be configured as the light source for the fingerprint recognition unit. The light transmittance area of the green organic light emitting unit in a direction facing away from the light emitting side of the display panel may be smaller than the light transmittance area of the blue organic light emitting unit in a direction facing away from the light emitting side of the display panel. The light transmittance area of the green organic light emitting unit in a direction facing away from the light emitting side of the display panel may be smaller than the light transmittance area of the red organic light emitting unit in a direction facing away from the light emitting side of the display panel.

Figure 20:
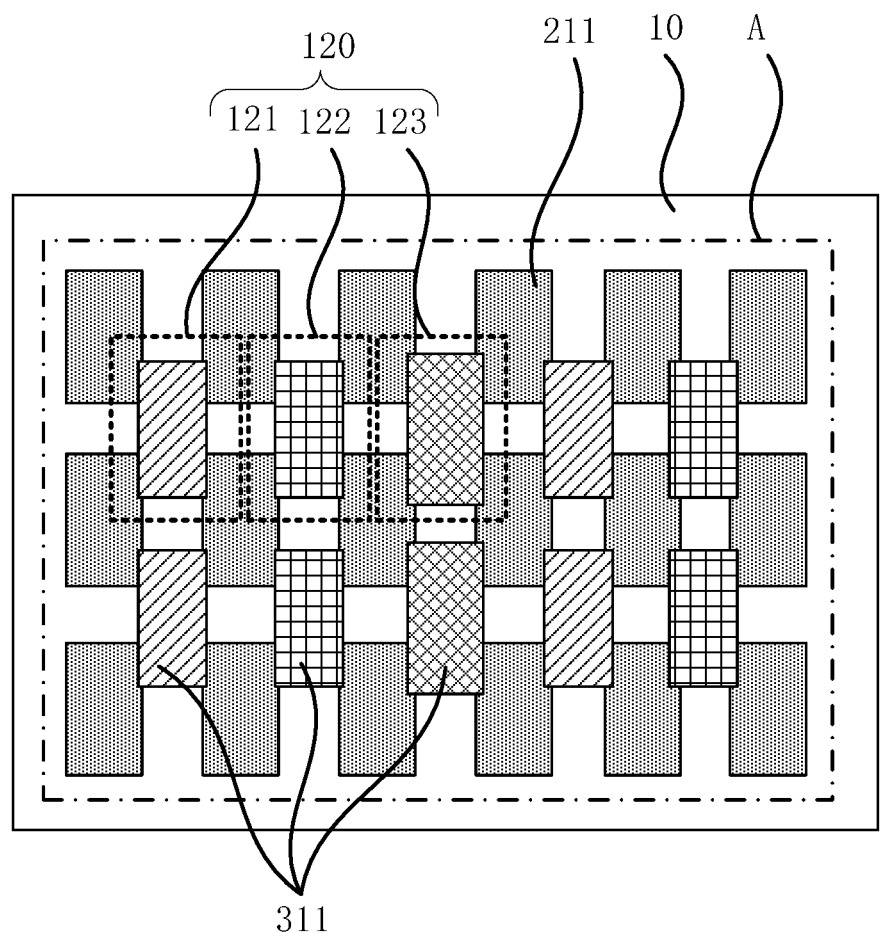
FIG. 20 illustrates a top-down view of another exemplary display panel according to the disclosed embodiments.

FIG. 20 illustrates a top-down view of another exemplary display panel according to the present disclosure. In one embodiment, as shown in FIG. 20, the area of the light emitting function layer in the blue organic light emitting unit 123 may be larger than the area of the light emitting function layer in the red organic light emitting unit 121, and the area of the light emitting function layer in the blue organic light emitting unit 123 may be larger than the area of the light emitting function layer in the green organic light emitting unit 122. Because the lifespan of the material of the light emitting function layer in the blue organic light emitting unit is shorter than the lifespan of the material of the light emitting function layer in the red organic light emitting unit and the green organic light emitting unit, the area of the light emitting function layer in the blue organic light emitting unit may be enlarged to lower the operation voltage for the light emitting function layer in the blue organic light emitting unit.

For illustrative purposes, in one embodiment, the operation voltage for the light emitting function layer in the red organic light emitting unit and the green organic light emitting unit may be about 3V, and the operation voltage for the blue organic light emitting unit may be about 2V to extend the operation lifespan. Thus, the lifespan of the red organic light emitting unit, the green organic light emitting unit, and the blue organic light emitting unit may be balanced, and the overall operation lifespan of the display panel may be extended.

Figure 21:
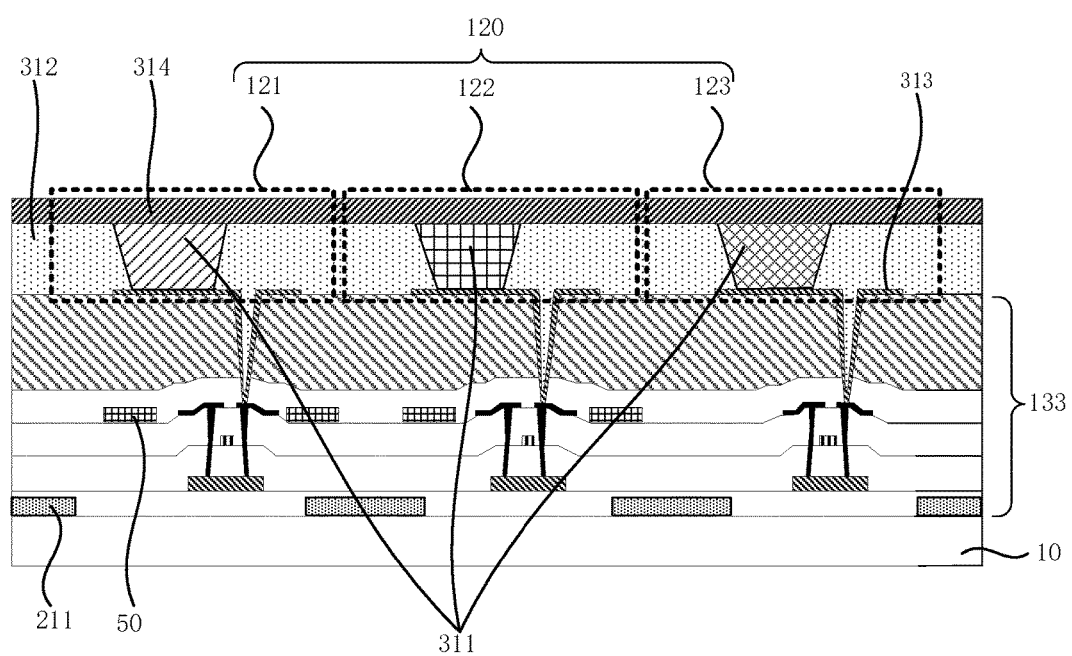
FIG. 21 illustrates a cross-sectional view of another exemplary display panel according to the disclosed embodiments.

FIG. 21 illustrates a cross-sectional view of another exemplary display panel according to the present disclosure. In one embodiment, referring to FIG. 21, the display panel may include a plurality of light shielding pads 50. The light shielding pads 50 may be disposed between the organic light emitting units 120 and the fingerprint recognition units 211. Each organic light emitting unit 120 may include a second electrode 313, a light emitting function layer 311, and a first electrode 314 sequentially configured in a direction of the organic light emitting unit 120 facing away from the first substrate 10. The second electrode 313 may be a reflective electrode.

The area of the combined orthogonal projections on the first substrate 10 of the second electrode 313 in the organic light emitting unit 120 that serves as the light source for the fingerprint recognition unit 211 and the light shielding pad 50 may be larger than the area of the orthogonal projection on the first substrate 10 of the second electrode 313 in the organic light emitting unit 120 that does not serve as the light source for the fingerprint recognition unit 211. The combined orthogonal projections on the first substrate 10 of the second electrode 313 and the light shielding pad 50 may be the orthogonal projection on the first substrate 10 of the second electrode 313 combined with the orthogonal projection on the first substrate 10 of the light shielding pad 50. Specifically, when X and Y are sets, the union of X and Y is the set of all elements in X, all elements in Y, and no other element.

In one embodiment, referring to FIG. 21, the orthogonal projection of the boundary of the second electrode 313 in the organic light emitting unit 120 may fall within the orthogonal projection of the light shielding pad 50 on the first substrate 10. The effect of the configuration may be equivalent to extending the reflective electrode. In other words, the area of the reflective electrode in the blue organic light emitting unit 123 may remain unchanged, the area of the reflective electrode in the red organic light emitting unit 121, the green organic light emitting unit 122, or both may be extended beyond the existing technology to block stray light. In the embodiments of the present disclosure, stray light may be effectively prevented from irradiating on the fingerprint recognition unit 211.

In one embodiment, referring to FIG. 21, the display panel may include a first substrate 10, and a plurality of pixel driver circuits 133. The pixel driver circuits 133 may include data lines, scanning lines, and capacitor metal plates. The light shielding pads 50 may be configured coplanar with the data lines, the scanning lines, or the capacitor metal plates to simplify the fabrication process. The display panel may not need to add an additional metal layer to form the light shielding pads 50. Thus, the fabrication efficiency may be increased, and the production cost may be reduced.

The light shielding pads may be made of metallic material or non-metallic material that shields light. In the embodiments of the present disclosure, the light shielding pads may be configured to prevent stray light from irradiating on the fingerprint recognition unit such that the precision of fingerprint recognition may be improved. The technical solutions in the embodiments of the present disclosure may be combined with each other to improve the precision of fingerprint recognition. For example, the reflective electrode in the organic light emitting unit that serves as the light source may be extended, and at the same time, the pixel driver circuit may be configured to block a portion of stray light. In another example, the reflective electrode in the organic light emitting unit that serves as the light source may be extended, and at the same time, the light shielding pad may be configured to block a portion of stray light. In another example, the light shielding pad may be configured to block a portion of stray light, and at the same time, the pixel driver circuit may be configured to block a portion of stray light. In another example, the reflective electrode in the organic light emitting unit that serves as the light source may be extended, the pixel driver circuit may be configured to block a portion of stray light, and at the same time the light shielding pad may be configured to block a portion of stray light.

In addition, when the external backlight source serves as the light source for the fingerprint recognition unit, the present disclosure provides another structure of the display panel.

Figure 22A:
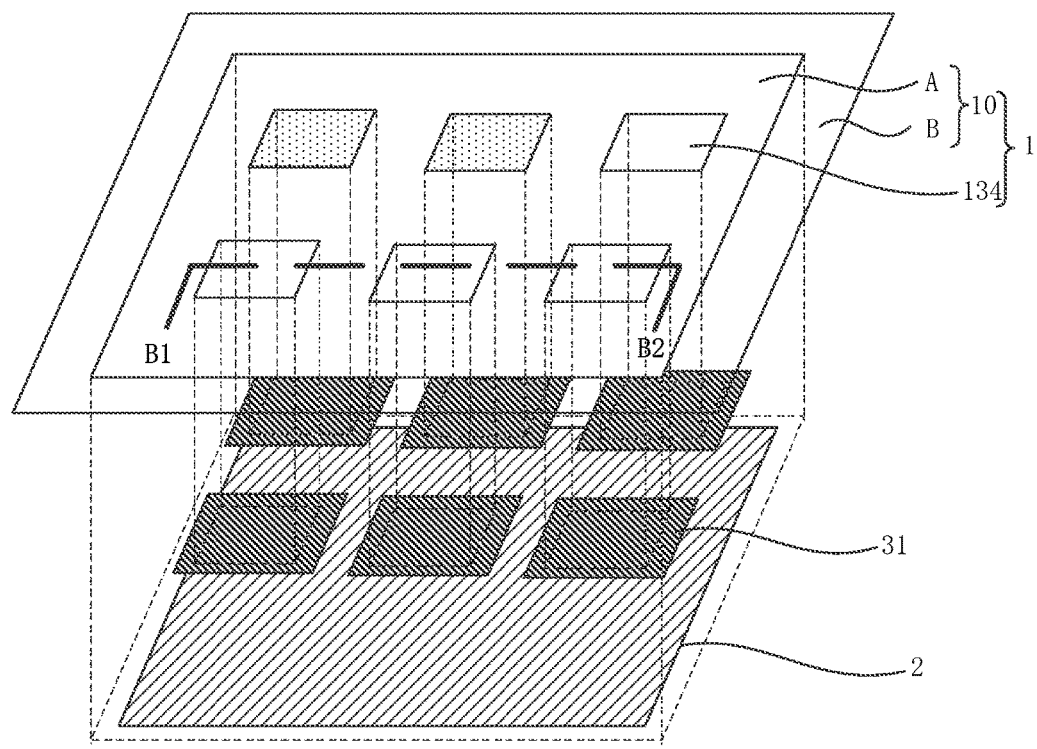
FIG. 22A illustrates a three dimensional view of another exemplary display panel according to the disclosed embodiments.
Figure 22B:
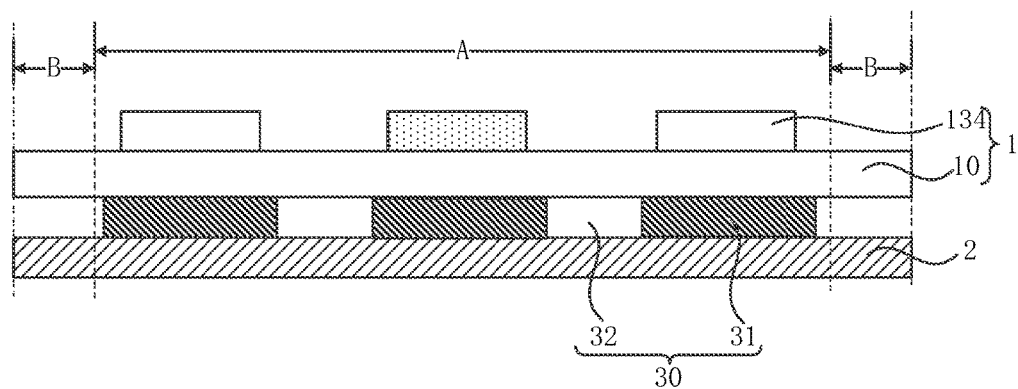
FIG. 22B illustrates a cross-sectional view along the B1-B2 direction in FIG. 22A.

FIG. 22A illustrates a three dimensional view of another exemplary display panel according to the present disclosure. FIG. 22B illustrates a cross-sectional view along the B1-B2 direction in FIG. 22A. Referring to FIG. 22A and FIG. 22B, the display panel may include a display module 1, a fingerprint recognition module 2, and at least a layer of black matrix 30. The display module 1 may include a first substrate 10, and a plurality of pixel circuits 134. The first substrate 10 may include a display region A, and a non-display region surrounding the display region A. The plurality of the pixel circuits 134 may be located in the display region A of the first substrate 10. Each pixel circuit 134 may include a plurality of thin-film-transistors (not shown in FIG. 22A and FIG. 22B). Each thin-film-transistor may include a gate electrode, a source electrode, and a drain electrode.

The fingerprint recognition module 2 may be formed in the display region A on a side of the first substrate 10 facing away from the thin-film-transistor (included in the pixel circuit 134). The black matrix 30 may be disposed between the thin-film-transistor (included in the pixel circuit 134) and the fingerprint recognition module 2. Each section of the black matrix 30 may include a light shielding region 31, and an opening region 32 located between two adjacent light shielding regions 31. The orthogonal projections of the gate electrode, the source electrode, and the drain electrode of the thin-film-transistor (included in the pixel circuit 134) on the first substrate 10 may fall within the orthogonal projection of the light shielding region 31 on the first substrate 10.

In the embodiments of the present disclosure, a black matrix may be configured between the thin-film-transistors and the fingerprint recognition module. Each black matrix section may include a light shielding region and an opening region between adjacent light shielding regions. Orthogonal projections of the gate electrode, the source electrode, and the drain electrode of the thin-film-transistor on the first substrate may fall within an orthogonal projection of the light shielding region on the first substrate. The light shielding region of the black matrix may be used to block the light emitted from the fingerprint recognition module, reduce the light that is formed when the light emitted from the fingerprint recognition module is reflected by the gate electrode, the source electrode, and the drain electrode of the thin-film-transistor, reduce the possibility of the light reflected by the gate electrode, the source electrode, and the drain electrode of the thin-film-transistor irradiating on the fingerprint recognition module, and thus reduce the noise that is formed when a portion of the reflected light irradiates on the fingerprint recognition module.

In addition, the opening regions may be configured on the black matrix. The opening regions may allow the emitted from the fingerprint recognition module to pass through, irradiate on the finger that is pressed on the display panel by the user, and allow the light reflected by the fingerprint of the finger to pass through the opening regions. The configuration may increase the signal-to-noise ratio, and improve the precision of fingerprint recognition by the fingerprint recognition module.

In certain embodiments, the light shielding region 31 of the black matrix may be made of a black metal, a black organic material, or a material doped with a black pigment. Because of the desired light absorption characteristic of these black materials, the light that is emitted from the fingerprint recognition module 2, and irradiates on the light shielding regions 31 of the black matrix 30 may be absorbed to reduce the possibility of the light reflected by the gate electrode, the source electrode, and the drain electrode of the thin-film-transistor irradiating on the fingerprint recognition module 2, and to improve the precision of fingerprint recognition by the fingerprint recognition module 2. In one embodiment, the light shield regions of the black matrix 30 may be made of chromium.

Figure 23:
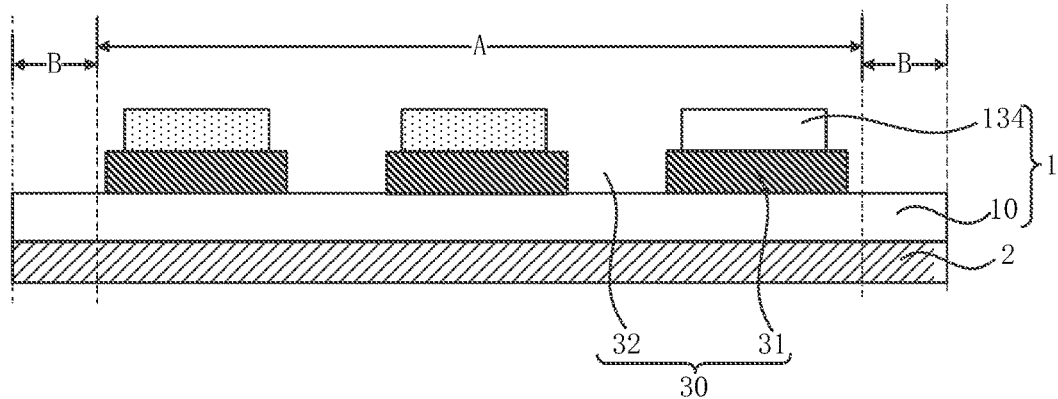
FIG. 23 illustrates a cross-sectional view of another exemplary display panel according to the disclosed embodiments.
Figure 24:
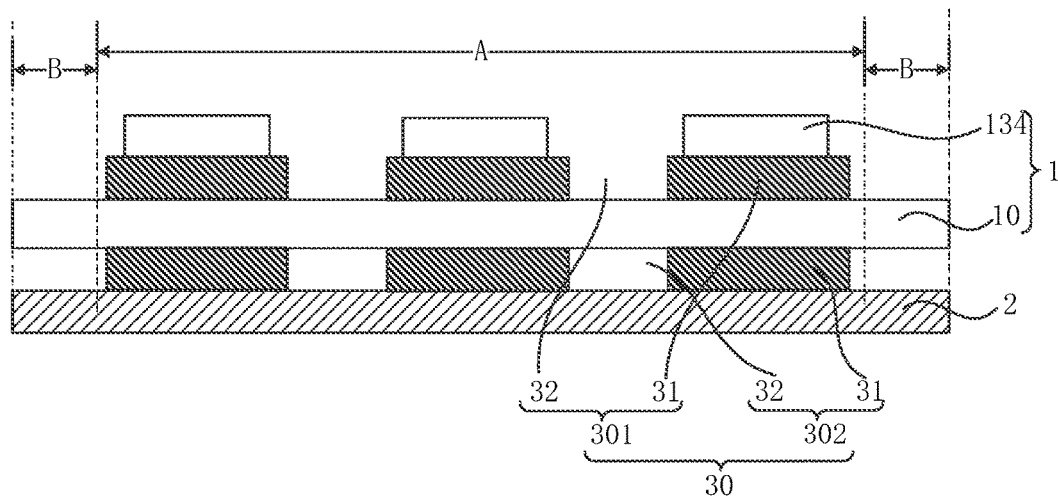
FIG. 24 illustrates a cross-sectional view of another exemplary display panel according to the disclosed embodiments.

As shown in FIG. 22B, the black matrix 30 may be configured between the first substrate 10 and the fingerprint recognition module 2. This is only for illustrative purposes. No limitation on the location of the black matrix is imposed by the present disclosure. In one embodiment, as shown in FIG. 23, the black matrix may be configured between the thin-film-transistors (included in the pixel circuits 134) and the first substrate 10. In another embodiment, as shown in FIG. 24, the display panel may include two layers of the black matrix 30. A first layer of the black matrix 301 may be configured between the thin-film-transistors (included in the pixel circuit 134) and the first substrate 10, and a second layer of the black matrix 302 may be configured between the first substrate 10 and the fingerprint recognition module 2.

In the fabrication process, depending on the market requirement, the first substrate 10 may be a rigid substrate. For example, the first substrate 10 may be made of quartz or glass. Alternatively, the first substrate 10 may be a flexible substrate. For example, the first substrate 10 may be made of polyimide. Typical structures of the display panel are described in detail below. However, the examples set forth are merely for illustrative purposes, and are not intended to limit the present disclosure.

Figure 25:
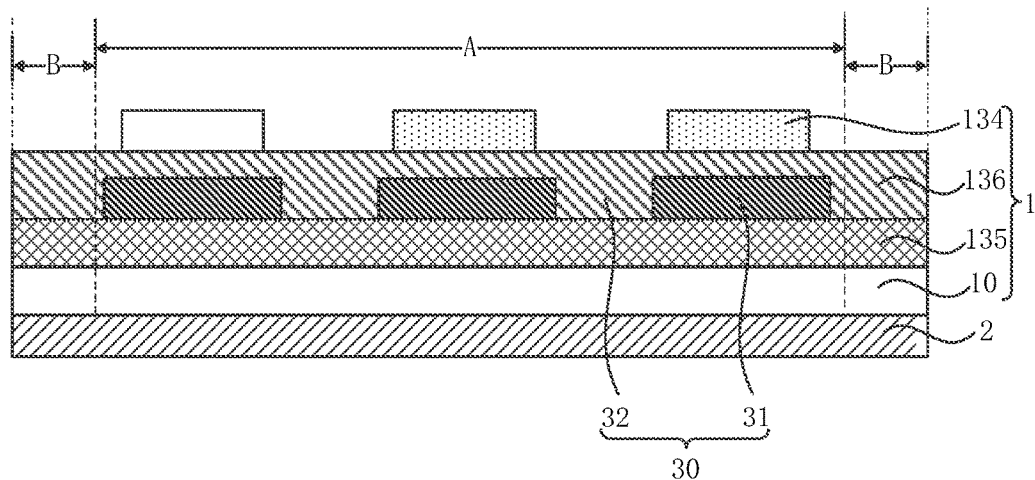
FIG. 25 illustrates a cross-sectional view of another exemplary display panel according to the disclosed embodiments.

FIG. 25 illustrates a cross-sectional view of another exemplary display panel according to the present disclosure. Specifically, referring to FIG. 25, the display panel may include a first substrate 10. The first substrate 10 may be a rigid substrate. The black matrix 30 may be configured between the thin-film-transistors (included in the pixel circuit 134) and the first substrate 10. The display panel may also include a first planarization layer 135 and a second planarization layer 136. The first planarization layer 135 may be configured on a side of the first substrate 10 adjacent to the black matrix 30. The second planarization layer 136 may be configured on a side of the black matrix 30 adjacent to the thin-film-transistors (included in the pixel circuit 134). The second planarization layer 136 may cover the light shielding regions 31 of the black matrix 30, and may fill the opening regions 32 of the black matrix 30.

The first substrate 10 may be made of quartz or glass. The first substrate 10 may be used to provide support in the subsequent fabrication process of forming the pixel circuit 134, and light emitting units, etc.

In practice, due to the limitation of the polishing accuracy and the cleanness of the surface of the first substrate 10, minor defects may exist on the surface of the first substrate 10. The first planarization layer 135 may be configured to fill the minor defects on the surface of the first substrate 10, thus achieving the purpose of flattening the surface of the first substrate 10.

In the fabrication process of the black matrix 30, a film may only be deposited in the positions on the first substrate 10, intended for the light shielding regions of the black matrix 30, and no film may be deposited in the positions on the first substrate 10, intended for the opening regions 32 of the black matrix 30. After the black matrix is formed, a thickness difference may exist between the light shielding regions 31 and the opening regions 32 of the black matrix 30. In the subsequent fabrication process, certain portion of the pertaining layers of the pixel circuit 134 may dip into the opening region 32 of the black matrix 30, which causes certain components of the pixel circuit 134 to shift near the opening region 32 of the black matrix 30. Thus, the pixel circuit 134 may suffer from defects such as short circuit or open circuit, and the display effect of the display panel may be affected.

In one embodiment, the second planarization layer 136 may be configured on a side of the black matrix 30 may be configured on a side of the black matrix 30 adjacent to the thin-film-transistors (included in the pixel circuit 134). The second planarization layer 136 may cover the light shielding regions 31 of the black matrix 30 and may fill the opening regions 32 of the black matrix 30 such that the difference in thickness between the light shielding regions 31 of the black matrix 30 and the opening regions 32 of the black matrix 30 may be eliminated, the defects due to the shift of certain components in the pixel circuit 134 in the subsequent fabrication process may be prevented, the production yield of the display panel may be improved. In one embodiment, the second polarization layer 136 may be configured only in the opening regions 32 of the black matrix 30.

In the actual fabrication process, the first planarization layer 135 and the second planarization layer 136 may be made of any insulation material. Because polyimide has stable physical and chemical properties, desired electrical insulation, fabrication process simplicity, and is low cost, in one embodiment, the first planarization layer 135 and the second planarization layer 136 may be made of polyimide.

Figure 26:
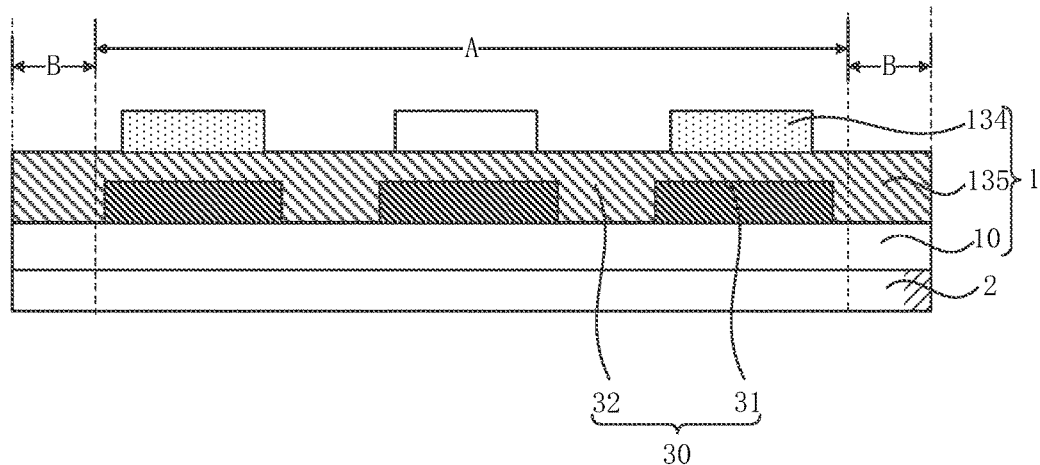
FIG. 26 illustrates a cross-sectional view of another exemplary display panel according to the disclosed embodiments.

FIG. 26 illustrates a cross-sectional view of another exemplary display panel according to the present disclosure. Specifically, referring to FIG. 26, the display panel may include a first substrate 10. The first substrate 10 may be a flexible substrate. The black matrix 30 may be configured between the thin-film-transistors (included in the pixel circuit 134) and the first substrate 10. The display panel may also include a first planarization layer 135. The first planarization layer 135 may be configured on a side of the black matrix 30 adjacent to the thin-film-transistors (included in the pixel circuit 134). The first planarization layer 135 may cover the light shielding regions 31 of the black matrix 30 and may fill the opening regions 32 of the black matrix 30.

Similarly, in one embodiment, the first planarization layer 135 may be configured on a side of the black matrix 30 adjacent to the thin-film-transistors (included in the pixel circuit 134). The first planarization layer 135 may cover the light shielding regions 31 of the black matrix 30 and may fill the opening regions 32 of the black matrix 30 such that the difference in thickness between the light shielding regions 31 of the black matrix 30 and the opening regions 32 of the black matrix 30 may be eliminated, the defects due to the shift of certain components in the pixel circuit 134 in the subsequent fabrication process may be prevented, the production yield of the display panel may be improved. In one embodiment, the first polarization layer 135 may be configured only in the opening regions 32 of the black matrix 30.

In the actual fabrication process, the first substrate 10 and the first planarization layer 135 may be made of any insulation material. Because polyimide has stable physical and chemical properties, desired electrical insulation, fabrication process simplicity, and is low cost, in one embodiment, the first substrate 10 and the first planarization layer 135 may be made of polyimide.

In the display panel in the embodiments of the present disclosure, the thin-film-transistors included in the pixel circuit 134 may have a top-gate electrode structure, or a bottom-gate electrode structure. In the actual fabrication process, the type of the structure of the thin-film-transistors may be determined according to product requirement. Typical display panel structures may be described in detail below. However, the examples set forth are intended for illustrative purposes, not for limiting the present disclosure.

Figure 27:
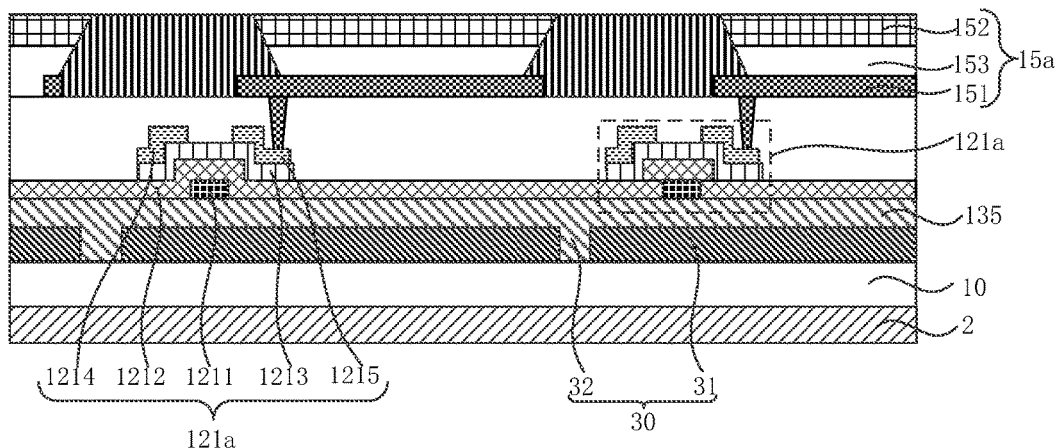
FIG. 27 illustrates a cross-sectional view of another exemplary display panel according to the disclosed embodiments.

FIG. 27 illustrates a cross-sectional view of another exemplary display panel according to the present disclosure. Specifically, referring to FIG. 27, for illustrative purposes, the pixel circuit in the display panel may include only one thin-film-transistor 121a. The thin-film-transistor 121a may have a bottom-gate electrode structure, and may include a gate electrode 1211 formed on the first substrate 10, a first insulation layer 1212 formed on the gate electrode 1211, an active layer 1213 formed on the first insulation layer 1212, and a source electrode 1214 and a drain electrode 1215 formed on the active layer 1213.

Figure 28:
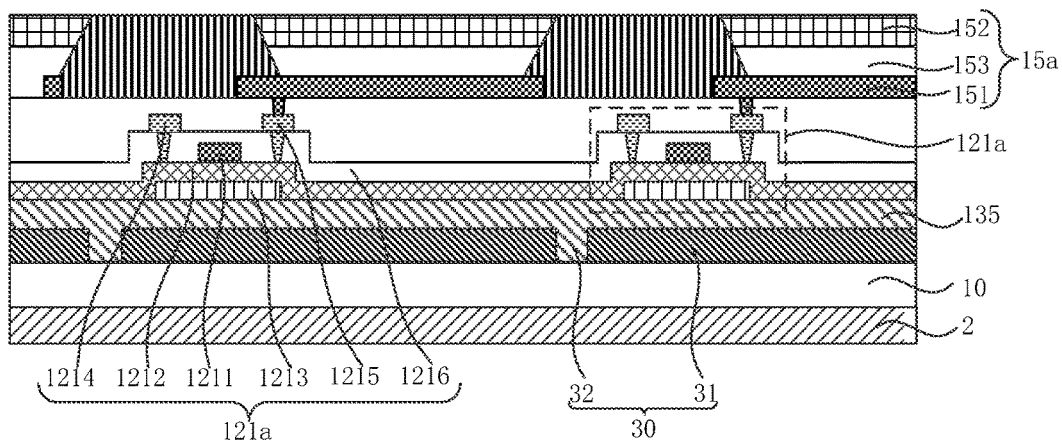
FIG. 28 illustrates a cross-sectional view of another exemplary display panel according to the disclosed embodiments.

FIG. 28 illustrates a cross-sectional view of another exemplary display panel according to the present disclosure. Specifically, referring to FIG. 28, for illustrative purposes, the pixel circuit in the display panel may include only one thin-film-transistor 121a. The thin-film-transistor 121a may have a top-gate electrode structure, and may include an active layer 1213 formed on the first substrate 10, a first insulation layer 1212 formed on the active layer 1213, a gate electrode 1211 formed on the first insulation layer 1212, a second insulation layer 1216 formed on the gate electrode 1211, and a source electrode 1214 and a drain electrode 1215 formed on the second insulation layer 1216.

The existing display module may also include a light emitting unit 15a on a side of the pixel circuit facing away from the first substrate 10. The pixel circuit and the light emitting unit 15a may correspond to each other. When the light emitted from the light emitting unit 15a directly irradiates on the fingerprint sensor of the fingerprint recognition module 2, the same light may cause excessive noise in the fingerprint sensor of the fingerprint recognition module 2, and may affect the precision of fingerprint recognition by the fingerprint recognition module 2. In one embodiment, as shown in FIG. 27 and FIG. 28, an orthogonal projection of the light emitting unit 15a on the first substrate 10 may fall within an orthogonal projection of the light shielding region 31 on the first substrate 10. The configuration may use the light shielding region 31 of the black matrix 30 to block the light that is emitted from the light emitting unit 15a and is transmitted in a direction of the light emitting nit 15a facing toward the fingerprint recognition module 2. Thus, the signal-to-noise ratio of the fingerprint recognition module 2 may be increased, and the precision of fingerprint recognition by the display panel may be improved.

When the display panel is an organic light emitting display panel, as shown in FIG. 27 and FIG. 28, the light emitting unit 15a may include a first electrode 151, a second electrode 152, and a light emitting layer 153 disposed between the first electrode 151 and the second electrode 152. In operation, in one embodiment, the first electrode 151 may be an anode, and the second electrode 152 may be a cathode. In another embodiment, the first electrode 151 may be a cathode, and the second electrode 152 may be an anode. When the display panel is a liquid crystal display panel, the light emitting unit may be a pixel unit.

Figure 29A:
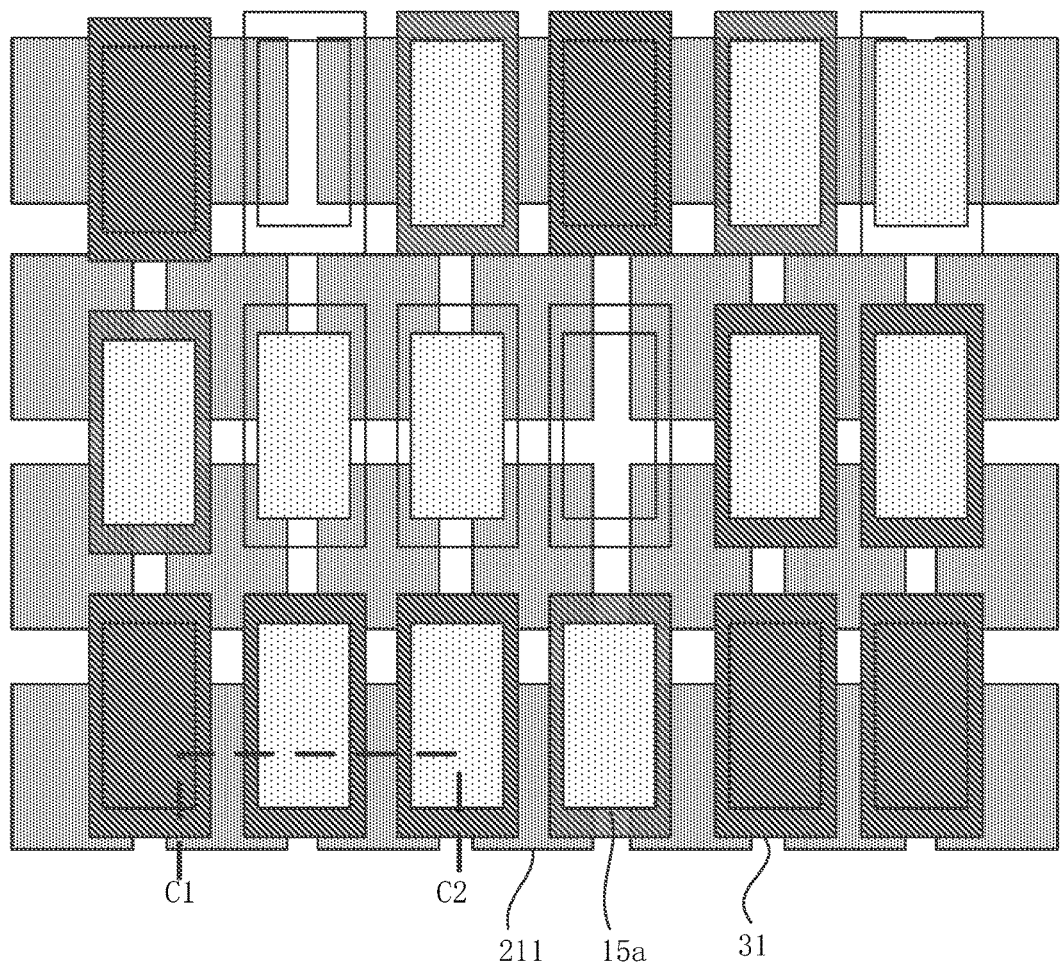
FIG. 29A illustrates a top-down view of another exemplary display panel according to the disclosed embodiments.
Figure 29B:
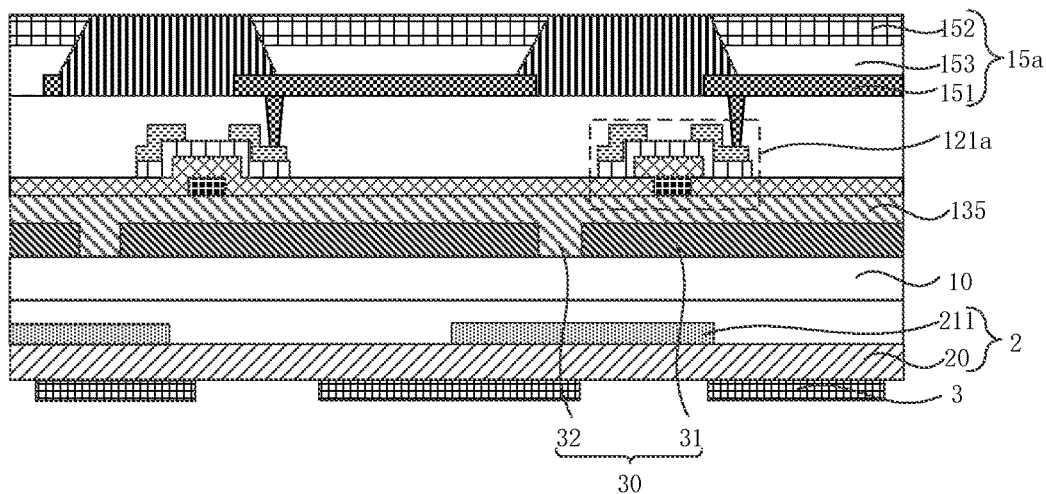
FIG. 29B illustrates a cross-sectional view along the C1-C2 direction in FIG. 29A.

FIG. 29A illustrates a top-down view of another exemplary display panel according to the present disclosure. FIG. 29B illustrates a cross-sectional view along the C1-C2 direction in FIG. 29A. Specifically, referring to FIG. 29A and FIG. 29B, the fingerprint recognition module 2 may include a second substrate 20, and a plurality of independent fingerprint recognition unit 211 formed on the second substrate 20. The finger recognition unit 211 may be configured on a side of the second substrate 20 adjacent to the first substrate 10. An orthogonal projection of at least a portion of the fingerprint recognition unit 211 on the first substrate 10 may fall within an orthogonal projection of the opening region 32 of the black matrix 30 on the first substrate 10.

The configuration that the orthogonal projection of at least a portion of the fingerprint recognition unit 211 on the first substrate 10 may fall within the orthogonal projection of the opening region 32 of the black matrix 30 on the first substrate 10 may have the benefits of reducing the shielding effect by the shielding region 31 of the black matrix 30 of the light that is reflected by the fingerprint of the finger of the user, letting as much light reflected by the fingerprint of the finger of the user as possible to pass through the opening region 31 of the black matrix 30 to irradiate on the fingerprint recognition unit 211, and increasing the signal-to-noise ratio of the fingerprint recognition unit 211.

In one embodiment, the display panel may also include a backlight source 3. The backlight source 3 may be configured on a side of the second substrate 20 facing away from the first substrate 10. In certain embodiments, the backlight source 3 in the fingerprint recognition module 2 may be a collimated light source or a surface light source. As compared to the surface light source, the collimated light source may reduce crosstalk at different fingerprint sensors by the light reflected by the fingerprint of the finger of the user, and may improve the precision of fingerprint recognition. However, because the collimated light source is often thicker than the surface light source, the use of the collimated light source may increase the thickness of the display panel.

In addition, for the case of multiplexing the organic light emitting layer as the light source for fingerprint recognition and the case of using external backlight source as the light source for fingerprint recognition, the present disclosure provides two structures of the display panel, respectively. An angle limiting film may be used to selectively filter the light reflected by the touch object at different positions toward a same fingerprint recognition unit to avoid crosstalk that occurs when the light reflected by the touch object at different positions irradiates on the same fingerprint recognition unit. Thus, the precision of fingerprint recognition may be improved.

For illustrative purposes, the present disclosure provides a display panel. The display panel may include a display module, a fingerprint recognition module, and an angle limiting film. The display module may include a first substrate, and a plurality of organic light emitting units disposed on the first substrate. The fingerprint recognition module may be configured in the display region on a side of the first substrate facing away from the organic light emitting units, and may include a second substrate, and at least one fingerprint recognition unit disposed on the second substrate and configured to recognize fingerprints based on the light reflected by the touch object to the fingerprint recognition unit.

The angle limiting film may be disposed between the display module and the fingerprint recognition module, and may be configured to filter out a portion of the light reflected by the touch object to the fingerprint recognition unit, which has an incident angle with respect to the angle limiting film greater than an passing angle of the angle limiting film. The angle limiting film may have a light transmittance A for the incident light perpendicular to the angle limiting film. The passing angle of the angle limiting film may refer to an incident angle with respect to the angle limiting film for the incident light having a transmittance kA, and 0<k<1.

The light reflected by the touch object at different positions may irradiate on a same fingerprint recognition unit. For example, the light reflected by a ridge and an adjacent valley of the touch object may irradiate on a same fingerprint recognition unit. The fingerprint recognition unit receiving the light may be unable to detect the precise position of the ridge and the adjacent valley of the fingerprint, thus causing severe crosstalk in the fingerprint recognition process, and affecting the accuracy and precision of fingerprint recognition by the fingerprint recognition sensor.

Therefore, in the embodiments of the present disclosure, the angle limiting film may be configured between the display module and the fingerprint recognition module. The angle limiting film may filter out a portion of the light reflected by the touch object to the fingerprint recognition unit, which has an incident angle with respect to the angle limiting film greater than the passing angle of the angle limiting film. In the existing technology, the light reflected by the touch object at different positions may irradiate on a same fingerprint recognition unit. For example, the light reflected by ridges or valleys at different positions of the touch object may irradiate on a same fingerprint recognition unit, thus causing crosstalk. The angle limiting film may be configured to selectively filter out a portion of the light reflected by the touch object at different positions to a same fingerprint recognition unit in the existing technology. That is, the light having an incident angle with respect to the angle limiting film greater than the passing angle of the angle limiting film may be filtered out. The configuration of the angle limiting film may effectively avoid crosstalk when the light reflected by the touch object at different positions irradiates on a same fingerprint recognition unit, and may improve the accuracy and precision of fingerprint recognition.

The above describes the operation principle of the present disclosure. The technical solutions in the embodiments of the present disclosure are described in detail below with the accompanying drawings for the embodiments of the present disclosure. In accordance with the embodiments of the present disclosure, other embodiments obtained by those of ordinary skill in the art without creative work are within the scope of the present disclosure.

Figure 30A:
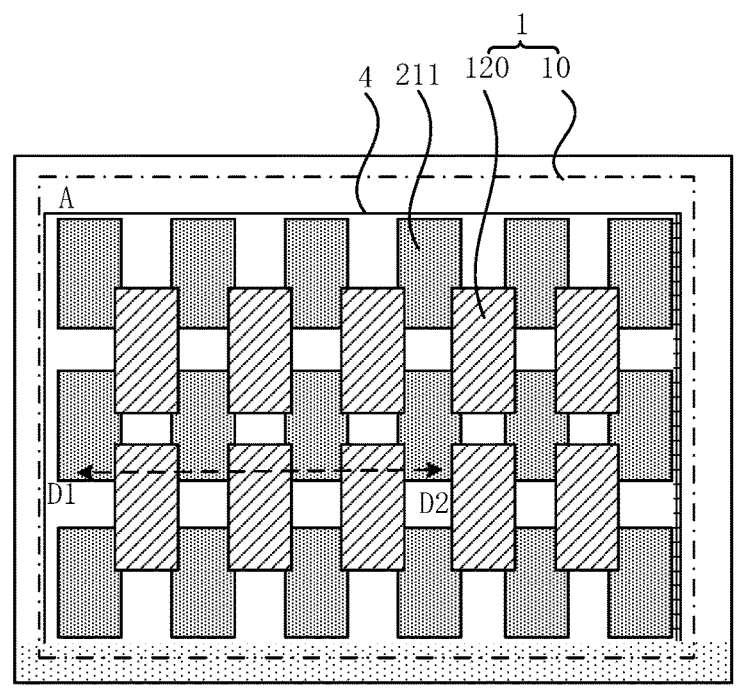
FIG. 30A illustrates a top-down view of another exemplary display panel according to the disclosed embodiments.
Figure 30B:
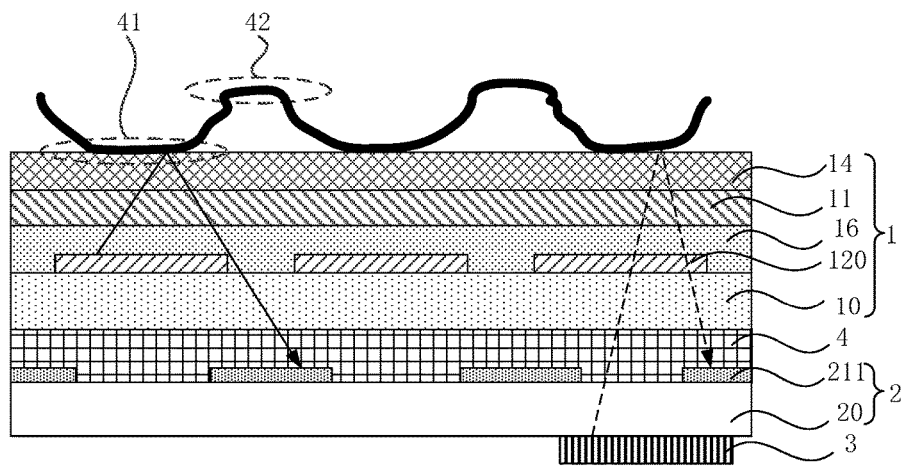
FIG. 30B illustrates a cross-sectional view along the D1-D2 direction in FIG. 30A.

FIG. 30A illustrates a top-down view of another exemplary display panel according to the present disclosure. FIG. 30B illustrates a cross-sectional view along the D1-D2 direction in FIG. 30A. Referring to FIG. 30A and FIG. 30B, the display panel may include a display module 1, a fingerprint recognition module 2, and an angle limiting film 4. The display module 1 may include a first substrate 10, and a plurality organic light emitting units 120 disposed on the first substrate 10. The fingerprint recognition module 2 may be configured in a display region A on a side of the first substrate 10 facing away from the organic light emitting units 120, and may include a second substrate 20, and at least one fingerprint recognition unit 211 disposed on the second substrate 20. The angle limiting film 4 may be configured between the display module 1 and the fingerprint recognition module 2.

The fingerprint recognition module 2 may recognize fingerprints based on the light reflected by the touch object to the fingerprint recognition unit 211. The angle limiting film 4 may filter out a portion of light reflected by the touch object to the fingerprint recognition unit 211, which has an incident angle with respect to the angle limiting film 4 greater than the passing angle of the angle limiting film 4. Assuming the incident light perpendicular to the angle limiting film 4 has a transmittance A passing through the angle limiting film 4, and 0<k<1, the incident light having an incident angle with respect to the angle limiting film 4 greater than the passing angle of the angle limiting film 4 may be filtered out. In one embodiment, k may be configured to 0.1, i.e., the passing angle of the angle limiting film 4 may be an incident angle with respect to the angle limiting film 4 for the light having a transmittance 0.1 A.

As shown in FIG. 30B, the light emitted from the light source may irradiate on the touch object. In case of different light source, the optical path may be represented in the solid line as shown in FIG. 30B, or may be represented in the dashed line as shown in FIG. 30B. The fingerprint recognition unit 211 may recognize fingerprints based on eth light emitted from either one of the light sources. The touch object may often be a finger. A fingerprint may include a plurality of ridges 41 and valleys 42 on the skin surface of the finger tip. Because a ridge 41 and a valley 42 have different distances from the fingerprint recognition unit 211, the fingerprint recognition unit 211 may receive the light reflected by the ridge 41 and the valley 42 with different intensities such that the light reflected at the ridge 41 position and the light reflected at the valley 42 position may be converted into different current signals. Thus, the fingerprint recognition may be based on the current signals. The touch object may also be a palm. The fingerprint detection and recognition may be based on palmprints.

In one embodiment, the organic light emitting unit 120 may provide the light for the fingerprint recognition module 2. The fingerprint recognition unit 211 may recognize fingerprints based on the light reflected by the touch object to the fingerprint recognition unit 211, for example, the light represented in the solid line as shown in FIG. 30B. The angle limiting film 4 may filter out the light that is emitted from the organic light emitting unit 120, is reflected by the touch object to the fingerprint recognition unit 211, and has an incident angle with respect to the angle limiting film 4 greater than the passing angle of the angle limiting film 4. Thus, crosstalk when the light emitted from the organic light emitting unit 120 is reflected by the touch object at different positions and irradiates on a same fingerprint recognition unit 211 may be effectively avoided, and the accuracy and precision of fingerprint recognition may be improved.

In one embodiment, the light perpendicular to the touch object that irradiates on the fingerprint recognition unit 211 from the display module 1 may have a transmittance greater than about 1%. Specifically, the fingerprint recognition unit 211 may recognize fingerprints based on the light emitted from the organic light emitting unit 120, and the light reflected by the touch object is perpendicular to the touch object. When the light that irradiates on the fingerprint recognition unit 211 from the display module 1 has a transmittance too small, the light that irradiates on the fingerprint recognition unit 211 may have intensity too small, thus affecting the precision of fingerprint recognition. For illustrative purposes, the thickness of the layers may be adjusted to adjust the transmittance for the light that is perpendicular to the touch object, and irradiates on the fingerprint recognition unit 211 from the display module 1.

In one embodiment, the display panel may include a light emitting side and a non-light emitting side. The light emitting side may be located on a side of the organic light emitting unit 120 facing away from the first substrate 10, and the non-light emitting side may be located on a side of the first substrate 10 facing away from the organic light emitting unit 120. When the fingerprint recognition unit 211 recognizes fingerprints based on the light emitted from the organic light emitting unit 120, the brightness ratio of the light emitting side over the non-light emitting side of the display panel may be greater than about 10:1. The emitted from the non-light emitting side may affect the process that the fingerprint recognition unit 211 recognizes fingerprints based on the light that is formed when the light emitted from the organic light emitting unit 120 is reflected by the touch object to the fingerprint recognition unit 211, and may cause crosstalk to the light detected by the fingerprint recognition unit 211. When the non-light emitting side of the display panel is too bright, the precision of the fingerprint recognition may be severely affected.

The relative positions of the organic light emitting unit 120 and the fingerprint recognition unit 21 as shown in FIG. 30A and FIG. 30B are for illustrative purposes. The embodiments of the present disclosure do not limit the relative positions of the organic light emitting unit 120 and the fingerprint recognition unit 211, as long as the light emitted from the organic light emitting unit 120 is reflected by the touch object to the fingerprint recognition unit 211.

In one embodiment, the display panel may also include a backlight source 3. The backlight source 3 may be located on a side of the second substrate 20 facing away from the fingerprint recognition unit 211. The fingerprint recognition unit 211 may recognize fingerprints based on the light that is formed when the light emitted from the backlight source 3 is reflected by the touch object to the fingerprint recognition unit 211, for example, the light in the optical path represented in the dashed line as shown in FIG. 30B. The angle limiting film 4 may filter out a portion of the light that is emitted from the backlight source 3, is reflected by the touch object to the fingerprint recognition unit 211, and has an incident angle with respect to the angle limiting film 4 greater than the passing angle of the angel limiting film 4. Thus, crosstalk when the light emitted from the backlight source 3 is reflected by the touch object at different positions to a same fingerprint recognition unit 211 may be avoided, and the accuracy and precision of fingerprint recognition may be improved.

In one embodiment, the light emitted from the backlight source 3 may pass through the gap between two adjacent fingerprint recognition units 211 to irradiate on the touch object. The light that is reflected by the touch object in a direction perpendicular to the touch object may pass through the display module 1, irradiate on the fingerprint recognition unit 211, and have a light transmittance greater than about 10%. Specifically, when the light that is reflected by the touch object in the direction perpendicular to the touch object passes through the display module 1, irradiates on the fingerprint recognition unit 211, and has a substantially small light transmittance, the light that irradiates on the fingerprint recognition unit 211 may be too weak to achieve a desired precision of fingerprint recognition.

In addition, compared to the fingerprint recognition by the fingerprint recognition unit 211 based on the light emitted from the organic light emitting unit 120, in the fingerprint recognition process by the fingerprint recognition unit 211 based on the light emitted from the backlight source 3, the light emitted from the backlight source 3 may pass through more layers, i.e., larger total thickness of the layers, to reach the fingerprint recognition unit 211. Thus, the light that is perpendicular to the touch object, is reflected by the touch object, passes through the display module 1, and irradiates on the fingerprint recognition unit 211 may have a smaller transmittance.

The embodiments of the present disclosure do not limit the location and type of the backlight source 3. The backlight source 3 may be a point light source or a surface light source, as long as the light emitted from the backlight source 3 is reflected by the touch object to the fingerprint recognition unit 211. At the same time, the light represented in the solid line and the dashed line as shown in FIG. 30B may be a light emitted from the organic light emitting unit 120 and the backlight source 3, respectively, for illustrative purposes. The light emitted from the organic light emitting unit 120 and the fingerprint recognition light source may be divergent. In addition, the embodiments of the present disclosure do not limit the light source. The light source may be an organic light emitting unit 120, or an external backlight source 3, as long as the light emitted from the light source is reflected by the touch object to the fingerprint recognition unit 211 for fingerprint recognition.

Figure 31A:
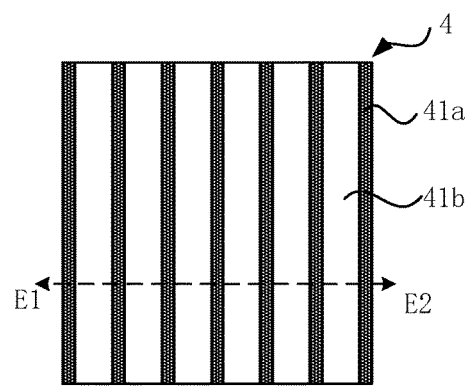
FIG. 31A illustrates a top-down view of an exemplary angle limiting film according to the disclosed embodiments.
Figure 31B:
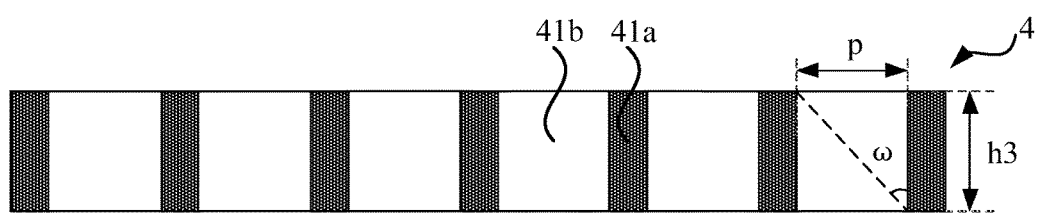
FIG. 31B illustrates a cross-sectional view along the E1-E2 direction in FIG. 31A.

FIG. 31A illustrates a top-down view of an exemplary angle limiting film according to the present disclosure. FIG. 31B illustrates a cross-sectional view along the E1-E2 direction in FIG. 31A. Referring to FIG. 31A and FIG. 31B, the angle limiting film 4 may include a plurality of non-transparent regions 41a and transparent regions 41b alternately arranged in a same direction and parallel to the plane where the second substrate 20 is located. The non-transparent regions 41a may be made of a light absorbing material.

Specifically, because the non-transparent regions 41a are made of a light absorbing material, when light irradiates on a non-transparent region 41a, the light may be absorbed by the light absorbing material in the non-transparent region 41a. That is, certain light reflected by the touch object may not pass through the angle limiting film 4 to irradiate on the fingerprint recognition unit 211. The angle limiting film 4 may effectively filter out certain portion of light. As shown in FIG. 31B, because the light that irradiates on the non-transparent region 41a is absorbed by the light absorbing material in the non-transparent region 41a, the passing angle of the angle limiting film 4 may be defined as in the equation below:

$$\omega = \arctan\frac{p}{h3},$$

where $\omega$ is the passing angle of the angle limiting film 4, p is a width of a transparent region 41b in a direction of the transparent region 41b arrangement, and h3 is a thickness of the angle limiting film 4.

As shown in FIG. 31B, a calculation relationship $$\tan\omega = \frac{p}{h3}$$

may exist between ω, p, and h3. Thus, the passing angle of the angle limiting film 4 satisfies the equation above. Because the light that irradiates on the non-transparent region 41a may be absorbed by the light absorbing material in the non-transparent region 41a, the light that has an incident angle with respect to the angle limiting film 4 greater than the passing angle of the angle limiting film 4 may be filtered out. The portion of light that is filtered out may not be the detection light required for fingerprint recognition. The configuration of the angle limiting film 4 may avoid crosstalk in the fingerprint recognition process when the light having an incident angle with respect to the angle limiting film 4 greater than the passing angle of the angle limiting film 4 irradiates on the fingerprint recognition unit 211.

In one embodiment, the angle limiting film 4 includes a plurality of non-transparent regions 41a and transparent regions 41b alternately arranged in a same direction and parallel to the plane where the second substrate 20 is located. When the non-transparent regions 41a are configured with light absorbing material, a divergent distance of the angle limiting film 4 may be defined in the equation below:

$$\Delta = \frac{p(H3 + h3)}{h3},$$

where ΔX is the divergent distance of the angle limiting film 4, and H3 is the thickness of the display module 1.

The divergent distance of the angle limiting film 4 may be a distance between the reflection point on the touch object for the actual detection light and the reflection point on the touch object for the crosstalk detection light when both the actual detection light and the crosstalk detection light correspond to a same fingerprint recognition unit 211. The reflected light that has a minimum incident angle with respect to the fingerprint recognition unit 211 may be the actual detection light. The reflected light that has an incident angle with respect to the fingerprint recognition unit 211 greater than the incident angle with respect to the fingerprint recognition unit 211 for the actual detection light may be the crosstalk detection light.

Figure 31C:
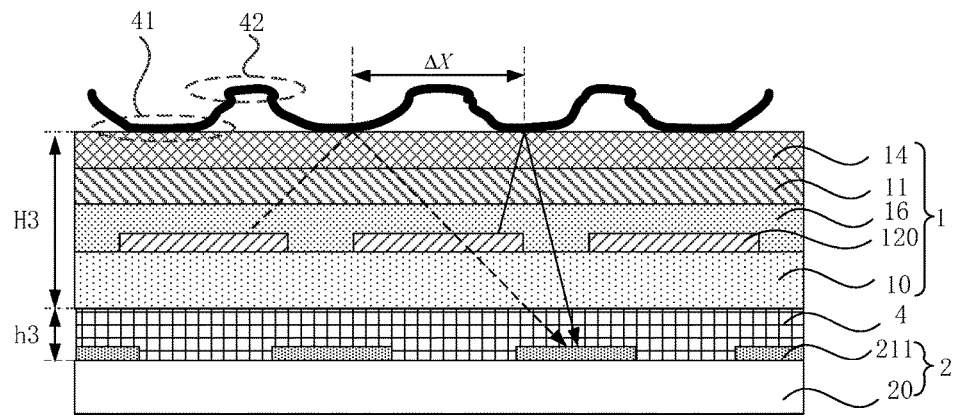
FIG. 31C illustrates a cross-sectional view of another exemplary display panel according to the disclosed embodiments.

For illustrative purposes, as shown in FIG. 31C, the fingerprint recognition unit 211 may recognize fingerprints based on the light that is formed when the light emitted from the organic light emitting unit 120 is reflected by the touch object to the fingerprint recognition unit 211. The light represented in solid line in FIG. 31C may be the reflected light that has the minimum incident angle with respect to the fingerprint recognition unit 211, that is, the actual detection light. The light represented in dashed line in FIG. 31C may be the reflected light that has an incident angle with respect to the fingerprint recognition unit 211 greater than the incident angle with respect to the fingerprint recognition unit 211 for the actual detection light, that is, the crosstalk detection light. Without the angle limiting film 4, the actual detection light and the crosstalk detection light may be reflected by the touch object at two different positions, for example, two adjacent ridges 41, to irradiate on a same fingerprint recognition unit 211. That is, crosstalk may exist in the fingerprint recognition process.

Figure 31D:
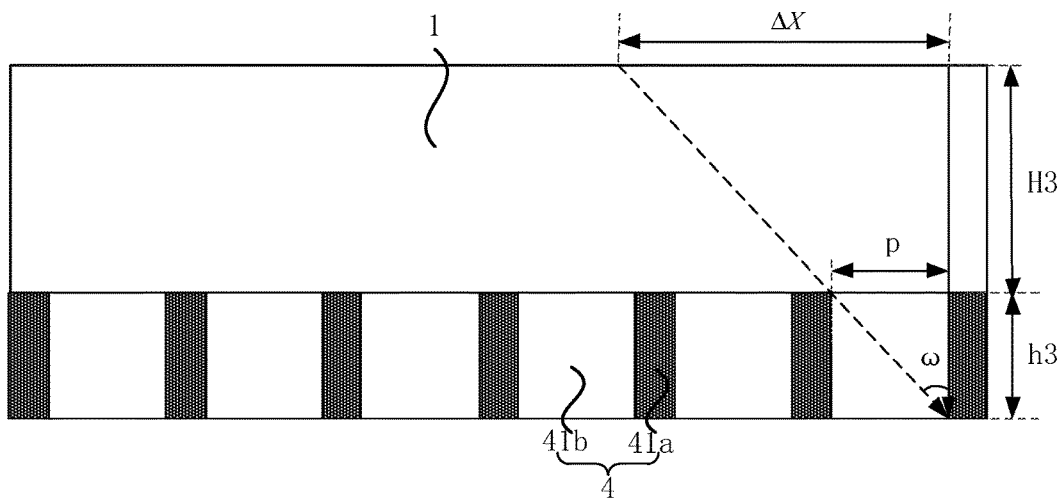
FIG. 31D illustrates a geometric relationship view of an expansion distance of an exemplary angle limiting film in FIG. 31A.

At this point, the divergent distance of the angle limiting film 4 may be the distance between the reflection point on the touch object for the actual detection light and the reflection point on the touch object for the crosstalk detection light. For illustrative purposes, as shown in FIG. 31D, the incident angle with respect to fingerprint recognition unit 211 for the actual detection light may be approximately 0°. A minimum incident angle with respect to the fingerprint recognition unit 211 for the crosstalk light to pass through the angle limiting film 4 may be defined as the passing angle of the angle limiting film 4. The calculation relationship $$\tan\omega = \frac{p}{h3} = \frac{\Delta X}{H3 + h3}$$

may exist. Thus, the divergent distance of the angle limiting film may satisfy the above equation. The longer the divergent distance of the angle limiting film 4 is, the lower the accuracy and precision of fingerprint recognition by the display panel may be.

Figure 31E:
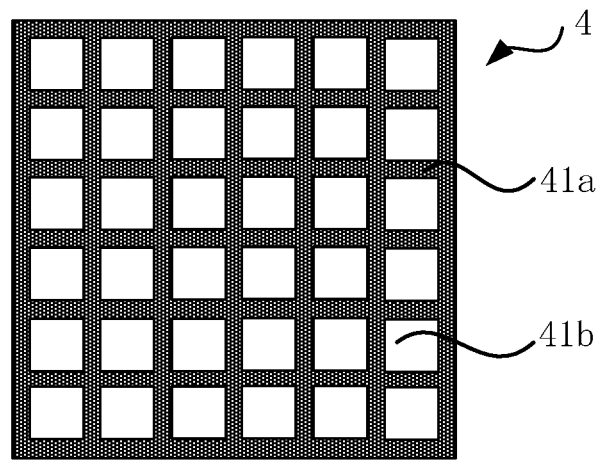
FIG. 31E illustrates a top-down view of another exemplary angle limiting film according to the disclosed embodiments.

For illustrative purposes, the angle limiting film 4 is shown in FIG. 31A as a one-dimensional structure. The transparent regions 41b and the non-transparent regions 41a may be arranged alternately in a horizontal direction in FIG. 31A. The angle limiting film 4 may also be configured as a two-dimensional structure, as shown in FIG. 31E. The transparent regions 41b and the non-transparent regions 41a may be alternately arranged in a diagonal direction of the angle limiting film 4, as shown in FIG. 31E. Compared to the angle limiting film 4 with a one-dimensional structure, the angle limiting film 4 with a two-dimensional structure may selectively filter light having an incident angle with respect to the angle limiting film 4 from any direction.

Figure 32A:
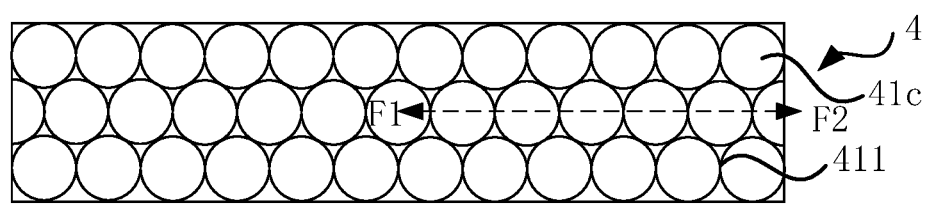
FIG. 32A illustrates a top-down view of another exemplary angle limiting film according to the disclosed embodiments.
Figure 32B:
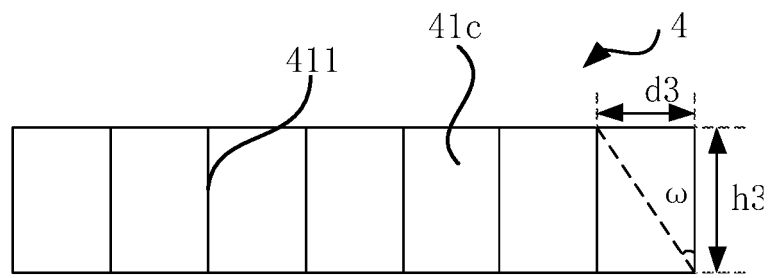
FIG. 32B illustrates a cross-sectional view along the F1-F2 direction in FIG. 32A.

FIG. 32A illustrates a top-down view of another exemplary angle limiting film according to the present disclosure. FIG. 32B illustrates a cross-sectional view along the F1-F2 direction in FIG. 32A. Referring to FIG. 32A and FIG. 32B, the angle limiting film 4 may have a porous structure 41c. A side wall 411 of the porous structure 41c may absorb a portion of light irradiating on the side wall 411. That is, that portion of light may not irradiate on the fingerprint recognition unit 211. For illustrative purposes, the porous structure 41c may be a glass capillary structure. A black light absorbing material may be coated on the side wall 411 of the glass capillary such that the side wall 411 absorbs light that irradiates on the side wall. Thus, the angle limiting film 4 may have a function to filter out a portion of light. In one embodiment, light absorbing material may be configured between adjacent porous structures 41c. In other embodiments, no light absorbing material may be configured between the adjacent porous structures 41c.

Specifically, because the side wall 411 of the porous structure 41c absorbs light that irradiates on the side wall 411, the passing angle of the angle limiting film 4 may be defined in the equation below:

$$\omega = \arctan\frac{d3}{h3},$$

where ω is the passing angle of the angle limiting film 4, d3 is the diameter of the porous structure 41c, and h3 is the thickness of the angle limiting film 4. As shown in FIG. 32B, a calculation relationship $$\tan\omega = \frac{d3}{h3}$$

may exist between ω, d3, and h3. Thus, the passing angle of the angle limiting film 4 may satisfy the above equation.

In one embodiment, when the angle limiting film 4 has a porous structure 41c, and the side wall 411 of the porous structure 41c absorbs light that irradiates on the side wall 411, the divergent distance of the angle limiting film 4 may be defined in the equation below:

$$\Delta X = \frac{p(H3 + h3)}{h3},$$

where ΔX is the divergent distance of the angle limiting film 4, and H3 is the thickness of the display module 1. The derivation of the equation may be similar to the derivation of the divergent distance of the angle limiting film 4 as shown in FIG. 31A, and is not repeated here. The longer the divergent distance of the angle limiting film 4 is, the lower the accuracy and precision of fingerprint recognition by the display panel may be.

Figure 32C:
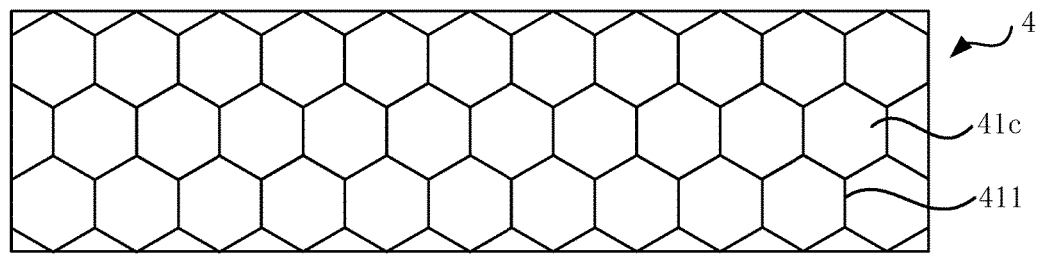
FIG. 32C illustrates a top-down view of another exemplary angle limiting film according to the disclosed embodiments.

From the top-down view of the angle limiting film 4, the porous structure 41c may correspond to circular structures as shown in FIG. 32A, or hexagon structures as shown in FIG. 32C. No limitation on the shape of the porous structure 41c is imposed by the present disclosure.

Figure 33A:
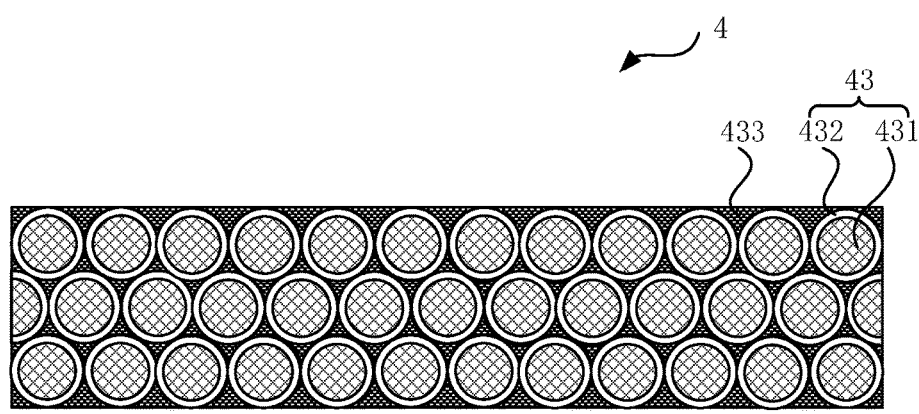
FIG. 33A illustrates a top-down view of another exemplary angle limiting film according to the disclosed embodiments.
Figure 33B:
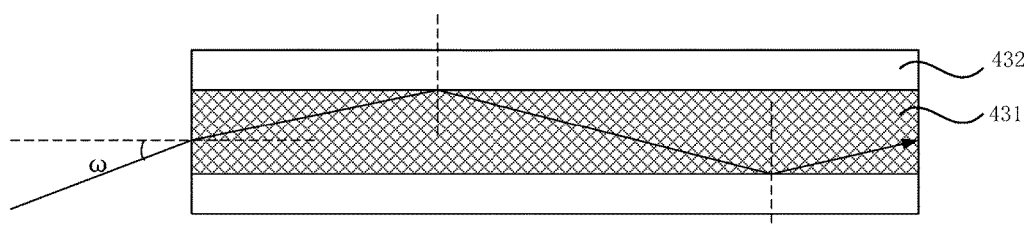
FIG. 33B illustrates a cross-sectional view along the extension direction of the optical fibers in FIG. 33A.

FIG. 33A illustrates a top-down view of another exemplary angle limiting film according to the present disclosure. As shown in FIG. 33A, the angle limiting film 4 may include a plurality of optical fiber structures 43 arranged in a same direction. FIG. 33B illustrates a cross-sectional view along the extension direction of the optical fibers in FIG. 33A. Referring to FIG. 33A and FIG. 33B, each optical fiber structure 43 may include an inner core 431 and an outer cladding 432. Light absorbing material 433 may be configured between any two adjacent optical fiber structures 43. Light escaped from optical fiber structures 43 to the gap between adjacent optical fiber structures 43 may be absorbed by the light absorbing material 433. Thus, the angle limiting film 4 may filter out a portion of light.

Specifically, the inner core 431 and the outer cladding 432 may have different indices of refraction. The passing angle of the angle limiting film 4 may be defined in the equation below:

$$n \cdot \sin \omega = \sqrt{n_{core}^2 - n_{clad}^2},$$

where ω is the passing angle of the angle limiting film 4, n is an index of refraction for the layer in contact with the angle limiting film 4, $n_{core}$ is the index of refraction for the inner core of the optical fiber structure 43, and $n_{core}$ is the index of refraction for the outer cladding of the optical fiber structure 43.

As shown in FIG. 33B, when the light reflected by the touch object has an incident angle with respect to the angle limiting film 4 including the optical fiber structures 43 greater than ω, the light may not undergo total reflection in the optical structure 43. That is, the light may exit the optical fiber structure 43, and may be absorbed by the light absorbing material 433 between adjacent optical fiber structures 43. That portion of light may be filtered out by the angle limiting film 4, and may not irradiate on the fingerprint recognition unit 211. The angle limiting film 4 may be able to filter out the light that has an incident angle with respect to the angle limiting film 4 greater than the passing angle of the angle limiting film 4. The configuration of the angle limiting film 4 may avoid crosstalk when the light emitted from the backlight source 3 is reflected by the touch object at different positions and then irradiates on a same fingerprint recognition unit 211, and may improve the accuracy and precision of fingerprint recognition.

In one embodiment, when the angle limiting film 4 includes a plurality of optical fiber structures 43 arranged in a same direction, the indices of refraction of the inner core 431 and the outer cladding 432 of the optical fiber structure 43 may be different. When the light absorbing material 433 is configured between every two adjacent optical fiber structures 43, the divergent distance of the angle limiting film 4 may be defined in the equation below:

$$\Delta X = H3 \cdot \tan \omega,$$

where ΔX is the divergent distance of the angle limiting film 4, and H3 is the thickness of the display module 1.

Figure 33C:
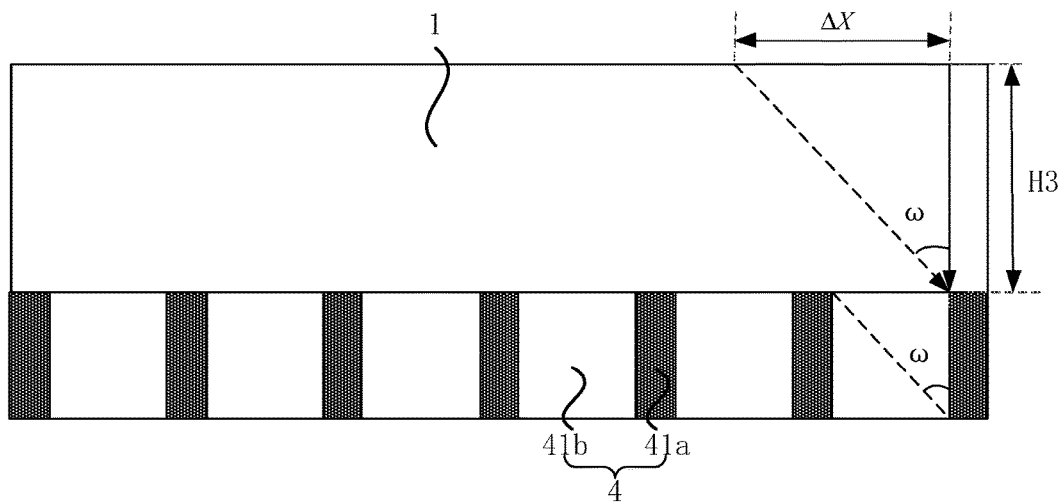
FIG. 33C illustrates a geometric relationship view of an expansion distance of an exemplary angle limiting film in FIG. 33A.

For illustrative purposes, as shown in FIG. 33C, the incident angle with respect to fingerprint recognition unit 211 for the actual detection light may be approximately 0°. A minimum incident angle with respect to the fingerprint recognition unit 211 for the crosstalk light to pass through the angle limiting film 4 may be defined as the passing angle of the angle limiting film 4, that is, the angle at which the light may be totally reflected in the optical fiber structure 43. The calculation relationship $$\tan \theta = \frac{\Delta X}{H3}$$

may exist. Thus, the divergent distance of the angle limiting film may satisfy the above equation. The longer the divergent distance of the angle limiting film 4 is, the lower the accuracy and precision of fingerprint recognition by the display panel may be.

Figure 34A:
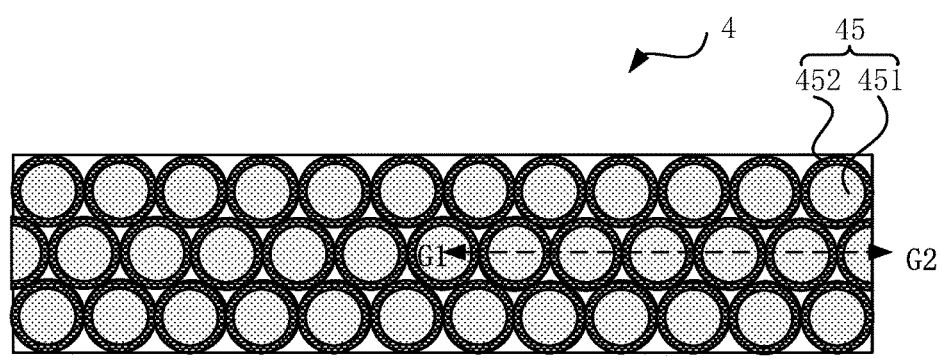
FIG. 34A illustrates a top-down view of another exemplary angle limiting film according to the disclosed embodiments.
Figure 34B:
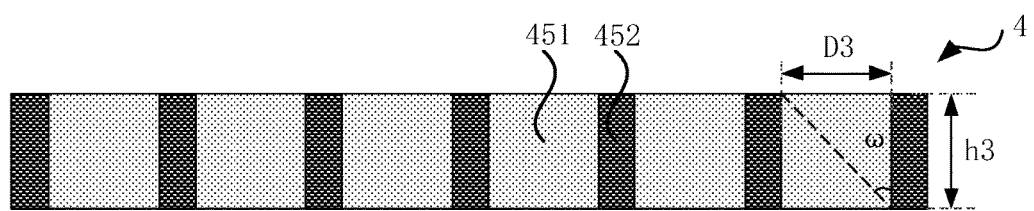
FIG. 34B illustrates a cross-sectional view along the G1-G2 direction in FIG. 34A.

FIG. 34A illustrates a top-down view of another exemplary angle limiting film according to the present disclosure. FIG. 34B illustrates a cross-sectional view along the G1-G2 direction in FIG. 34A. Referring to FIG. 34A and FIG. 34B, the angle limiting film 4 may include a plurality of columnar structures 45 arranged in a same direction. Each columnar structure 45 may include an inner core 451 and an outer shell 452. The inner core 451 and the outer shell 452 may have a same index of refraction. The outer shell 452 may be made of a light absorbing material. Light that exits the inner core 451 to irradiate on the outer shell 452 may be absorbed by the outer shell 452. That is, that portion of light may not irradiate on the fingerprint recognition unit 211. In one embodiment, light absorbing material may be configured between adjacent columnar structures 45. In other embodiments, no light absorbing material may be configured between adjacent columnar structures 45.

Specifically, light that exits the inner core 451 to irradiate on the outer shell 452 may be absorbed by the outer shell 452. Thus, the passing angle of the angle limiting film 4 may be defined in the equation below:

$$\omega = \arctan \frac{D3}{h3},$$

where ω is the passing angle of the angle limiting film 4, D3 is the diameter of the inner core 451, and h3 is the thickness of the angle limiting film 4. As shown in FIG. 34B, a calculation relationship $$\tan \omega = \frac{D3}{h3}$$

may exist between ω, D3, and h3. Thus, the passing angle of the angle limiting film 4 may satisfy the above equation.

In one embodiment, the angle limiting film 4 may include a plurality of columnar structures 45 arranged in a same direction. Each columnar structure 45 may include an inner core 451 and an outer shell 452. The inner core 451 and the outer shell 452 may have a same index of refraction. The outer shell 452 may be made of a light absorbing material. The divergent distance of the angle limiting film 4 may be defined in the equation below:

$$\Delta X = \frac{D3 \cdot (H3 + h3)}{h3},$$

where ΔX is the divergent distance of the angle limiting film 4, and H3 is the thickness of the display module 1. The derivation of the equation may be similar to the derivation of the divergent distance of the angle limiting film 4 as shown in FIG. 31A, and is not repeated here. Similarly, the longer the divergent distance of the angle limiting film 4 is, the lower the accuracy and precision of fingerprint recognition by the display panel may be.

From the top-down view of the angle limiting film 4, the columnar structures 45 may correspond to circular structures as shown in FIG. 34A, or other shape structures. No limitation on the shape of the columnar structure 45 is imposed by the present disclosure.

In one embodiment, the divergent distance of the angle limiting film 4 may be shorter than about 400 μm. The longer the divergent distance of the angle limiting film 4 is, the longer the distance between the reflection point on the touch object for the crosstalk detection light and the reflection point on the touch object for the actual detection light may be. When the distance between the reflection point on the touch object for the crosstalk detection light and the reflection point on the touch object for the actual detection light is greater than a distance between a valley 42 and an adjacent ridge 41, errors may occur in the fingerprint recognition process by the display panel, and fingerprint recognition may not be performed. Thus, the accuracy of fingerprint recognition by the display panel may be severely affected.

In one embodiment, the organic light emitting unit 120 may serve as the light source for the fingerprint recognition module 2. The fingerprint recognition unit 211 may recognize fingerprints based on the light that is formed when the light emitted from the organic light emitting unit 120 is reflected by the touch object to the fingerprint recognition unit 211. In the fingerprint recognition phase, only one organic light emitting unit 120 may emit light within a range of two times the divergent distance of the angle limiting film 4.

Specifically, the configuration that only one organic light emitting unit 120 may emit light within a range of two times the divergent distance of the angle limiting film 4 may substantially reduce the probability that light emitted from different organic light emitting units 120 is reflected by the touch object at different positions to irradiate on a same fingerprint recognition unit 211, and may reduce the crosstalk when light emitted from the backlight source 3 is reflected by the touch object at different positions to irradiate on a same fingerprint recognition unit 211. Thus, the accuracy and precision of fingerprint recognition may be improved.

In one embodiment, an optical adhesive layer may be configured between the fingerprint recognition module 2 and the angle limiting film 4 to bond the fingerprint recognition module 2 and the angle limiting film 4. In another embodiment, the fingerprint recognition unit 211 may include an optical fingerprint sensor. The optical fingerprint sensor may detect and recognize fingerprints based on the light reflected by the touch object. For illustrative purposes, the fingerprint recognition unit 211 may be made of amorphous silicon, arsenic gallium, arsenic sulfide, or other suitable light absorbing material. No limitation on the material for the fingerprint recognition unit 211 is imposed by the present disclosure.

In one embodiment, as shown in FIGS. 30B and F. 31C, the display panel may also include a thin film encapsulation layer 16, a first polarizer layer 11, and a cover 14, sequentially formed on the organic light emitting units 120. In another embodiment, the second substrate 20 serving as the substrate for the fingerprint recognition unit 211 may be a glass substrate or a flexible substrate. For illustrative purposes, the cover 14 may be bonded to the first polarizer layer 11 by an optical adhesive.

In one embodiment, the display panel may also include a touch-control electrode layer. The touch-control electrode layer may be disposed between the encapsulation layer 16 and the first polarizer layer 11, or between the cover 14 and the first polarizer layer 11. The display panel with the integrated touch-control electrodes may provide the image display function and at the same time may provide the touch-control function.

In the drawings illustrating the embodiments of the present disclosure, the sizes of the components and the thicknesses of the layers are for illustrative purposes, and may not represent the actual sizes of the components and layers in the display panel.

In the embodiments of the present disclosure, an angle limiting film 4 may be configured between the display module 1 and the fingerprint recognition module 2. The angle limiting film 4 may be able to filter out a portion of light that is reflected by the touch object to the fingerprint recognition unit 211, and has an incident angle with respect to the angle limiting film 4 greater than the passing angle of the angle limiting film 4. That is, the angle limiting film 4 may selectively filter out a portion of light that is reflected by the touch object at different positions to irradiate on a same fingerprint recognition unit 211. Thus, the crosstalk that occurs when the light reflected by the touch object at different positions irradiates on a same fingerprint recognition unit 211 may be avoided, and the accuracy and precision of fingerprint recognition may be improved.

In addition, the display apparatus with the fingerprint recognition function in the existing technology may have the following problem. When the light emitted from a fingerprint recognition light source is reflected by the touch object to irradiate on a plurality of fingerprint recognition units 211, each fingerprint recognition unit 211 may receive crosstalk signals from other positions in addition to the fingerprint signal from the corresponding position. Thus, the precision of fingerprint recognition by the fingerprint recognition unit 211 may be affected. In order to solve the problem, the present disclosure provides the following technical solution.

Figure 35A:
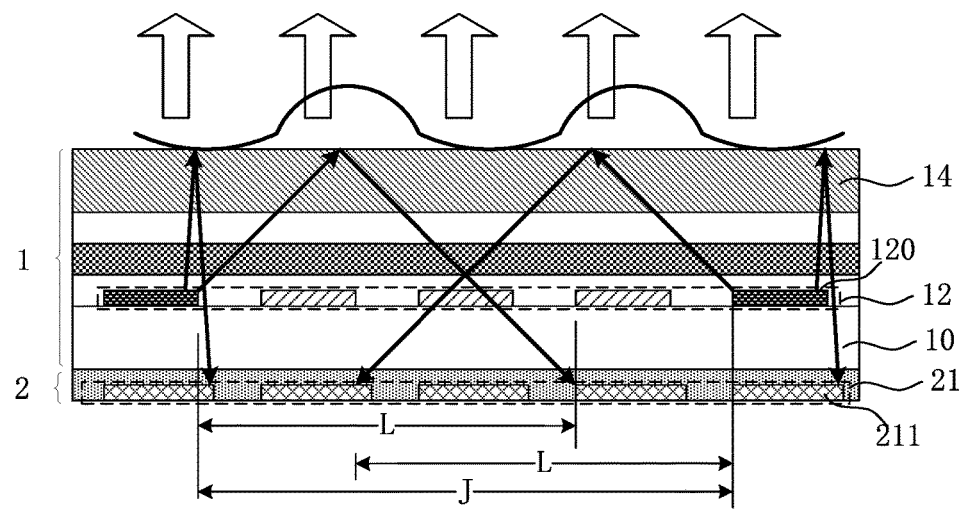
FIG. 35A illustrates a cross-sectional view of another exemplary display panel according to the disclosed embodiments.
Figure 35B:
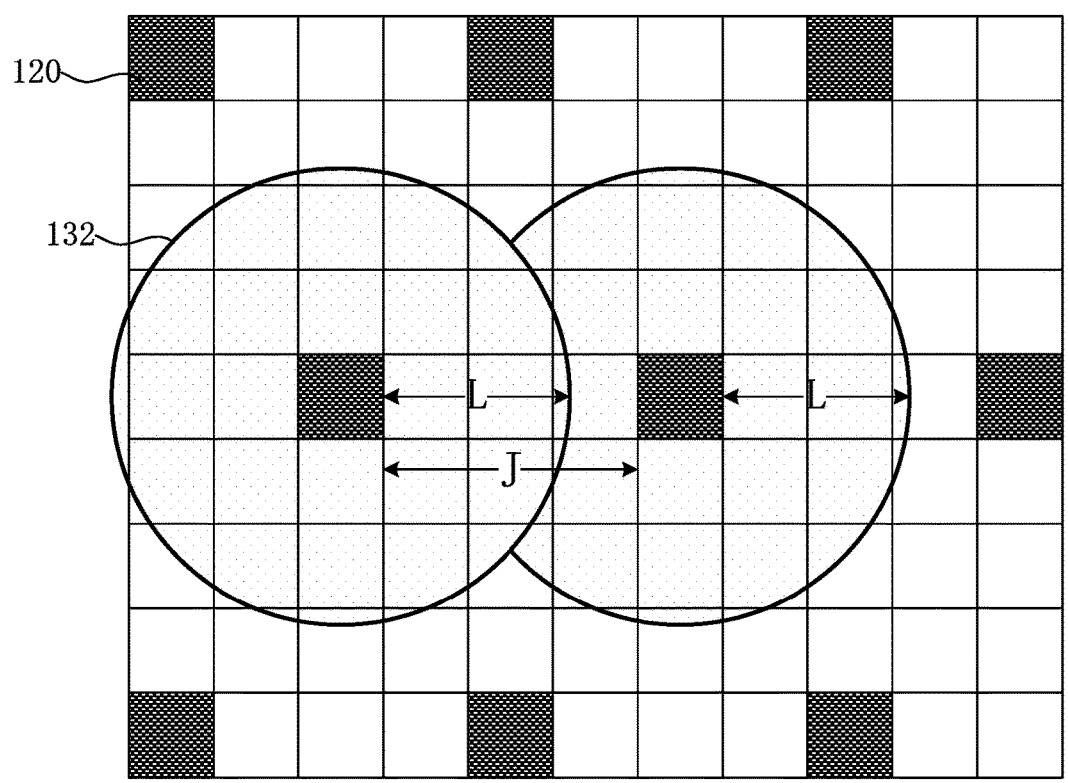
FIG. 35B illustrates a partial top-down view of the exemplary display panel in FIG. 35A.
Figure 35C:
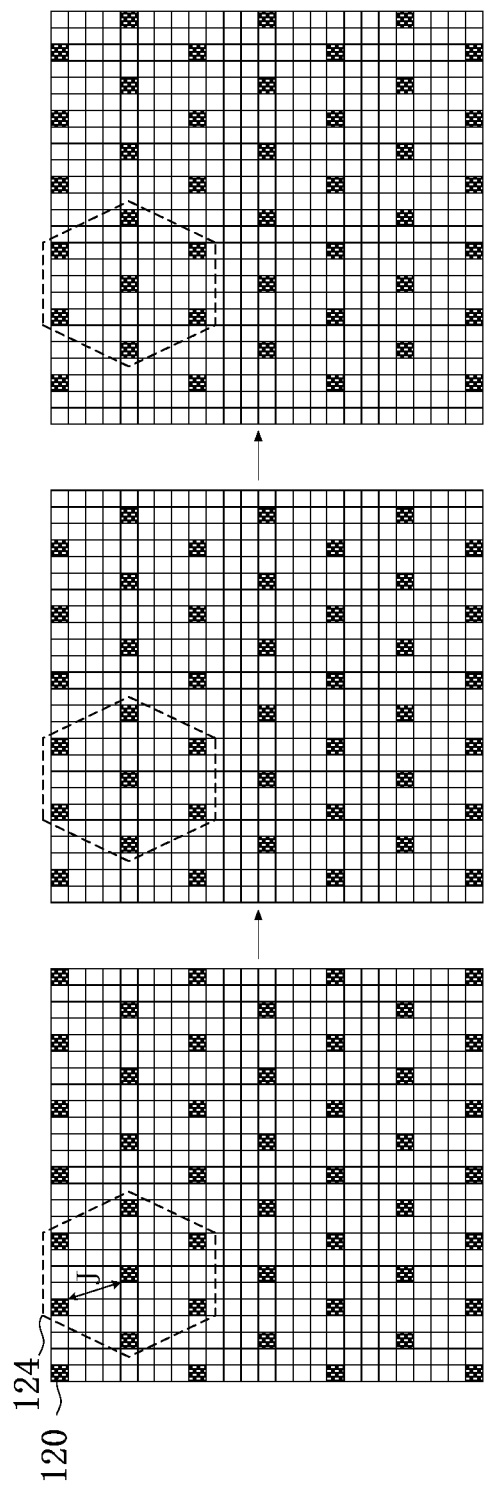
FIG. 35C illustrates a scanning view of the exemplary display panel in FIG. 35A in the fingerprint recognition phase.
Figure 35D:
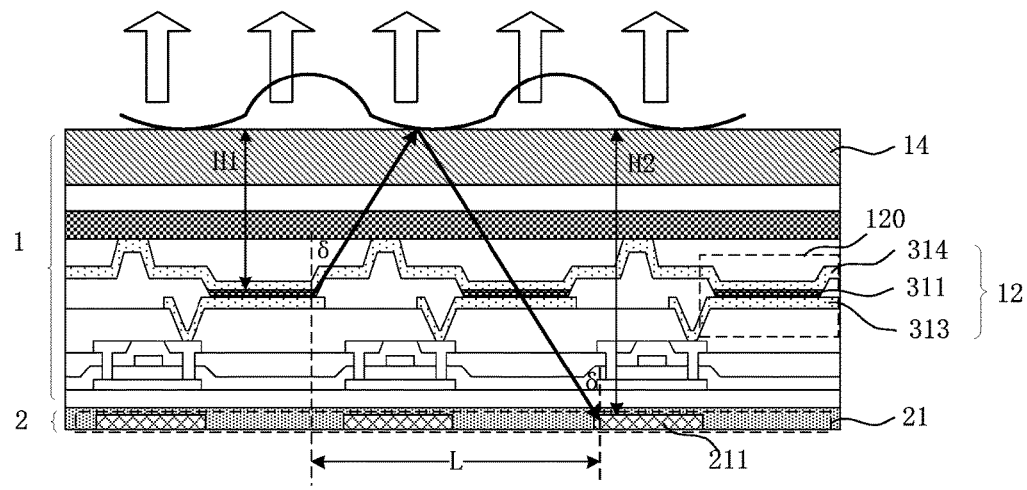
FIG. 35D illustrates a detail cross-sectional view of the exemplary display panel in FIG. 35A.

FIG. 35A illustrates a cross-sectional view of another exemplary display panel according to the present disclosure. FIG. 35B illustrates a partial top-down view of the exemplary display panel in FIG. 35A. FIG. 35C illustrates a scanning view of the exemplary display panel in FIG. 35A in the fingerprint recognition phase. The display panel according to the present disclosure may include a display module 1 and a fingerprint recognition module 2. The display module 1 may include a first substrate 10, an organic light emitting layer 12 disposed on a side of the first substrate 10, and a cover 14 disposed on a side of the organic light emitting layer 12 facing away from the first substrate 10. The organic light emitting layer 12 may include a plurality of organic light emitting units 120. The fingerprint recognition module 2 may include a fingerprint recognition layer 21. A first surface of the cover 14 facing away from the first substrate 10 may be a light emitting side of the display panel.

In the fingerprint recognition phase, the plurality of the organic light emitting units 120 may emit light in a shifting mode according to a first light emitting dot array 124. A distance J between any two adjacent organic light emitting units 120 in the first light emitting dot array 124 may be greater than or equal to a minimum no-crosstalk-distance L. The minimum no-crosstalk-distance L may be a maximum radius of a cover region 132 formed on the fingerprint recognition layer 21 when light emitted from any one of the organic light emitting units 120 is reflected by the first surface of the cover 14.

In one embodiment, the display panel may be an organic light emitting display panel. The fingerprint recognition layer 21 may be configured on a side of the first substrate 10 facing away from the cover 14. The fingerprint recognition layer 21 may include a plurality of fingerprint recognition units 211. The plurality of the fingerprint recognition units 211 may be configured corresponding to the plurality of the organic light emitting units 120.

In the display panel provided by the embodiments of the present disclosure, the display module 1 may serve as the fingerprint recognition light source. Specifically, the organic light emitting units 120 in the organic light emitting layer 12 in the display module 1 may serve as the fingerprint recognition light source for the fingerprint recognition units 211. When the finger of the user is pressed on the first surface of the cover 14, the light emitted from the organic light emitting unit 120 may irradiate on the finger of the user through the first surface of the cover 14. The light reflected by the finger of the user, i.e., the fingerprint signal light, may enter the first surface of the cover 14 to irradiate on the fingerprint recognition unit 211 corresponding to the light emitting organic light emitting unit 120. The fingerprint recognition unit 211 may receive the fingerprint signal light to generate a sensed signal. The fingerprint recognition circuit in the display panel may recognize fingerprints based on the sensed signals.

Figure 36:
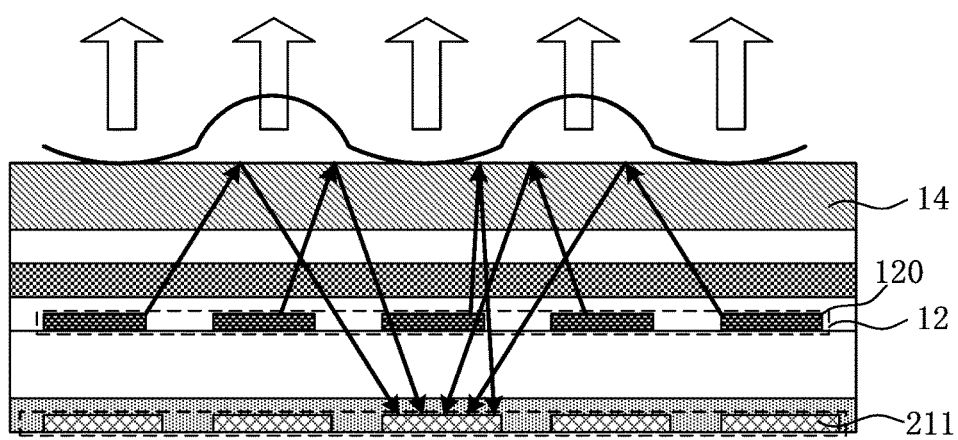
FIG. 36 illustrates a schematic view of crosstalk in an exemplary display panel according to the disclosed embodiments.

The first light emitting dot array 124 may be used as the detection light source for the fingerprint recognition unit 211 because the light emitted from the organic light emitting unit 120 has a wide range of angle distribution. As shown in FIG. 36, when all the organic light emitting units 120 in the organic light emitting layer 12 in the display panel emit light at the same time, each fingerprint recognition unit 211 may receive crosstalk signal from other organic light emitting units 120 in addition to the fingerprint signal light from the corresponding organic light emitting unit 120, thus reducing the precision of fingerprint recognition.

In order to increase the precision of fingerprint recognition, in the fingerprint recognition phase, the plurality of the organic light emitting units 120 in the display panel according to the present disclosure may emit light in a shifting mode according to the first light emitting dot array 124. A distance J between any two adjacent organic light emitting units 120 in the first light emitting dot array 124 may be greater than or equal to a minimum no-crosstalk-distance L.

As shown in FIG. 35A and FIG. 35B, the light emitted from the organic light emitting unit 120 may have a wide range of angle distribution. The light emitted from the organic light emitting unit 120 may be reflected by the first surface of the cover 14 to form a cover region 132 on the fingerprint recognition layer 12. The fingerprint signal emitted from the organic light emitting unit 120 at any angle may fall within the cover region 132. The maximum radius of the cover region 132 may be the minimum no-crosstalk-distance L.

In one embodiment, a distance J between any two adjacent organic light emitting units 120 in the first light emitting dot array 124 may be greater than or equal to a minimum no-crosstalk-distance L. The fingerprint signal light from any one of the light emitting organic light emitting units 120 may not irradiate on a fingerprint recognition unit 120 that corresponds to the other simultaneously light emitting organic light emitting unit 120. That is, the fingerprint recognition unit 211 that corresponds to any one of the organic light emitting units 120 in the first light emitting dot array 124 may only receive the fingerprint signal light from the corresponding organic light emitting unit 120. Thus, the fingerprint recognition units 120 in the display panel according to the present disclosure may not receive crosstalk signals from other organic light emitting units 120. Accordingly, the fingerprint recognition circuit in the display panel may recognize fingerprints based on the sensed signals generated by the fingerprint recognition units 211. Thus, the precision of fingerprint recognition by the display panel may be improved.

The fingerprint signal light may be the light that is formed when the light emitted from the organic light emitting unit 120 is reflected by the fingerprint of the user's finger pressed on the first surface of the cover 14. The distance between the fingerprint of the finger of the user and the first surface may be small as compared to the thickness of the display panel, and may have little impact on the range of the cover region 132. Thus, the calculation of the minimum no-crosstalk-distance L may not take into account the reflection distance between the finger of the user and the first surface of the cover 14.

Further, the radius L of the cover region 132 may be calculated essentially from the center of the organic light emitting unit 120. However, the number of the organic light emitting units 120 I the actual display panel may be huge, and the size of each organic light emitting unit 120 may be small. Thus, an entire organic light emitting unit 120 may be considered as the origin of the cover region 132, and the radius L of the cover region 132 may be a distance from the boundary of the organic light emitting unit 120 to the boundary of the cover region 132. The size of the organic light emitting unit 120 may not be taken into account for the minimum no-crosstalk-distance L.

It should be understood by those of ordinary skill in the art that the minimum no-crosstalk-distance L may be related to the thickness of the display panel and the angle of the light emitted from the organic light emitting unit 120, etc. Thus, different display panels may have different minimum no-crosstalk-distances L. In certain other embodiments, the size of the organic light emitting unit 120 may be taken into account for the minimum no-crosstalk-distance L. No limitation is imposed by the present disclosure.

The organic light emitting unit 120 may emit light having a wide range of angle distribution. The minimum no-crosstalk-distance L may be the maximum radius of the cover region 132 formed on the fingerprint recognition layer 21 when the light emitted from any one of the organic light emitting unit 120 is reflected by the first surface of the cover 14. The reflected light emitted from the edge of the organic light emitting unit 120 having the maximum distribution angle may define the boundary of the cover region 132 on the fingerprint recognition layer 21. Light emitted from the organic light emitting unit 120 with other distribution angles may fall within the cover region 132.

As shown in FIG. 35C, each organic light emitting layer 21 according to the present disclosure may include a second electrode 313, a light emitting function layer 311, and a first electrode 314 sequentially formed in a direction of the organic light emitting unit 120 facing away from the first substrate 10. One second electrode 313, one light emitting function layer 311 corresponding to the second electrode 313, and one first electrode 314 corresponding to the second electrode 313 may form one organic light emitting unit 211. When the organic light emitting layer 21 includes organic light emitting units of three colors, each organic light emitting unit 120 may include three organic light emitting units of three different colors.

A signal may be applied to the second electrode 313 and the first electrode 314 to drive the light emitting function layer 311 to emit light. The light emitted from the light emitting function layer 311 may have a wide range of angle distribution. The fingerprint reflected signal may be mirror reflected, i.e., angle of reflection=incident angle. Thus, $L=\tan \delta *H1+\tan \delta *H2$, where L is the minimum no-crosstalk-distance, $\delta$ is an angle between a direction of light emitted from the organic light emitting unit 120 with a pre-determined brightness and a direction perpendicular to the organic light emitting layer 12, H1 is a height in a direction perpendicular to the display panel from the first surface of the cover 14 to the light emitting function layer 311, H2 is a height in a direction perpendicular to the display panel from the first surface of the cover 14 to the fingerprint recognition layer 21, and the pre-determined brightness is less than or equal to about 10% of the brightness in the direction perpendicular to the organic light emitting layer 12.

In one embodiment, the angle of the light emitted from the organic light emitting unit 120 may be related to the brightness of the organic light emitting unit 120. Brightness may be a subjective feeling of the light intensity. The brightness in the direction perpendicular to the organic light emitting unit 120 may be defined as 100%. The lower the brightness percentage, the larger the angle (the angle with respect to the direction perpendicular to the organic light emitting layer 12) of the corresponding light, and the weaker the intensity of the corresponding light. When the brightness of the organic light emitting unit 120 is less than or equal to about 10%, the light emitted from the organic light emitting unit 120 may have a weak intensity. The weak light reflected by the first surface of the cover 14 may not cause crosstalk to the corresponding fingerprint recognition unit 211. Thus, in the embodiments of the present disclosure, the critical value of the angle of the light emitted from the organic light emitting unit 120 may be configured to correspond to about 10% brightness.

$\delta$ is an angle between a direction of light emitted from the organic light emitting unit 120 with a pre-determined brightness and a direction perpendicular to the organic light emitting layer 12. Based on this configuration, the angle $\delta$ may be determined as follows. The brightness in the direction perpendicular to the organic light emitting unit 120 may be measured. The position corresponding to about 10% of the brightness in the direction perpendicular to the organic light emitting layer 12 may be determined. The angle $\delta$ may be determined based on the angle between the direction of the 10% brightness position and the direction perpendicular to the organic light emitting layer 12.

Organic light emitting units 120 in different display panels may have different light intensities, and may have different pre-determined brightness value accordingly. In certain other embodiments, the pre-determined brightness value may be configured to be about 12% or about 9% of the brightness in the direction perpendicular to the organic light emitting layer 12. No limitation is imposed by the present disclosure.

As shown in FIG. 35C, in the fingerprint recognition phase, the display panel may use an image scanning method for fingerprint recognition. Specifically, the organic light emitting units 120 in the first light emitting dot array 124 may emit light simultaneously. The sensed signals generated by the fingerprint recognition units 211 corresponding to the light emitting organic light emitting units 120 may be recorded. In a subsequent image frame, the organic light emitting units 120 that emit light simultaneously may be shifted. The corresponding sensed signals may be recorded. The process may be repeated until all the organic light emitting units 120 have emitted light. The sensed signals acquired by the fingerprint recognition units 211 may be used for fingerprint recognition. Because the fingerprint recognition units 211 according to the present disclosure may not receive crosstalk signals, the precision of fingerprint recognition according to the present disclosure may be high. It may be understood by those skilled in the art that the first light emitting dot array 124 may be a minimum repetition unit including a plurality of simultaneously light emitting organic light emitting units 120, and may not be a dot array that limits the arrangement of the plurality of the simultaneously light emitting organic light emitting units 120.

The present disclosure provides a display panel. In the fingerprint recognition phase, the plurality of the organic light emitting units may be selected according to the first light emitting dot array to emit light simultaneously. Then, the positions of the simultaneously light emitting organic light emitting units may be shifted. The distance between any two adjacent organic light emitting units in the first light emitting dot array may be greater than or equal to the minimum no-crosstalk-distance. The minimum no-crosstalk-distance may be the maximum radius of the cover region on the fingerprint recognition array that is formed when the light emitted from any one of the organic light emitting units is reflected by the first surface of the cover.

Obviously, the fingerprint reflected light emitted from any one of the simultaneously light emitting organic light emitting units in the first light emitting dot array may not irradiate on the fingerprint recognition units that correspond to other simultaneously light emitting organic light emitting units respectively. That is, the fingerprint recognition unit corresponding to any one of the simultaneously light emitting organic light emitting units in the first light emitting dot array may only receive the fingerprint reflected light from the corresponding light emitting organic light emitting unit. Thus, the fingerprint recognition unit may not receive crosstalk signals from other organic light emitting units. Accordingly, the fingerprint recognition circuit in the display panel may recognize fingerprints based on the sensed signals generated by the fingerprint recognition units, and may improve the precision of fingerprint recognition by the display panel.

The display panel as shown in FIG. 35A may be only one of the structures for the display panel. In certain other embodiments of the present disclosure, other different structures for the display panel may be provided.

The display panel may retrieve the fingerprint information by using an image scanning method. In one image frame, the organic light emitting units 120 may be controlled to emit light according to the first light emitting dot array 124, and the fingerprint signals generated by the fingerprint recognition units 211 corresponding to the simultaneously light emitting organic light emitting units 120 may be acquired. In a subsequent image frame, the light emitting organic light emitting units 120 may be shifted. The organic light emitting units 120 that simultaneously emit light may continue to be shifted sequentially until all the organic light emitting units 120 in the display panel have emitted light in a plurality of images frames.

Obviously, the display panel may complete the fingerprint information acquisition by scanning a plurality of image frames. When only a small number of the organic light emitting units 120 in one image frame are emitting light simultaneously, it may take a large number of the image frames to complete the fingerprint information acquisition, and it may take a long time to acquire the fingerprint information.

Figure 37A:
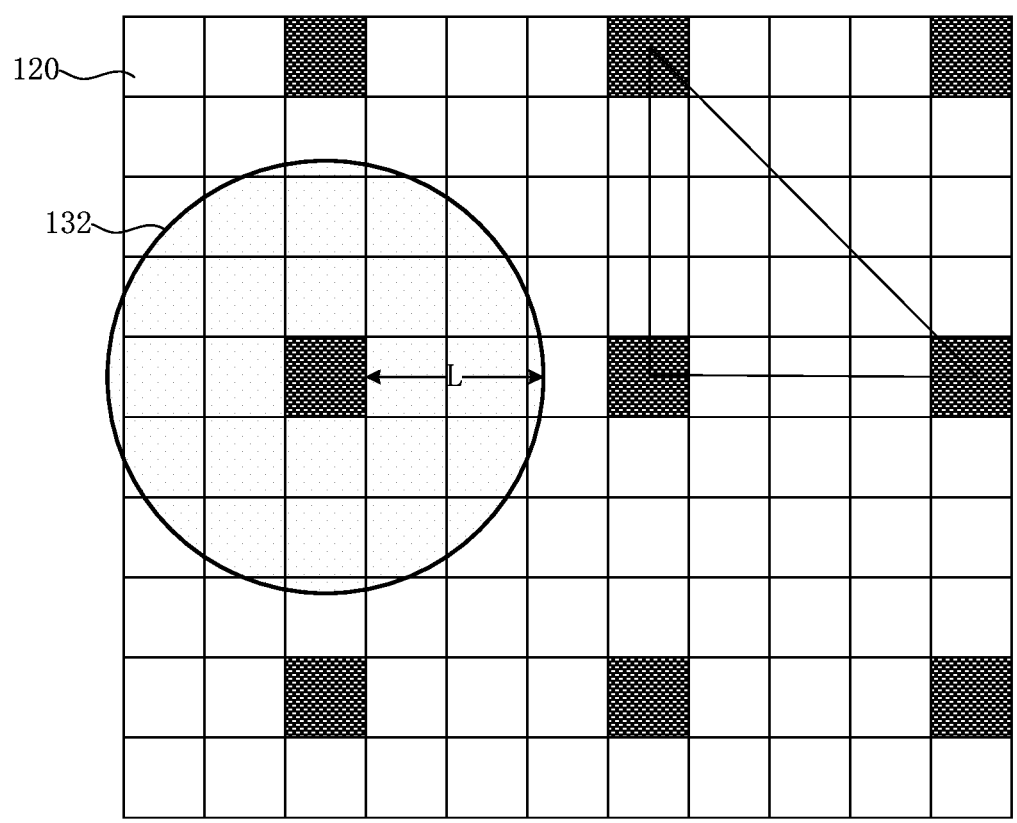
FIGS. 37A-37B illustrate scanning views of two exemplary display panels in the fingerprint recognition phase.
Figure 37B:
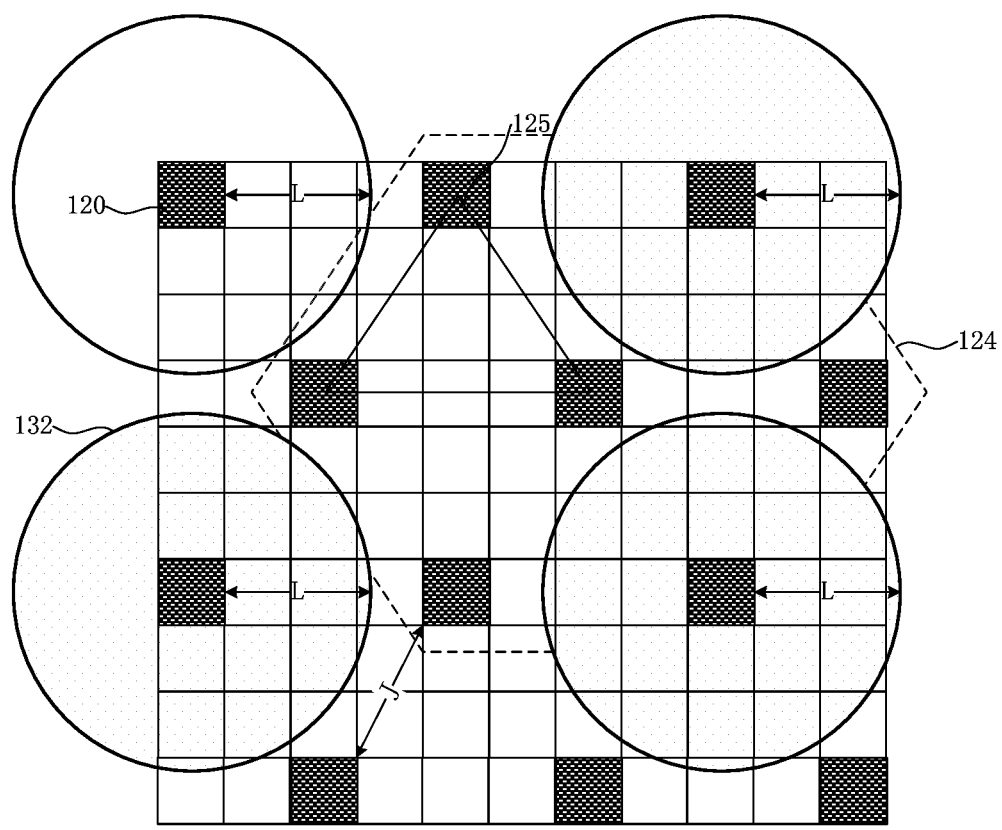

FIGS. 37A-37B illustrate scanning views of two exemplary display panels in the fingerprint recognition phase. Referring to FIG. 37A, there may be 9 organic light emitting units 120 emitting light simultaneously in one image frame (11*10 organic light emitting units). It may take at least 12 image frames to complete the fingerprint information acquisition from the fingerprint recognition units 211 for all the organic light emitting units 120. The time for acquiring fingerprint information from each image frame may be fixed.

In one embodiment, in order to reduce the time for acquiring fingerprint information, multiple organic light emitting units 120 in the first light emitting dot array 124 as shown in FIG. 37B may form multiple shapes. The shape 125 in the multiple shapes as shown in FIG. 37B may have the smallest area and no right angle. Obviously, as compared to FIG. 37A, the distance J between any two adjacent organic light emitting units 120 in the first light emitting dot array 124 may be reduced, and more number of the organic light emitting units 120 in one image frame may emit light simultaneously. Specifically, there may be 12 organic light emitting units 120 that emit light simultaneously in one image frame (11*10 organic light emitting units). Scanning at most 10 image frames may complete the fingerprint information acquisition from the fingerprint recognition units 211 for all the organic light emitting units 120.

Multiple organic light emitting units 120 in the first light emitting dot array 124 may form multiple shapes. In the multiple shapes, the shape 125 that has the smallest area may have no right angle. The configuration may increase the number of the simultaneously light emitting organic light emitting units 120 while ensuring no signal crosstalk. Thus, the time required for fingerprint information acquisition may be substantially reduced.

Figure 38A:
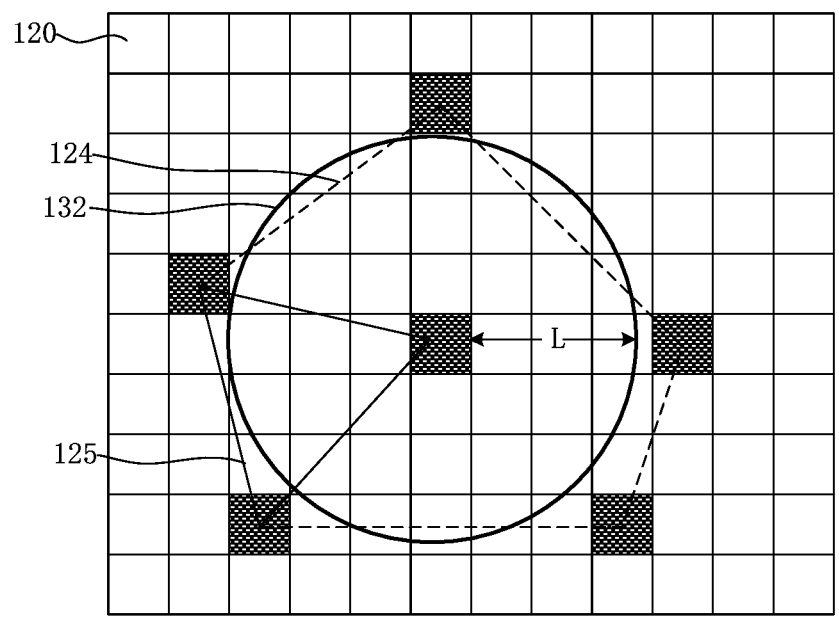
FIGS. 38A-38C illustrate schematic views of three exemplary first light emitting dot arrays according to the disclosed embodiments.
Figure 38B:
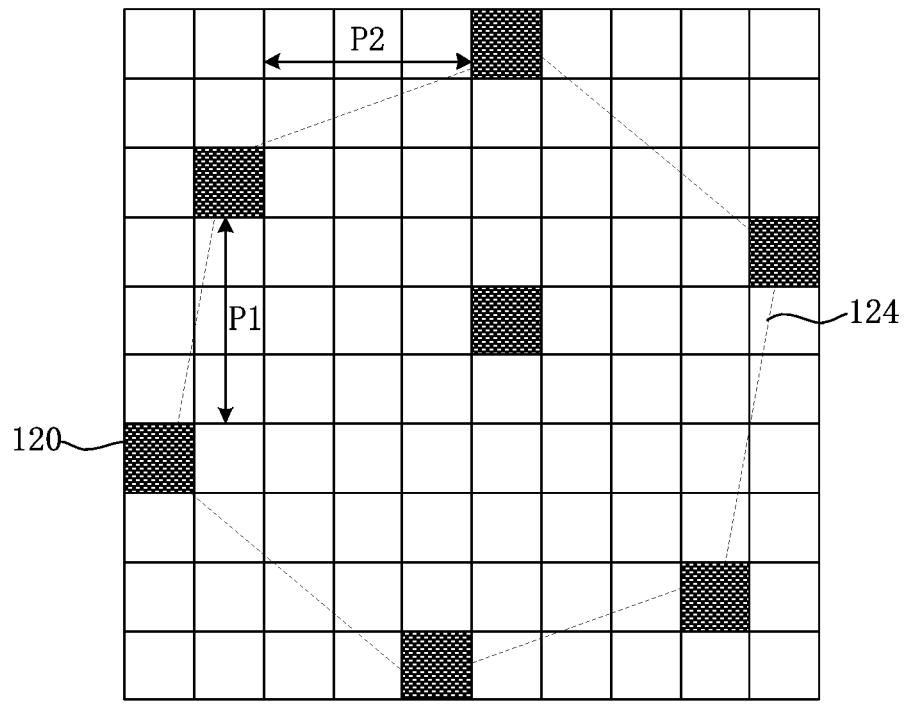
Figure 38C:
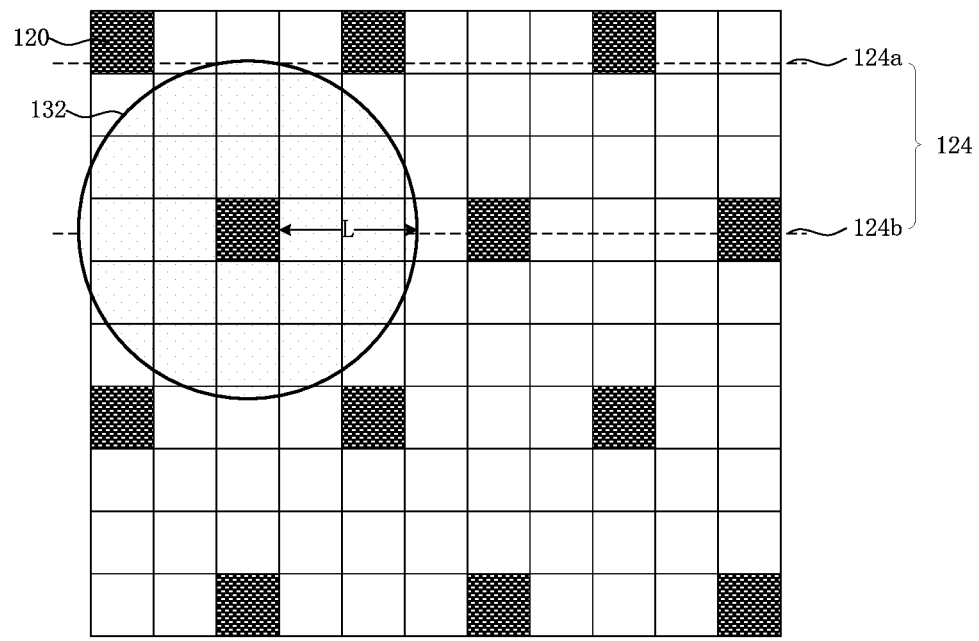

FIGS. 38A-38C illustrate schematic views of three exemplary first light emitting dot arrays according to the present disclosure. For illustrative purposes, the display panel provided by the present disclosure may include a pentagon-shaped light emitting dot array as the first light emitting dot array 124 as shown in FIG. 38A. The pentagon-shaped light emitting dot array may include one center organic light emitting unit 120 and five corner organic light emitting units 120. Multiple organic light emitting units 120 in the first light emitting dot array 124 may form multiple shapes. The shape 125 that has the smallest area in the multiple shapes may have no right angle. The pentagon-shaped light emitting dot array may increase the number of the organic light emitting units 120 that emit light simultaneously while ensuring no signal crosstalk. Thus, the time required for fingerprint information acquisition may be reduced.

For illustrative purposes, the display panel provided by the present disclosure may include a hexagon-shaped light emitting dot array as the first light emitting dot array 124 as shown in FIG. 38B. The hexagon-shaped light emitting dot array may include one center organic light emitting unit 120 and six corner organic light emitting units 120. The hexagon-shaped light emitting dot array may increase the number of the organic light emitting units 120 that emit light simultaneously while ensuring no signal crosstalk. Thus, the time required for fingerprint information acquisition may be reduced.

For illustrative purposes, the display panel provided by the present disclosure may include a first light emitting row 124a and a second light emitting row 124b alternately arranged as the first light emitting dot array 124 as shown in FIG. 38C. Any organic light emitting unit 120 in the first light emitting row 124a may not be in a same column with any organic light emitting unit 120 in the second light emitting row 124b. As compared to the image scanning method as shown in FIG. 37A, the configuration that any organic light emitting unit 120 in the first light emitting row 124a is not in a same column with any organic light emitting unit 120 in the second light emitting row 124b may increase the number of the organic light emitting units 120 that emit light simultaneously while ensuring no signal crosstalk. Specifically, there may be 12 organic light emitting units 120 that emit light simultaneously in one image frame (11*10 organic light emitting units). Scanning at most 10 image frames may complete the fingerprint information acquisition from the fingerprint recognition units 211 for all the organic light emitting units 120. Thus, the time required for fingerprint information acquisition may be substantially reduced.

In any of the first light emitting dot arrays 124 described in the embodiments of the present disclosure, the distance J between any two adjacent organic light emitting units 120 in the first light emitting dot array 124 may be equal to the minimum no-crosstalk-distance L. Obviously, the fingerprint recognition units 211 corresponding to each organic light emitting units 120 in the first light emitting dot array 124 may not receive the crosstalk signals from other organic light emitting units 120 that simultaneously emit light, and may ensure the accuracy of the fingerprint signals. At the same time, when the distance J between any two adjacent organic light emitting units 120 in the first light emitting dot array 124 may be equal to the minimum no-crosstalk-distance L, the number of the organic light emitting units 120 that simultaneously emit light may be increased, the time required for the fingerprint signal acquisition may be reduced, and the efficiency of acquiring fingerprints may be improved.

In any of the first light emitting dot arrays 124 described in the embodiments of the present disclosure, for any two adjacent organic light emitting units 120 located in different rows in the first light emitting dot array 124, a vertical distance P1 (as shown in FIG. 38B) from one organic light emitting unit 120 to a row of the other organic light emitting unit 120 may be smaller than the minimum no-crosstalk-distance L. Further, for any two adjacent organic light emitting units 120 located in different columns in the first light emitting dot array 124, a vertical distance P2 (as shown in FIG. 38B) from one organic light emitting unit 120 to a column of the other organic light emitting unit 120 may be smaller than the minimum no-crosstalk-distance L.

The first light emitting dot array 124 may ensure that the fingerprint recognition units 211 corresponding to each organic light emitting unit 120 in the first light emitting dot array 124 do not receive the crosstalk signals from other organic light emitting units 120 that simultaneously emit light, and may ensure the accuracy of fingerprint recognition. At the same time, the configuration may increase the number of the organic light emitting units that simultaneously emit light, reduce the time required for acquiring fingerprint signals, and improve the efficiency of acquiring fingerprints.

In order to better illustrate the fingerprint acquisition efficiency in the display panel provided by the present disclosure, a square array scanning method and a hexagon array scanning method may be used as the examples to describe the fingerprint acquisition efficiency in the display panel provided by the present disclosure. Assuming adjacent organic light emitting units 120 must be separated by at least a distance of 20 linearly arranged organic light emitting units 120 (distance between the centers of two organic light emitting units) to avoid crosstalk. Specifically, the size of 20 linearly arranged organic light emitting units 120 may be 20P (e.g., 20 pixels).

Figure 39A:
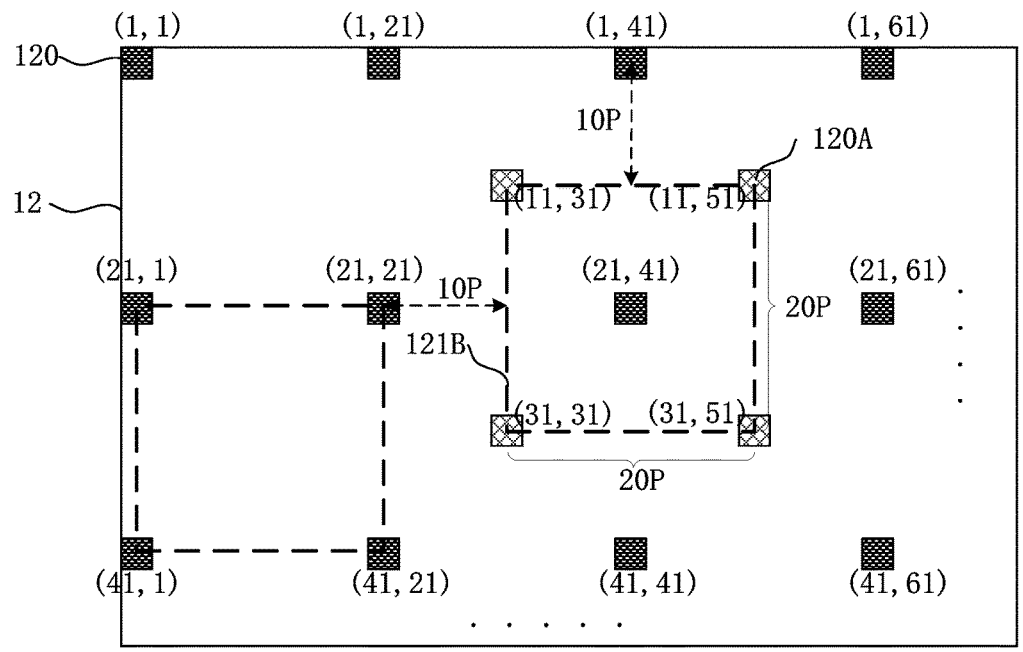
FIG. 39A illustrates a schematic view of an exemplary square array scanning method for an exemplary display panel according to the disclosed embodiments.

FIG. 39A illustrates a schematic view of an exemplary square array scanning method for an exemplary display panel according to the present disclosure. For the square array scanning method as shown in FIG. 39A, each light emitting organic light emitting unit 120 may have a coordinate (row, column), and the coordinate for the first organic light emitting unit 120 in the upper left corner may be (1,1). The first row of the light emitting organic light emitting units 120 may have coordinates (1,1), (1,21), (1,41), . . . , the second row of the light emitting organic light emitting units 120 may have coordinates (21,1), (21,21), (21,41), . . . , the third row of the light emitting organic light emitting units 120 may have coordinates (41,1), (41,21), (41,41), . . . , and so on so forth, i.e., the coordinates for all the organic light emitting units 120 that simultaneously emit light in one image frame.

Each organic light emitting unit 120 that emit light may be used as a center point to divide the organic light emitting layer 12 in the display panel in both horizontal and vertical directions. The organic light emitting units 120 may be divided into a plurality of identical light emitting regions 121B. Each light emitting region 121B may have an identical size. Each light emitting region 121B may include an organic light emitting unit 120 that emits light and a plurality of dark organic light emitting units 120A that surround the organic light emitting unit 120 that emits light and do not emit light. The organic light emitting units 120 that emit light located at the peripheral positions of the organic light emitting layer 12 may have partial light emitting regions 121B.

For illustrative purposes, the light emitting organic light emitting unit 120 (21,41) that emits light may be at the center of a light emitting region 121B, which may also include four dark organic light emitting units 120A. The coordinates for the four dark organic light emitting units 120A may be (11,31), (11,51), (31,31), and (31,51). Obviously, the light emitting region 121B may have a length and a width of 20P, respectively. That is, the light emitting region 121B may have 20*20=400 number of the organic light emitting units. The light emitting region 121B may have only one organic light emitting unit (21,41) that emits light. That is, 1 in 400 organic light emitting units 120 may be an organic light emitting unit 120 that emits light. Thus, the density of the light emitting organic light emitting units 120 in the light emitting region 121B may be about ¹/₄₀₀.

Therefore, 20*20=400 number of image frames may be scanned for all the organic light emitting units 120 in the display panel to emit light once. FIG. 39A may only show some organic light emitting unit 120 that simultaneously emit light and the corresponding coordinates, and the dark organic light emitting units 120A at the four corners of the light emitting region 121B and the corresponding coordinates.

Figure 39B:
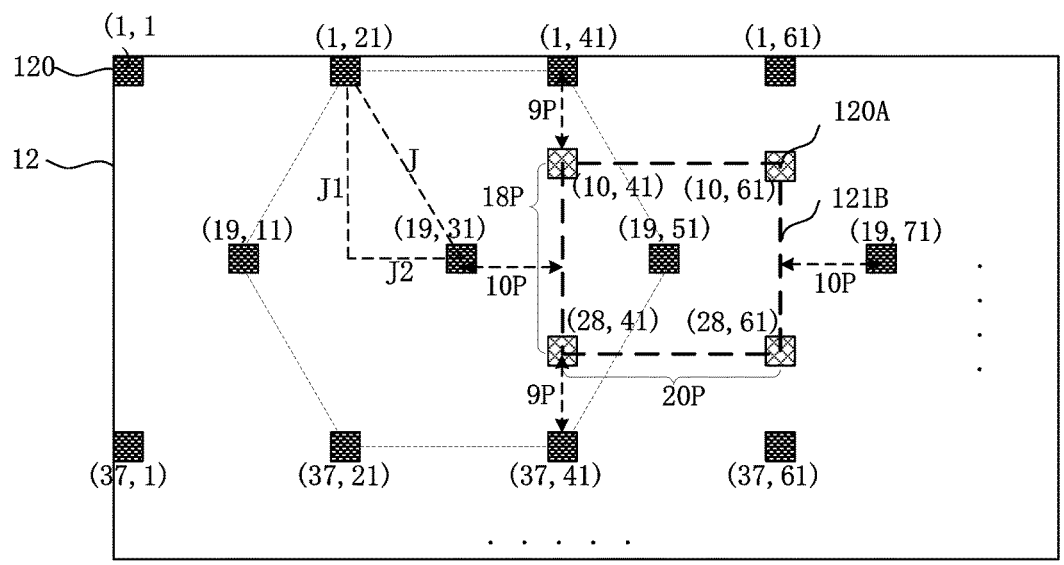
FIG. 39B illustrates a schematic view of an exemplary hexagon array scanning method for an exemplary display panel according to the disclosed embodiments.

FIG. 39B illustrates a schematic view of an exemplary hexagon array scanning method for an exemplary display panel according to the present disclosure. For the hexagon array scanning method as shown in FIG. 39B, each light emitting organic light emitting unit 120 may have a coordinate (row, column), and the coordinate for the first organic light emitting unit 120 in the upper left corner may be (1,1).

In the hexagon array, a distance J between any two adjacent light emitting organic light emitting units 120 may be at least 20 organic light emitting units 120 (20P). A distance J1 from a corner organic light emitting unit 120 that emits light not in the same row as the center light emitting organic light emitting unit 120 to the row where the center light emitting organic light emitting unit 120 is located may be $10P\sqrt{3}\approx 18P$. A distance J2 from a corner organic light emitting unit 120 that emits light not in the same row as the center organic light emitting unit 120 that emits light to the column where the center organic light emitting unit that emits light is located may be 10P. Therefore, the coordinates for the first row of the light emitting organic light emitting units 120 may be (1,1), (1,21), (1,41), . . . , the coordinates for the second row of the light emitting organic light emitting units 120 may be (19,11), (19,31), (19,51), . . . , the coordinates for the third row of the light emitting organic light emitting units 120 may be (37,1), (37,21), (37,41), . . . , and so on so forth, i.e., the coordinates for all the organic light emitting units 120 that simultaneously emit light in one image frame.

Obviously, when the organic light emitting units 120 are emitting light, the distance between adjacent organic light emitting units 120 that emit light in the same row may still be 20P, and the distance between adjacent rows where the organic light emitting units 120 that emit light not in the same row are located may be reduced from 20P to about 18P. In this case, a distance from a corner organic light emitting unit 120 that emits light not in the same row as the center organic light emitting unit 120 that emits light to the center organic light emitting unit 120 that emits light may be $\sqrt{(10P)^2+(18P)^2}\approx 20.59P>20P$, and may effectively avoid crosstalk.

Each light emitting organic light emitting unit 120 may be used as a center point to divide the organic light emitting layer 12 in the display panel in both horizontal and vertical directions. The organic light emitting units 120 may be divided into a plurality of identical light emitting regions 121B. Each light emitting region 121B may have an identical size. Each light emitting region 121B may include an organic light emitting unit 120 that emits light and a plurality of dark organic light emitting units 120A that surround the organic light emitting unit that emits light and do not emit light. The light emitting organic light emitting units 120 located at the peripheral positions of the organic light emitting layer 12 may have partial light emitting regions 121B.

For illustrative purposes, the organic light emitting unit 120 (19,51) that emits light may be at the center of a light emitting region 121B, which may also include four dark organic light emitting units 120A. The coordinates for the four dark organic light emitting units 120A may be (10,41), (10,61), (28,41), and (28,61). Obviously, the light emitting region 121B may have a width of 20P in the row direction and a length of 18P in the column direction. That is, the light emitting region 121B may have 20*18=360 number of the organic light emitting units. The light emitting region 121B may have only one organic light emitting unit 120 (19,51) that emits light. That is, 1 in 360 organic light emitting units 120 may be an organic light emitting unit that emits light. Thus, the density of the light emitting organic light emitting units 120 in the light emitting region 121B may be about 1/360.

The organic light emitting layer 12 may be divided into a plurality of identical light emitting regions 121B. The density of the organic light emitting units 120 that emit light in one image frame may be about 1/360. Therefore, 20*18=360 number of image frames may be scanned for all the organic light emitting units 120 in the display panel to emit light once. FIG. 39B may only show some organic light emitting units that simultaneously emit light and the corresponding coordinates, and the dark organic light emitting units 120A at the four corners of the light emitting region 121B and the corresponding coordinates.

Obviously, the hexagon array scanning method as shown in FIG. 39B may be better than the square array scanning method as shown in FIG. 39A.

In addition, the present disclosure also provides a fingerprint recognition method for the display panel. The display panel may be any of the display panels as shown in FIGS. 35A-35D. The display panel may include a display module 1 and a fingerprint recognition module 2. The display module 1 may include a first substrate 10, an organic light emitting layer 12 disposed on a side of the first substrate 10, and a glass cover 14 disposed on a side of the organic light emitting layer 12 facing away from the first substrate 10. The organic light emitting layer 12 may include a plurality of organic light emitting units 120. The fingerprint recognition module 2 may include a fingerprint recognition layer 21. The cover 14 may have a first surface facing away from the first substrate 10 as the light emitting side of the display panel.

Figure 40:
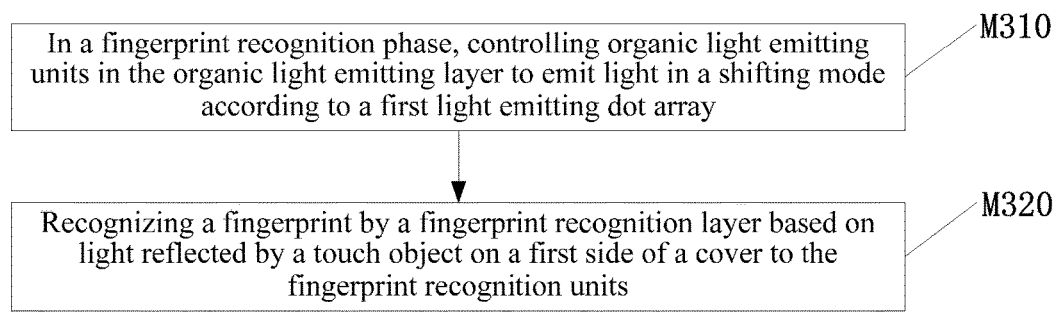
FIG. 40 illustrates a flow chart of an exemplary fingerprint recognition method for an exemplary display panel according to the disclosed embodiments.

FIG. 40 illustrates a flow chart of an exemplary fingerprint recognition method for an exemplary display panel according to the present disclosure. As shown in FIG. 40, the fingerprint recognition method provided by the present disclosure may include the following steps.

Step M310: in a fingerprint recognition phase, controlling organic light emitting units in the organic light emitting layer to emit light in a shifting mode according to a first light emitting dot array where a distance between any two adjacent light emitting organic light emitting units is greater than or equal to a minimum no-crosstalk-distance, and the minimum no-crosstalk-distance is a maximum radius of a cover region that is formed on a fingerprint recognition layer when light emitted from any one of the organic light emitting units that emit light is reflected by a first surface of a cover.

Step M320: recognizing a fingerprint by a fingerprint recognition layer based on light reflected by a touch object on the first surface of the cover to the fingerprint recognition units. In one embodiment, the touch object may be a finger of a user.

The display panel provided by the present disclosure may recognize fingerprints by using the image scanning method. Each organic light emitting unit in an image frame may emit light in a shifting mode according to the first light emitting dot array. Because the distance between any two adjacent light emitting organic light emitting units is greater than or equal to the minimum no-crosstalk-distance, the fingerprint reflected light that is formed when the light emitted from any one of the light emitting organic light emitting units in the first light emitting dot array is reflected by the fingerprint of the finger of the user may not irradiate on any fingerprint recognition unit corresponding to other light emitting organic light emitting units in the first light emitting dot array. Thus, the fingerprint recognition unit corresponding to each organic light emitting unit in the first light emitting dot array may receive only the fingerprint signal light that is originated from the corresponding organic light emitting unit. That is, the fingerprint recognition unit may not receive any crosstalk signals from other light emitting units. Accordingly, the sensed signals generated by the fingerprint recognition units may accurately represent the reflection that is formed when the light emitted from the corresponding organic light emitting unit is reflected by the fingerprint of the finger of the user. Thus, the display panel provided by the present disclosure may increase the precision of fingerprint recognition.

Figure 41:
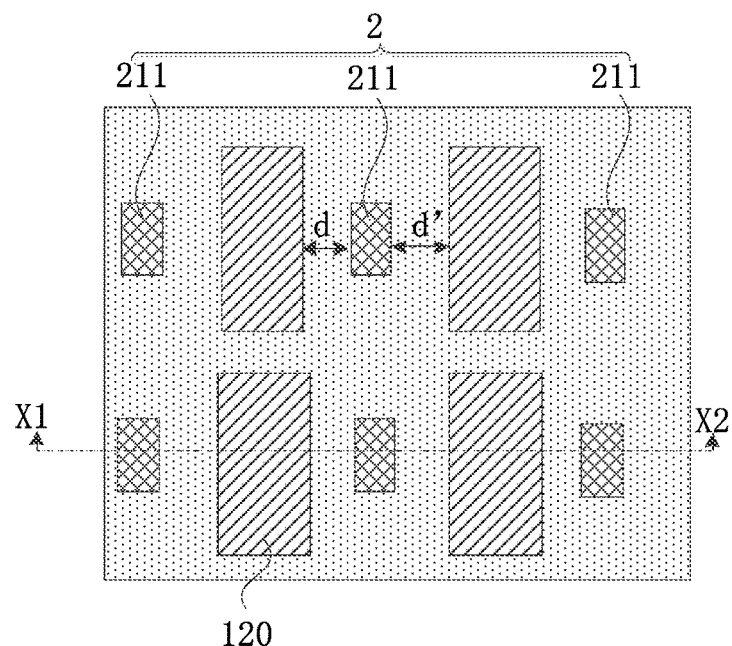
FIG. 41 illustrates a top-down view of another exemplary display panel according to the disclosed embodiments.
Figure 42:
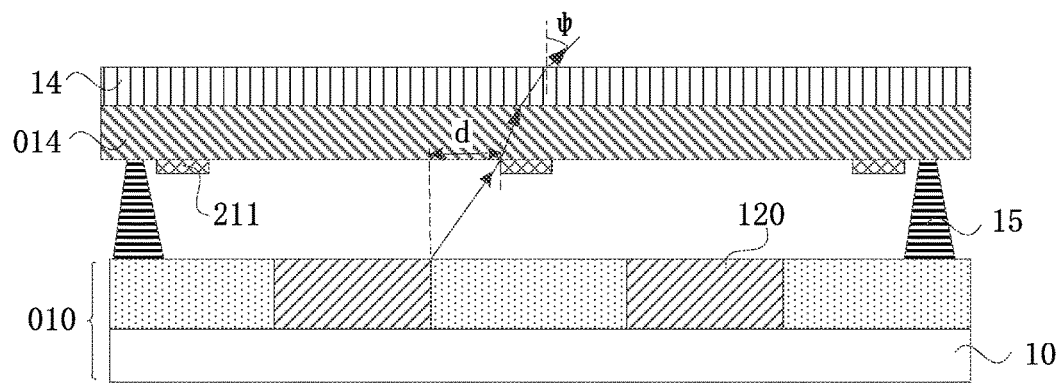
FIG. 42 illustrates a cross-sectional view along the X1-X2 direction in FIG. 41.

FIG. 41 illustrates a top-down view of another exemplary display panel according to the present disclosure. FIG. 42 illustrates a cross-sectional view along the X1-X2 direction in FIG. 41. Referring to FIG. 41 and FIG. 42, the display panel may include an array substrate 010 and an encapsulation layer 014. The array substrate 010 may include a first substrate 10 and a plurality of organic light emitting units 120 disposed on the first substrate 10. The encapsulation layer 014 may be configured on a side of the plurality of the organic light emitting units 120 facing away from the first substrate 10. A fingerprint recognition module 2 may be configured on the encapsulation layer 014. The fingerprint recognition module 2 may include at least one fingerprint recognition unit 211. An orthogonal projection of the fingerprint recognition unit 211 on the array substrate 010 may be located in a non-light emitting region. The non-light emitting region may be located between adjacent organic light emitting units 120.

A horizontal distance d between the boundary of the fingerprint recognition unit 211 and the boundary of a nearest organic light emitting unit 120 may be greater than or equal to a pre-determined distance such that the display panel achieves a maximum light emitting angle $\psi$ where $\psi$ is greater than or equal to about 50 degrees.

Specifically, the maximum light emitting angle $\psi$ may be an angle between a direction of the emitted light and a direction perpendicular to the light emitting side of the display panel. The larger the maximum light emitting angle $\psi$, the larger the viewing angle of the display panel. Referring to FIG. 42, the display panel may also include a cover 14. When a side of the cover 14 facing away from the array substrate 010 is the light emitting side of the display panel, a maximum angle between the direction of the emitted light and a perpendicular line of the cover 14 facing away from the array substrate 010 may be the maximum light emitting angle $\psi$.

Among a plurality of the organic light emitting units 120 near the fingerprint recognition unit 211, the organic light emitting unit 120 with a boundary having a shortest distance to the boundary of the fingerprint recognition unit 211 may be the nearest organic light emitting unit 120 to the fingerprint recognition unit 211.

Figure 43:
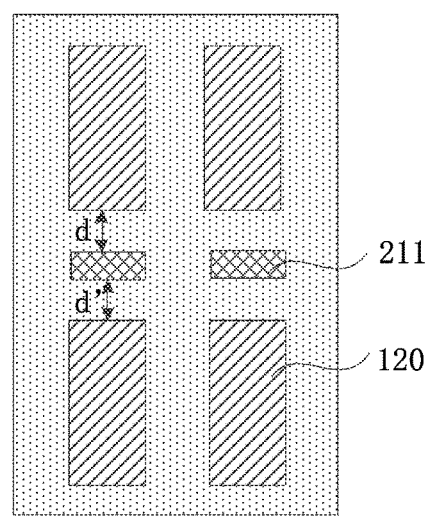
FIG. 43 illustrates a top-down view of another exemplary display panel according to the disclosed embodiments.

FIG. 43 illustrates a top-down view of another exemplary display panel according to the present disclosure. Referring to FIG. 41 and FIG. 43, the non-light emitting region may be a region between two adjacent columns of organic light emitting units 120, or a region between two adjacent tows of organic light emitting units 120, which may be determined based on the arrangement of the organic light emitting units 120 in the display panel. No limitation is imposed by the present disclosure. Referring to FIG. 41 and FIG. 43, the nearest organic light emitting unit 120 to the fingerprint recognition unit 211 may be determined by a distance d and a distance d' between two adjacent columns (or two adjacent rows) of the organic light emitting units 120 of the fingerprint recognition unit 211 and the boundary of the fingerprint recognition unit 211, respectively. The one with a shorter distance may be the nearest organic light emitting unit 120 to the fingerprint recognition unit 211.

In addition, in the embodiments of the present disclosure, ψ may be configured to be greater than or equal to about 50 degrees in order to satisfy user's basic viewing angle requirement of the display panel. As such, the user may see clear display image when viewing the display image from a side of the display panel. Based on the user's viewing angle requirement of the display panel, ψ may be configured to be greater than or equal to about 60 degrees, 70 degrees, etc. No limitation is imposed by the present disclosure.

In one embodiment, the fingerprint recognition module 2 may be configured on the encapsulation layer 14 of the display panel. An orthogonal projection of the fingerprint recognition unit 211 on the array substrate 010 may be located in the non-light emitting region on the array substrate 010 such that the fingerprint recognition module 2 may be configured in the display region of the display panel. Thus, the screen ratio may be increased in line with the trend for narrow bezel display panel.

In addition, because the bottom surface of the fingerprint recognition unit 211 is opaque, when the light emitted from the organic light emitting unit 120 irradiates on the edge of the fingerprint recognition unit 211, the light may be blacked by the bottom surface of the fingerprint recognition unit 211, and the light emitting angle of the display panel may be affected. In one embodiment, a horizontal distance d between the edge of the fingerprint recognition unit 211 and the edge of the light emitting region of the nearest organic light emitting unit 120 may be configured to be greater than or equal to a predetermined distance such that the fingerprint recognition unit 211 disposed in the display region of the display panel does not affect the light emitting angle of the display panel. Thus, a desired viewing angle of the display panel may be assured.

Figure 44:
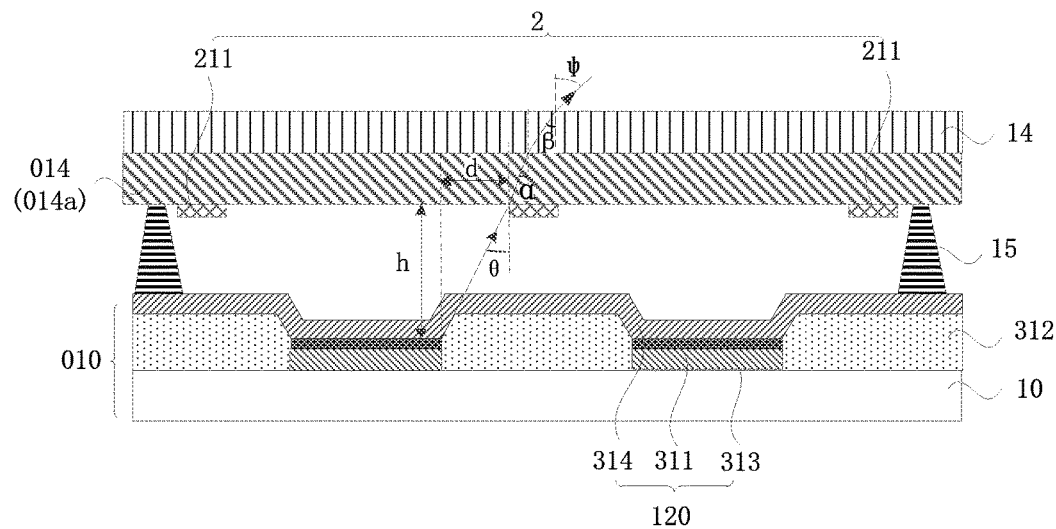
FIG. 44 illustrates a cross-sectional view of another exemplary display panel according to the disclosed embodiments.

FIG. 44 illustrates a cross-sectional view of another exemplary display panel according to the present disclosure. In one embodiment, referring to FIG. 44, the organic light emitting unit 120 may include a first electrode 314, a light emitting function layer 311, and a second electrode 313. The light emitting function layer 311 may be configured between the first electrode 314 and the second electrode 313. The array substrate 010 may also include a pixel defining layer 312. The pixel defining layer 312 may include a plurality of opening regions. The light emitting function layer 311 of the organic light emitting unit 120 may be disposed in the opening region. The first electrode 314 may cover the light emitting function layer 311 and the non-opening region of the pixel defining layer 312. An orthogonal projection of the fingerprint recognition unit 211 on the array substrate 010 may fall within the non-opening region of the pixel defining layer 312.

Specifically, the first electrode 314 may be a cathode, and the second electrode 313 may be an anode. The light emitting function layer 311 may be a red light emitting layer, a green light emitting layer, or a blue light emitting layer. Because other structures such as a driver circuit (not shown in FIG. 44) for driving the organic light emitting units 120 may be formed on the first substrate 10, on one hand, the pixel defining layer 312 may cover the structures such as the driver circuit to planarize the first substrate 10. On the other hand, the pixel defining layer 312 may define the light emitting regions and the non-light emitting regions of the array substrate 010. That is, the pixel defining layer 312 may also define the positions of the organic light emitting units 120. The opening regions of the pixel defining layer 312 may be the light emitting regions of the array substrate 010, and the non-opening region may be the non-light emitting region of the array substrate 010.

In one embodiment, referring to FIG. 44, the encapsulation layer 014 may be a transparent rigid cover 014a. the fingerprint recognition module 2 may be configured on a side of the transparent rigid cover 014a adjacent to the array substrate 010. Thus, d≥h*tan ψ, where h is a vertical distance from the fingerprint recognition unit 211 to the light emitting side of the light emitting function layer 311 in the organic light emitting unit 120.

Specifically, referring to FIG. 44, spacers 15 may be configured between the transparent rigid cover 014a and the array substrate 010 to support the transparent rigid cover 014a. Air or nitrogen may fill the gap between the transparent rigid cover 014a and the array substrate 010. The light emitted from the light emitting function layer 311 of the organic light emitting unit 120 may pass through the first electrode 314, the gap between the transparent rigid cover 014a and the array substrate 010, the transparent rigid cover 014a, and the cover 14 to emit into air. Because the first electrode 314 is thin, the first electrode 314 may have little impact on the light transmission. In the light transmission path, the refraction effect of the first electrode 314 may be ignored. According to the law of refraction:

$$n_1 \sin\theta = n_2 \sin\alpha = n_3 \sin\beta = n_1 \sin\psi,$$

$$\text{thus, } \theta = \psi, \tan\psi = \tan\theta = \frac{d}{h}.$$

Thus, when the display panel reaches the maximum light emitting angle ψ, d=h*tan ψ. Therefore, the predetermined distance may be h*tan ψ. When d is greater than or equal to h*tan ψ, the display panel may reach the maximum light emitting angle ψ.

In this case, $n_1$ is the index of refraction of air, $n_2$ is the index of refraction of the transparent rigid cover 014a, and $n_3$ is the index of refraction of the cover 14. θ is the propagation angle of the light in the gap between the transparent rigid cover 014a and the array substrate 010, α is the propagation angle of the light in the transparent rigid cover 014a, and β is the propagation angle of the light in the cover 14. The propagation angle may be an angle between the direction of the light and the direction perpendicular to various layers of the display panel.

In one embodiment, when h=4 μm, and ψ≥50°, d≥4.8 μm. h may be calculated based on the thickness of the first electrode 314, the thickness of the pixel defining layer 312, and the thickness of the spacers 15. h=4 µm may be obtained based on the typical thicknesses of various layers of the display panel. When the layers of the display panel have different thicknesses, h may be a different value. No limitation is imposed by the present disclosure.

In one embodiment, the fingerprint recognition module 2 may be configured on a side of the transparent rigid cover 014a adjacent to the array substrate 010. The horizontal distance d between the boundary of the fingerprint recognition unit 211 and the boundary of the light emitting region of the nearest organic light emitting unit 120 may be greater than or equal to h*tan ψ such that the fingerprint recognition module 2 may be configured in the display region of the display panel, the screen ratio of the display panel may be increased, the display panel may reach the maximum light emitting angle ψ, the desired viewing angle of the display panel may be assured, and the user experience may be improved.

In addition, in the fabrication process of the display panel, the fingerprint recognition module 2 may be formed on a side of the transparent rigid cover 014a. Then, the transparent rigid cover 014a may be bonded to the array substrate 010 such that the high temperature process in the fabrication process of the fingerprint recognition module 2 may not affect the organic light emitting units 120 on the array substrate 010.

Figure 45:
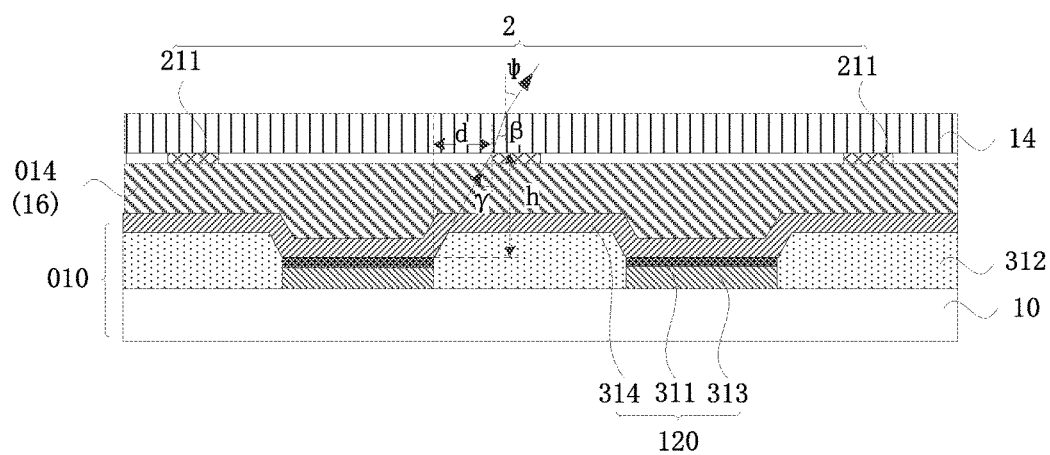
FIG. 45 illustrates a cross-sectional view of another exemplary display panel according to the disclosed embodiments.

FIG. 45 illustrates a cross-sectional view of another exemplary display panel according to the present disclosure. In one embodiment, referring to FIG. 45, the encapsulation layer 014 may be a thin film encapsulation layer 16. The fingerprint recognition module 2 may be configured on a side of the thin film encapsulation layer 16 facing away from the array substrate 010. Specifically, the thin film encapsulation layer 16 may include a plurality of alternately arranged organic layer and inorganic layer. Both the side of the thin film encapsulation layer 16 adjacent to the array substrate 010 and the side of the thin film encapsulation layer 16 facing away from the array substrate 010 may be inorganic layer to achieve the desired water blocking and oxygen blocking effects.

Specifically, when the temperature in the fabrication process for the fingerprint recognition unit 211 is low, the fabrication process may not affect other layers in the display panel. The fingerprint recognition unit 211 may be directly formed on a side of the thin film encapsulation layer 16. When the temperature in the fabrication process for the fingerprint recognition unit 211 is high, the fabrication process may affect the organic light emitting units 120. The fingerprint recognition unit 211 may be formed on a substrate, and may be bonded to the thin film encapsulation layer 16.

In one embodiment, referring to FIG. 45, the fingerprint recognition module 2 may be formed on a side of the thin film encapsulation layer 16 facing away from the array substrate 010. Then, $$\frac{n_{TFE} * d}{\sqrt{d^2 + h^2}} \geq \sin\psi,$$

where h is a vertical distance from the fingerprint recognition unit 211 to the light emitting side of the light emitting function layer 311 in the organic light emitting unit 120, and $n_{TFE}$ is the index of refraction of the thin film encapsulation layer 16.

Specifically, referring to FIG. 45, the light emitted from the light emitting function layer 311 of the organic light emitting unit 120 may pass through the first electrode 314, the gap between the transparent rigid cover 014a and the array substrate 010, the transparent rigid cover 014a, and the cover 14 to emit into air. Because the first electrode 314 is thin, the first electrode 314 may have little impact on the light transmission. In the light transmission path, the refraction effect of the first electrode 314 may be ignored. According to the law of refraction:

$$n_{TFE}\sin\gamma = n_3\sin\beta = n_1\sin\psi, \sin\gamma = \frac{d}{\sqrt{d^2 + h^2}},$$

$$\text{thus, } \frac{n_{TFE} * d}{\sqrt{d^2 + h^2}} = \sin\psi.$$

Thus, when the display panel reaches the maximum light emitting angle ψ, $$\frac{n_{TFE} * d}{\sqrt{d^2 + h^2}} = \sin\psi.$$

Therefore, when $$\frac{n_{TFE} * d}{\sqrt{d^2 + h^2}} = \sin\psi,$$

the display panel may reach the maximum light emitting angle ψ.

In this case, $n_1$=1, and $n_3$ is the index of refraction of the cover 14. γ is the propagation angle of the light in the thin film encapsulation layer 16, and β is the propagation angle of the light in the cover 14.

In one embodiment, when h=8 µm, $n_{TFE}$=1.5, and ψ≥50°, d≥4.7 µm. h may be calculated based on the thickness of the thin film encapsulation layer 16, and the thickness of the first electrode 314. In addition, because the thick material in the thin film encapsulation layer 16 is often an organic material, and the inorganic material is often thin, the index of refraction of the thin film encapsulation layer 16 is approximately the index of refraction of the organic material, i.e., 1.5. h may be obtained based on the typical thicknesses of various layers of the display panel. When the layers of the display panel have different thicknesses, h may be a different value. No limitation is imposed by the present disclosure.

Figure 46:
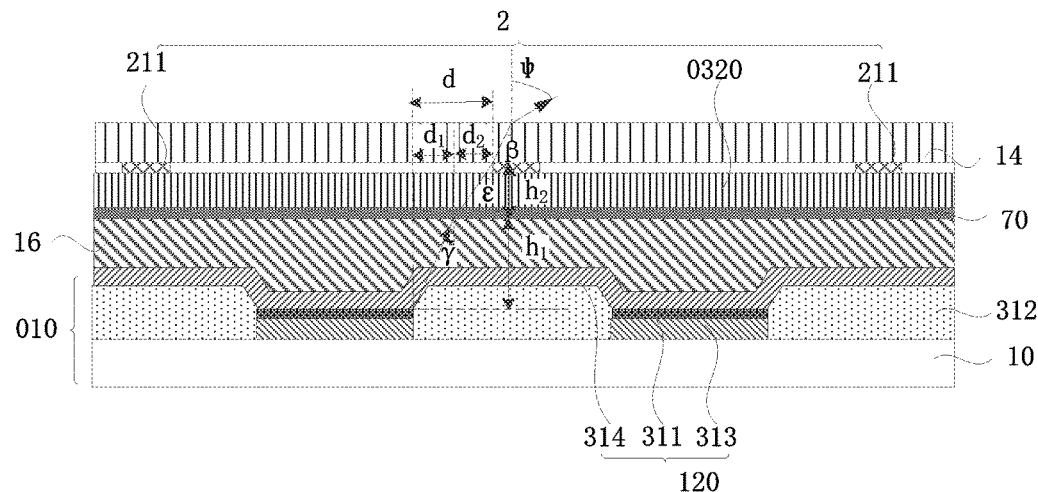
FIG. 46 illustrates a cross-sectional view of another exemplary display panel according to the disclosed embodiments.

FIG. 46 illustrates a cross-sectional view of another exemplary display panel according to the present disclosure. Referring to FIG. 46, the fingerprint recognition module 2 may also include a third substrate 0320. The fingerprint recognition unit 211 may be formed on the third substrate 0320. The side of the third substrate 0320 facing away from the fingerprint recognition unit 211 may be bonded to the side of the thin film encapsulation layer 16 facing away from the array substrate 010 by an adhesive layer 70. Then, $$d = d_1 + d_2, \text{ where } \frac{n_{TFE} * d_1}{\sqrt{d_1^2 + h_1^2}} \geq \sin\psi, \frac{n_{PI} * d_2}{\sqrt{d_2^2 + h_2^2}} \geq \sin\psi,$$

$n_{TFE}$ is the index of refraction of the thin film encapsulation layer 16, $h_1$ is a vertical distance from the interface between the thin film encapsulation layer 16 and the adhesive layer 70 to the light emitting side of the light emitting function layer 311 in the organic light emitting unit 120, $d_1$ is a horizontal distance from the exit point at the interface between the thin film encapsulation layer 16 and the adhesive layer 70 where the light emitted from the edge of the organic light emitting unit 120 exits the interface to the edge of the organic light emitting unit 120, $n_{PI}$ is the index of refraction of the third substrate 0320, $h_2$ is a sum of the thickness of the adhesive layer 70 and the thickness of the third substrate 0320, $d_2$ is a horizontal distance from the exit point at the interface between the thin film encapsulation layer 16 and the adhesive layer 70 where the light emitted from the edge of the organic light emitting unit 120 exits the interface to the edge of the fingerprint recognition unit 211.

Specifically, referring to FIG. 46, the light emitted from the light emitting function layer 311 in the organic light emitting unit 120 may pass through the first electrode 314, the thin film encapsulation layer 16, the adhesive layer 70, the third substrate 0320, and the cover 14 to emit into air. Because the first electrode 314 and the adhesive layer 70 are thin, the first electrode 314 and the adhesive layer 70 may have little impact on the light transmission. In the light transmission path, the refraction effect of the first electrode 314 and the adhesive layer 70 may be ignored. The fingerprint recognition unit 211 is thin and the thickness may be ignored. According to the law of refraction:

$$n_{TFE}\sin\gamma = n_{PI}\sin\varepsilon = n_3\sin\beta = n_1\sin\psi,$$

$$\sin\gamma = \frac{d_1}{\sqrt{d_1^2 + h_1^2}}, \sin\varepsilon = \frac{d_2}{\sqrt{d_2^2 + h_2^2}},$$

thus, $\frac{n_{TFE}*d_1}{\sqrt{d_1^2 + h_1^2}} = \sin\psi, \frac{n_{PI}*d_2}{\sqrt{d_2^2 + h_2^2}} = \sin\psi.$ Thus, when the display panel reaches the maximum light emitting angle $\psi$, $$\frac{n_{TFE}*d_1}{\sqrt{d_1^2 + h_1^2}} = \sin\psi, \frac{n_{PI}*d_2}{\sqrt{d_2^2 + h_2^2}} = \sin\psi.$$

Therefore, when $$\frac{n_{TFE}*d_1}{\sqrt{d_1^2 + h_1^2}} \geq \sin\psi, \text{ and } \frac{n_{PI}*d_2}{\sqrt{d_2^2 + h_2^2}} \geq \sin\psi,$$

the display panel may reach the maximum light emitting angle $\psi$.

In this case, $n_1=1$, and $n_3$ is the index of refraction of the cover 14. $\gamma$ is the propagation angle of the light in the thin film encapsulation layer 16, $\varepsilon$ is the propagation angle of the light in the third substrate 0320, and $\beta$ is the propagation angle of the light in the cover 14.

In one embodiment, when $h_1=8$ μm, $n_{TFE}=1.5$, $h_2=10$ μm, $n_{PI}=1.6$, and $\psi \geq 50°$, then $d_1 \geq 4.7$ μm, $d_2 \geq 5.4$ μm, thus $d \geq 10.1$ μm.

In one embodiment, the fingerprint recognition module 2 may be configured on a side of the thin film encapsulation layer 16 facing away from the array substrate 010. A horizontal distance d between the edge of the fingerprint recognition unit 211 and the edge of the light emitting region of the nearest organic light emitting unit 120 may be configured to be greater than or equal to a predetermined distance such that the fingerprint recognition module 2 may be configured in the display region of the display panel, the screen ration of the display panel may be increased, the display panel may reach the maximum light emitting angle $\psi$, a desired viewing angle of the display panel may be assured, and the user experience may be improved. Because the fingerprint recognition module 2 is formed after the thin film encapsulation layer is formed, the thin film encapsulation layer 16 may be ensured to provide the desired water blocking and oxygen blocking function, and the corrosion probability of the display panel may be reduced.

Figure 47:
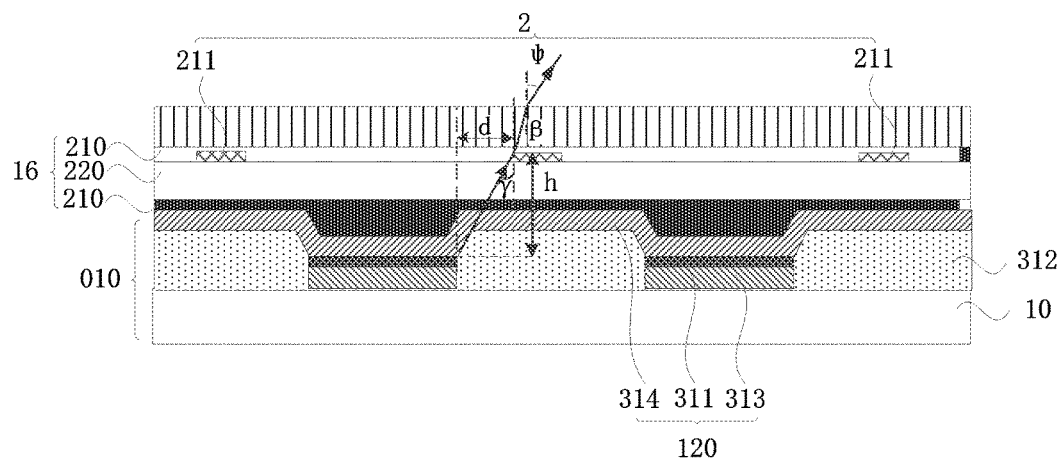
FIG. 47 illustrates a cross-sectional view of another exemplary display panel according to the disclosed embodiments.

FIG. 47 illustrates a cross-sectional view of another exemplary display panel according to the present disclosure. In one embodiment, referring to FIG. 47, the fingerprint recognition unit 211 may be located inside the thin film encapsulation layer 16. The thin film encapsulation layer 16 may include a plurality of alternately arranged inorganic layer 210 and organic layer 220. The fingerprint recognition unit 211 may be configured on a side of the organic layer 210 or inorganic layer 220 facing away from the array substrate 010.

Referring to FIG. 47, the thin film encapsulation layer 16 may include two inorganic layers 210 and one organic layer 220. The fingerprint recognition unit 211 may be directly formed on the organic layer 220 of the thin film encapsulation layer 16 facing away from the array substrate 010.

Because the inorganic layer 210 is thin, the refraction effect on the light may be ignored. According to the law of refraction, when the display panel reaches the maximum light emitting angle $\psi$, $$\frac{n_{TFE}*d}{\sqrt{d^2 + h^2}} = \sin\psi.$$

Therefore, when $$\frac{n_{TFE}*d}{\sqrt{d^2 + h^2}} \geq \sin\psi,$$

the display panel may reach the maximum light emitting angle $\psi$.

Specifically, the fingerprint recognition module 2 may be configured inside the thin film encapsulation layer 16. A vertical distance h from the fingerprint recognition unit 211 to the light emitting side of the light emitting function layer 311 in the organic light emitting unit 120 may be reduced. Thus, the range of the horizontal distance d may be increased. That is, it is more flexible to configure the position of the fingerprint recognition unit 211.

In addition, the fingerprint recognition unit 211 may be configured on a side of the encapsulation layer 16 adjacent to the array substrate 010 as long as the fingerprint recognition unit 211 is insulated from the first electrode 314. When the fingerprint recognition unit 211 is configured on the side of the thin film encapsulation layer 16 adjacent to the array substrate 010, because the vertical distance from the fingerprint recognition unit 211 to the light emitting side of the light emitting function layer 311 is short, the light emitting angle of the light emitted from the light emitting function layer 311 is less affected. Thus, the predetermined distance may be configured to be any value greater than or equal to 0.

In the embodiments of the present disclosure, only the case that the cover 14 is configured on a side of the encapsulation layer 014 (transparent rigid cover 014a or thin film encapsulation layer 16) is shown, which is not limited by the present disclosure. Other layers such as a polarizer layer may be configured between the encapsulation layer 014 and the cover 14. When other layers are configured between the encapsulation layer 014 and the cover 14, the similar derivation process may be used to obtain the predetermined distance.

Figure 48:
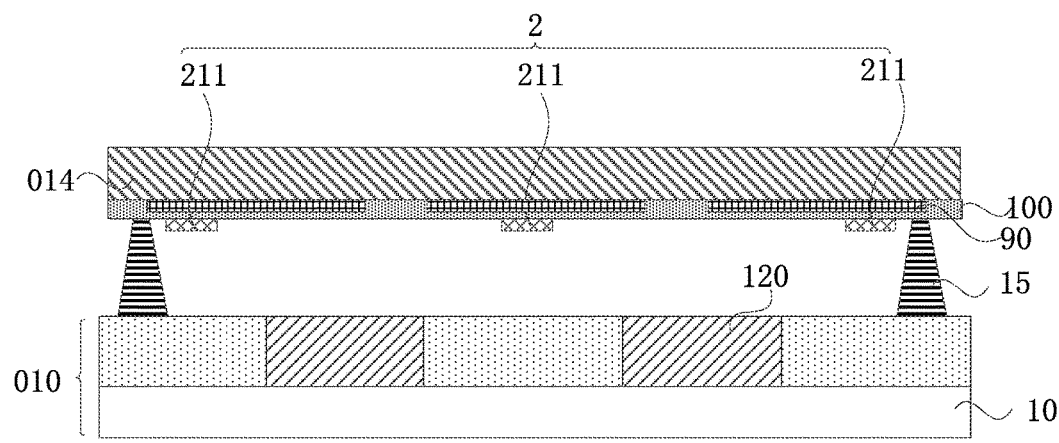
FIG. 48 illustrates a cross-sectional view of another exemplary display panel according to the disclosed embodiments.

FIG. 48 illustrates a cross-sectional view of another exemplary display panel according to the present disclosure. In one embodiment, referring to FIG. 48, the display panel may also include a plurality of touch-control electrodes 90. The fingerprint recognition module 2 and the touch-control electrodes 90 may be configured on a same side of the encapsulation layer 014. Specifically, when the fingerprint recognition module 2 and the touch-control electrodes 90 are configured on the same side of the encapsulation layer 014, in order to avoid crosstalk, an insulation layer 100 may be configured between the touch-control electrodes 90 and the fingerprint recognition module 2. The touch-control electrodes 90 may be mutual capacitive touch-control electrodes or self capacitive touch-control electrodes, which are not limited by the present disclosure.

Figure 49:
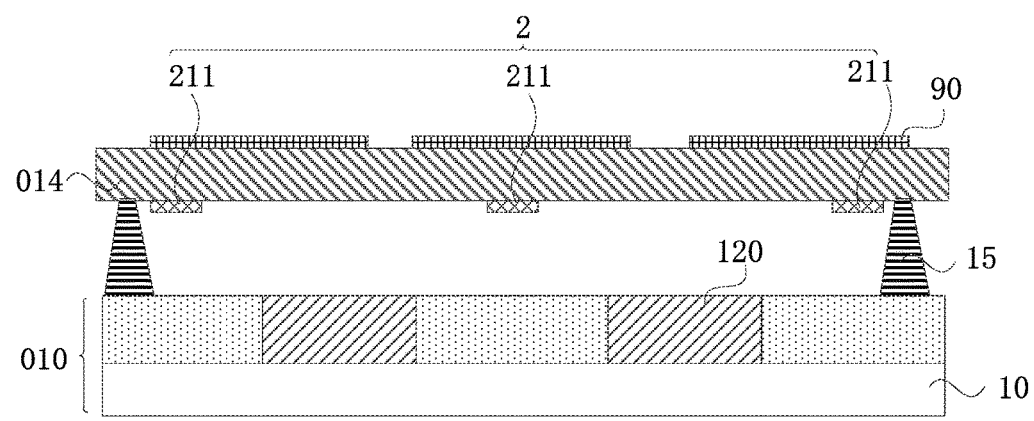
FIG. 49 illustrates a cross-sectional view of another exemplary display panel according to the disclosed embodiments.

FIG. 49 illustrates a cross-sectional view of another exemplary display panel according to the present disclosure. In one embodiment, referring to FIG. 49, the fingerprint recognition module 2 and the touch-control electrodes 90 may be configured on different sides of the encapsulation layer 014. The configuration may not need the insulation layer to avoid crosstalk between the touch-control electrodes 90 and the fingerprint recognition module 2. Thus, the thickness of the display panel may be reduced, and the fabrication process may be simplified.

Figure 50:
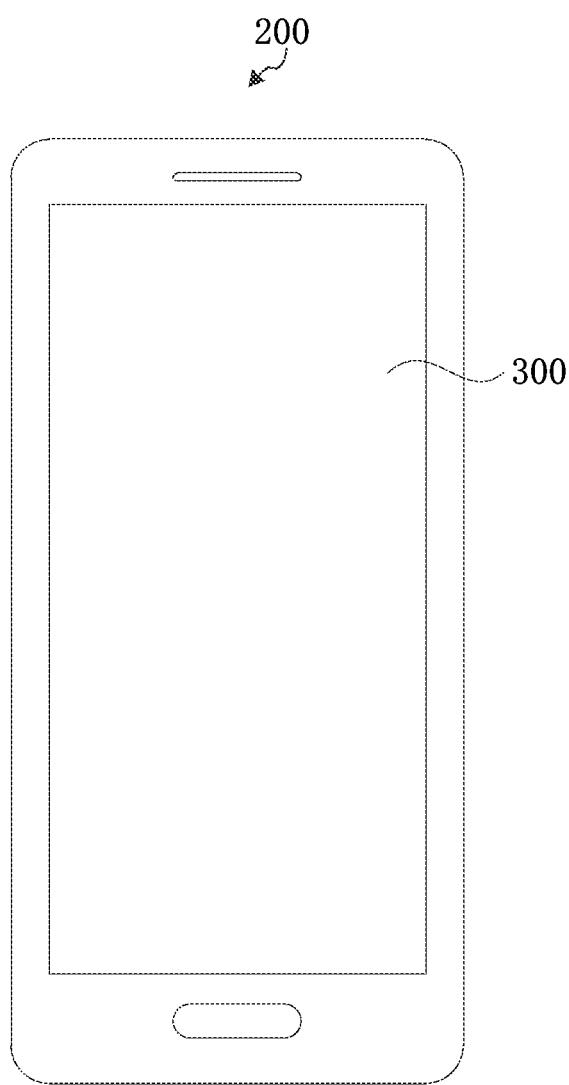
FIG. 50 illustrates a schematic view of an exemplary display apparatus according to the disclosed embodiments.

The present disclosure also provides a display apparatus. FIG. 50 illustrates a schematic view of an exemplary display apparatus according to the present disclosure. Referring to FIG. 50, the display apparatus 200 may include any one of the display panels 300 provided by the embodiments of the present disclosure. The display apparatus 200 may be a smart phone, a tablet computer, or a smart wearable device, etc.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
an array substrate including a substrate and a plurality of pixel units disposed on the substrate, wherein each pixel unit includes a light emitting structure and a pixel driver circuit, the light emitting structure includes a reflective electrode, the pixel driver circuit is disposed on a side of the light emitting structure adjacent to the substrate, the pixel driver circuit includes at least two thin-film-transistors and at least one capacitor, and orthogonal projections of the at least two thin-film-transistors and the at least one capacitor on a plane where the reflective electrode is located are within the reflective electrode;
a fingerprint recognition module including at least one fingerprint recognition unit, wherein an orthogonal projection of the at least one fingerprint recognition unit on the array substrate overlaps with a transparent region on the array substrate, and the transparent region is a gap region between adjacent reflective electrodes of the light emitting structure; and
a fingerprint recognition light source, wherein light emitted from the fingerprint recognition light source is reflected by a touch object to the at least one fingerprint recognition unit for fingerprint recognition,
wherein at least one of the fingerprint recognition module and the fingerprint recognition light source is located on a side of the substrate facing away from the plurality of pixel units.

2. The display panel according to claim 1, wherein:
the light emitting structure further includes a first electrode and a light emitting function layer;
the light emitting function layer is disposed between the first electrode and the reflective electrode; and
the reflective electrode is located on a side of the light emitting function layer adjacent to the substrate.

3. The display panel according to claim 1, further including an encapsulation layer, wherein:
the encapsulation layer is located on a side of the plurality of the pixel units facing away from the substrate;
the fingerprint recognition module is configured on the encapsulation layer;
an orthogonal projection of the at least one fingerprint recognition unit on the array substrate is located in a non-light emitting region; and
the non-light emitting region is a region between adjacent light emitting function layers in the light emitting structure.

4. The display panel according to claim 3, wherein:
the encapsulation layer is a transparent rigid cover; and
the fingerprint recognition module is configured on a side of the transparent rigid cover adjacent to the array substrate.

5. The display panel according to claim 3, wherein:
the encapsulation layer is a thin film encapsulation layer; and
the fingerprint recognition module is configured on a side of the thin film encapsulation layer facing away from the array substrate.

6. The display panel according to claim 3, wherein:
the fingerprint recognition light source is located on a side of the substrate facing away from the plurality of pixel units.

7. The display panel according to claim 1, wherein:
the fingerprint recognition module is configured on a side of the substrate facing away from the plurality of pixel units.

8. The display panel according to claim 7, wherein:
the fingerprint recognition light source is configured on a side of the fingerprint recognition module facing away from the plurality of pixel units.

9. The display panel according to claim 6, wherein:
the fingerprint recognition light source is a collimated light source.

10. The display panel according to claim 7, wherein:
the light emitting structure is multiplexed as the fingerprint recognition light source.

11. The display panel according to claim 1, wherein:
the fingerprint recognition unit include a photo diode, a storage capacitor, and a thin-film-transistor;
a positive electrode of the photo diode is electrically connected to a first electrode of the storage capacitor;
a negative electrode of the photo diode is electrically connected to a second electrode of the storage capacitor and a source electrode of the thin-film-transistor;
a gate electrode of the thin-film-transistor is electrically connected to a switching control line; and
a drain electrode of the thin-film-transistor is electrically connected to a signal detection line.

12. The display panel according to claim 11, wherein:
the photo diode includes a PIN junction disposed between the positive electrode and the negative electrode; and
an orthogonal projection of the PIN junction on the array substrate is located in the transparent region on the array substrate.

13. The display panel according to claim 1, wherein:
the pixel driver circuit also includes connection lines between the at least two thin-film-transistors and the at least one capacitor; and
orthogonal projections of the connection lines on the plane where the reflective electrode is located are within the reflective electrode.

14. The display panel according to claim 1, wherein:
the pixel driver circuit also includes power supply lines, data lines, and scanning lines; and
the power supply lines, the data lines, and the scanning lines have a line width narrower than or equal to about 2.5 μm.

15. The display panel according to claim 14, wherein:
an orthogonal projection of the data lines on the plane where the reflective electrode is located partially overlaps with the reflective electrode.

16. A display apparatus, comprising a display panel, wherein the display panel includes:
an array substrate including a substrate and a plurality of pixel units disposed on the substrate, wherein each pixel unit includes a light emitting structure and a pixel driver circuit, the light emitting structure includes a reflective electrode, the pixel driver circuit is disposed on a side of the light emitting structure adjacent to the substrate, the pixel driver circuit includes at least two thin-film-transistors and at least one capacitor, and orthogonal projections of the at least two thin-film-transistors and the at least one capacitor on a plane where the reflective electrode is located are within the reflective electrode;
a fingerprint recognition module including at least one fingerprint recognition unit, wherein an orthogonal projection of the at least one fingerprint recognition unit on the array substrate overlaps with a transparent region on the array substrate, and the transparent region is a gap region between adjacent reflective electrodes of the light emitting structure; and
a fingerprint recognition light source, wherein light emitted from the fingerprint recognition light source is reflected by a touch object to the at least one fingerprint recognition unit for fingerprint recognition,
wherein at least one of the fingerprint recognition module and the fingerprint recognition light source is located on a side of the substrate facing away from the plurality of pixel units.

17. The display apparatus according to claim 16, wherein:
the light emitting structure further includes a first electrode and a light emitting function layer;
the light emitting function layer is disposed between the first electrode and the reflective electrode; and
the reflective electrode is located on a side of the light emitting function layer adjacent to the substrate.

18. The display apparatus according to claim 16, further including an encapsulation layer, wherein:
the encapsulation layer is located on a side of the plurality of the pixel units facing away from the substrate;
the fingerprint recognition module is configured on the encapsulation layer;
an orthogonal projection of the at least one fingerprint recognition unit on the array substrate is located in a non-light emitting region; and
the non-light emitting region is a region between adjacent light emitting function layers in the light emitting structure.

19. A fingerprint recognition method for a display panel having an array substrate including a substrate and a plurality of pixel units disposed on the substrate, wherein each pixel unit includes a light emitting structure and a pixel driver circuit, the light emitting structure includes a reflective electrode, the pixel driver circuit is disposed on a side of the light emitting structure adjacent to the substrate, the pixel driver circuit includes at least two thin-film-transistors and at least one capacitor, and orthogonal projections of the at least two thin-film-transistors and the at least one capacitor on a plane where the reflective electrode is located are within the reflective electrode; a fingerprint recognition module including at least one fingerprint recognition unit, wherein an orthogonal projection of the at least one fingerprint recognition unit on the array substrate overlaps with a transparent region on the array substrate, and the transparent region is a gap region between adjacent reflective electrodes of the light emitting structure; and a fingerprint recognition light source, wherein light emitted from the fingerprint recognition light source is reflected by a touch object to the at least one fingerprint recognition unit for fingerprint recognition, wherein at least one of the fingerprint recognition module and the fingerprint recognition light source is located on a side of the substrate facing away from the plurality of pixel units, the method comprising:
in a fingerprint recognition phase, controlling organic light emitting units in the light emitting structure to emit light in a shifting mode according to a first light emitting dot array; and
recognizing a fingerprint by a fingerprint recognition layer based on light reflected by a touch object on a first side of a cover to the at least one fingerprint recognition unit.

20. The fingerprint recognition method according to claim 19, wherein the display panel further includes an encapsulation layer, wherein:
the encapsulation layer is located on a side of the plurality of the pixel units facing away from the substrate;
the fingerprint recognition module is configured on the encapsulation layer;
an orthogonal projection of the at least one fingerprint recognition unit on the array substrate is located in a non-light emitting region; and
the non-light emitting region is a region between adjacent light emitting function layers in the light emitting structure.

* * * * *